United States Patent
Saito et al.

(10) Patent No.: US 6,639,762 B2
(45) Date of Patent: Oct. 28, 2003

(54) SPIN VALVE THIN-FILM MAGNETIC DEVICE HAVING FREE MAGNETIC LAYER IN FERRIMAGNETIC STATE AND MANUFACTURING METHOD THEREFOR

(75) Inventors: Masamichi Saito, Niigata-ken (JP); Kenichi Tanaka, Niigata-ken (JP); Yosuke Ide, Niigata-ken (JP); Fumihito Koike, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 152 days.

(21) Appl. No.: 09/764,003

(22) Filed: Jan. 17, 2001

(65) Prior Publication Data
US 2001/0009063 A1 Jul. 26, 2001

(30) Foreign Application Priority Data

Jan. 24, 2000 (JP) ......................................... 2000-015051
Jan. 31, 2000 (JP) ......................................... 2000-023398

(51) Int. Cl.[7] .................................................. G11B 5/33
(52) U.S. Cl. ....................................................... 360/314
(58) Field of Search ........................................ 360/314

(56) References Cited

U.S. PATENT DOCUMENTS

| | | | |
|---|---|---|---|
| 5,408,377 A | 4/1995 | Gurney et al. | 360/113 |
| 5,869,963 A | 2/1999 | Saito et al. | 360/113 |
| 6,219,209 B1 * | 4/2001 | Gill | 360/324.11 |
| 6,221,172 B1 | 4/2001 | Saito et al. | |
| 6,424,506 B1 * | 7/2002 | Saito et al. | 360/324.11 |

FOREIGN PATENT DOCUMENTS

| | | | |
|---|---|---|---|
| JP | 10-204756 | 8/1993 | |
| JP | 10-204763 | 4/1995 | |
| JP | 10-204767 | 6/1996 | |
| JP | 3040750 | 3/2000 | 360/113 |
| JP | 2000-215421 | 8/2000 | 360/113 |

OTHER PUBLICATIONS

1996 Digests of INTERMAG '96; 1996 IEEE International Magnetics Conference; Apr. 9–12, 1996, Westin Seattle Hotel, Seattle, Washington USA; Session AA–04—Spin Valves with Synthetic Ferrimagnets; V.S. Speriosu, et al.

* cited by examiner

Primary Examiner—A. J. Heinz
Assistant Examiner—Mark S Blouin
(74) Attorney, Agent, or Firm—Brinks Hofer Gilson & Lione

(57) ABSTRACT

A spin valve thin-film magnetic device is provided, in which the asymmetry can be reduced. The spin valve thin-film magnetic device comprises a free magnetic layer and a first and a second fixed magnetic layer, which are provided respectively at each side of the free magnetic layer in the thickness direction thereof. In the spin valve thin-film magnetic device, the free magnetic layer is composed of a first and a second ferromagnetic free layer, in which the entire free magnetic layer is in a ferrimagnetic state, the first fixed magnetic layer is composed of a first and a second pinned ferromagnetic layer, in which the entire first fixed magnetic layer is in a ferrimagnetic state, and the second fixed magnetic layer is composed of a third and a fourth pinned ferromagnetic layer, in which the entire second fixed magnetic layer is in a ferrimagnetic state. In addition, magnetization directions of the second and the third pinned ferromagnetic layers, which are closer to the free magnetic layer, are antiparallel to each other.

16 Claims, 30 Drawing Sheets

FIG. 5
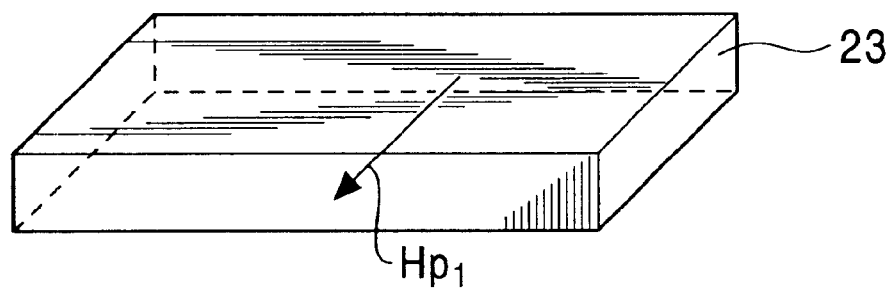
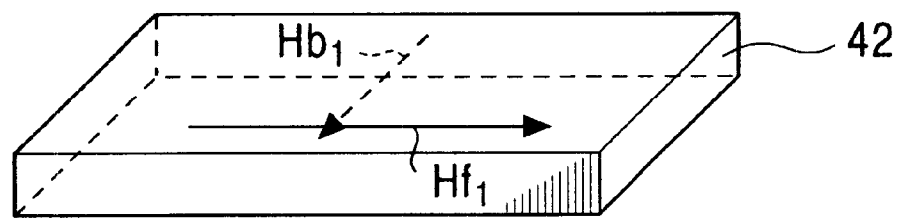
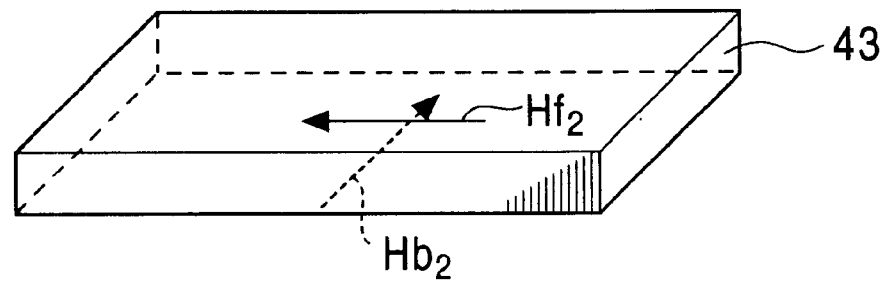
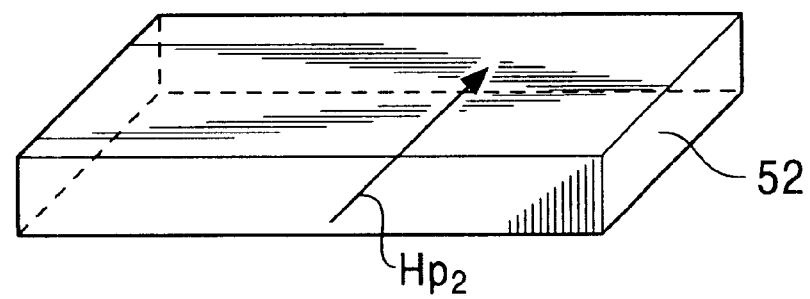
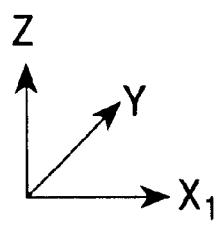

FIG. 18
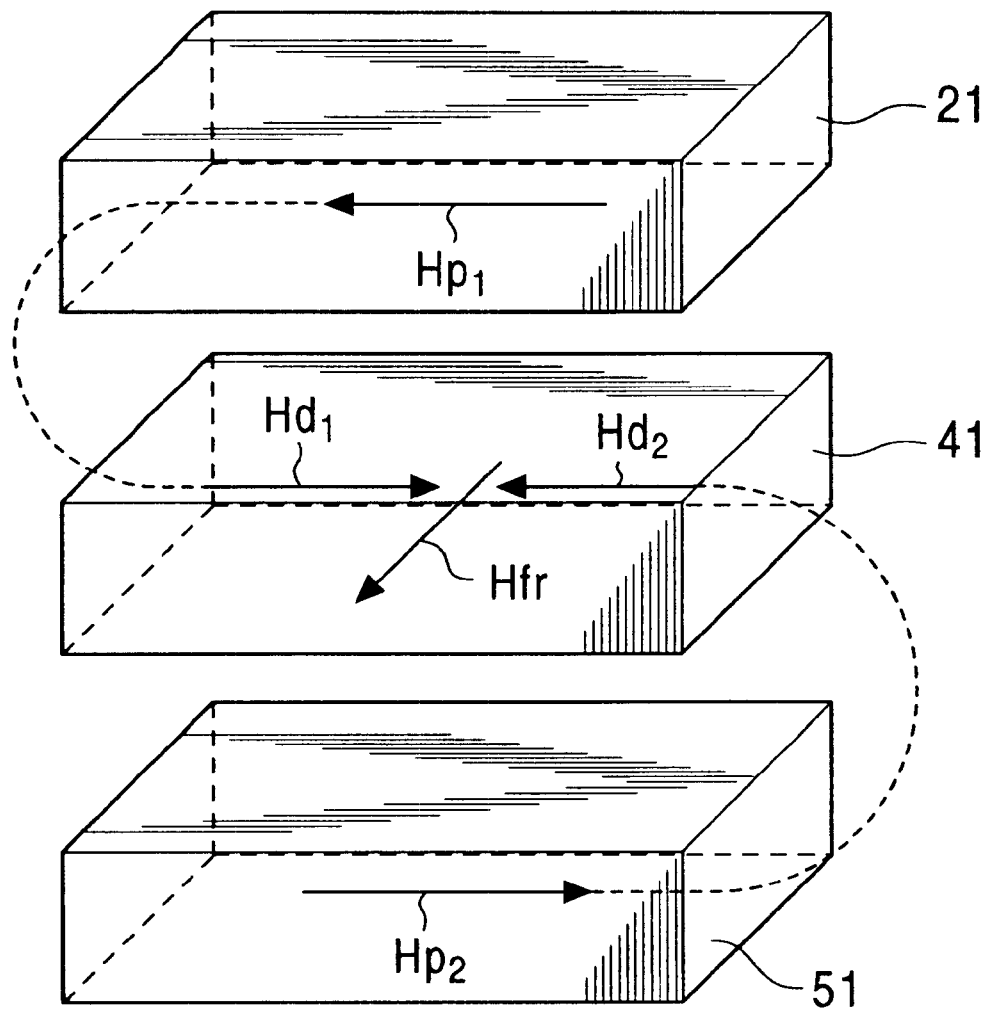
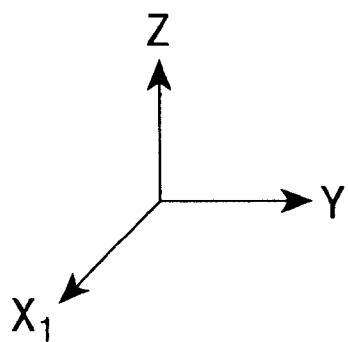

FIG. 19
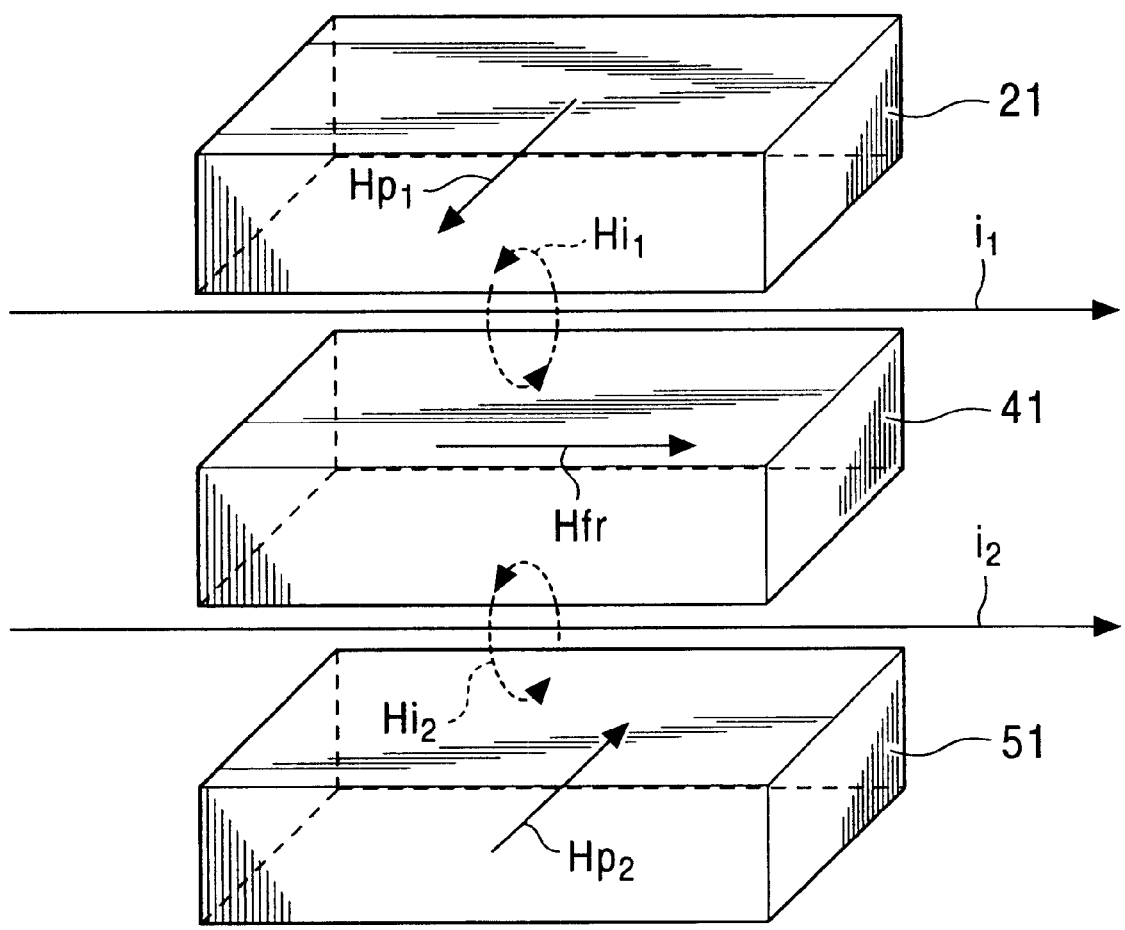
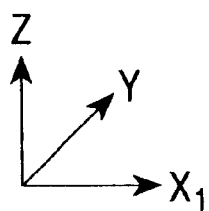

FIG. 30
PRIOR ART
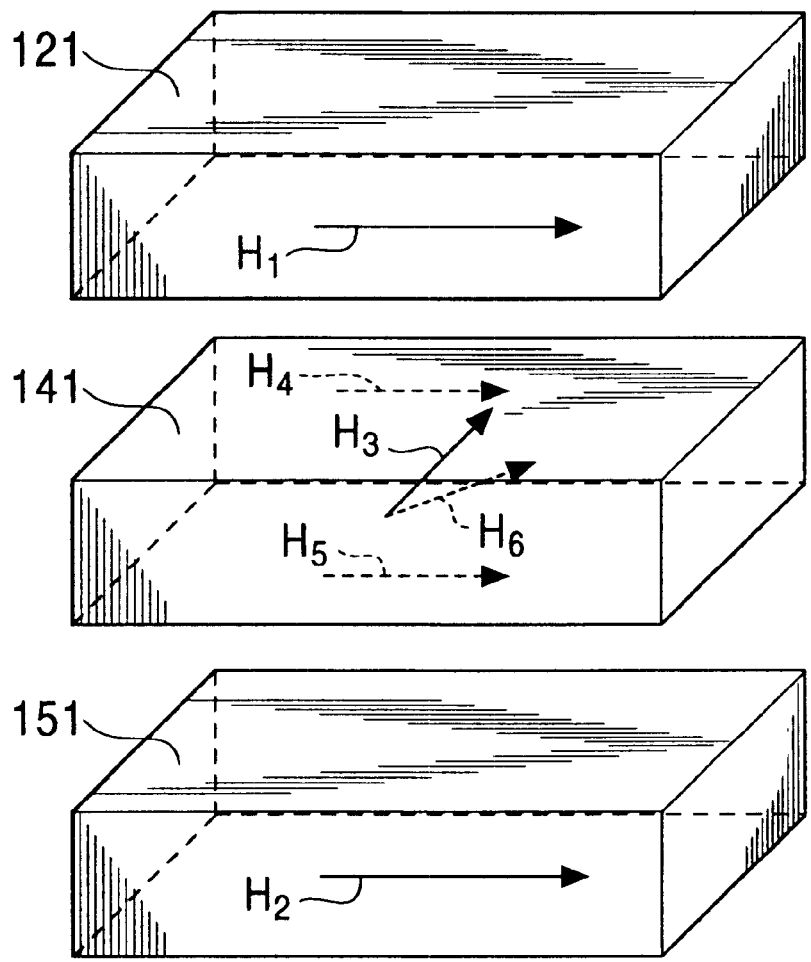
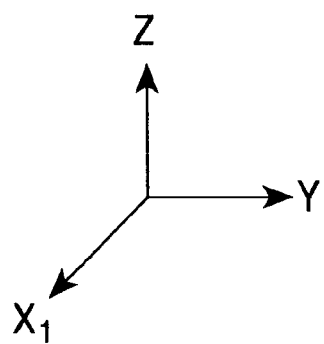

FIG. 31
PRIOR ART
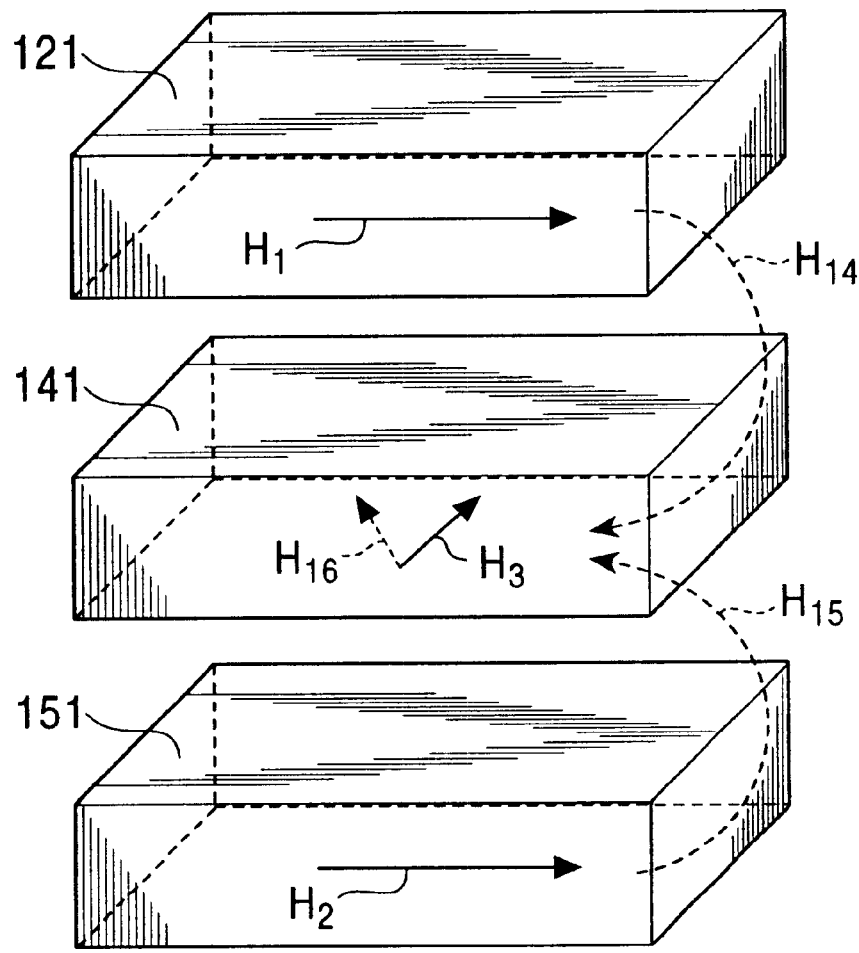
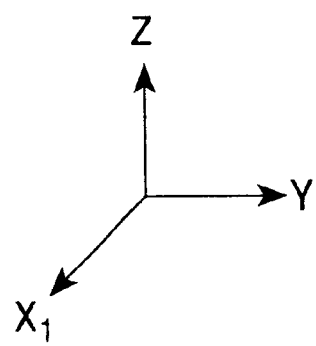

SPIN VALVE THIN-FILM MAGNETIC DEVICE HAVING FREE MAGNETIC LAYER IN FERRIMAGNETIC STATE AND MANUFACTURING METHOD THEREFOR

BACKGROUND OF THE INVENTION

1. Field of the Invention

The present invention relates to spin valve thin-film magnetic devices, thin-film magnetic heads, and floating type magnetic heads, and to methods for manufacturing spin valve thin-film magnetic devices, and more particularly, relates to a spin valve thin-film magnetic device in which the asymmetry thereof can be reduced.

2. Description of the Related Art

A giant magnetoresistive head is provided with a device having magnetoresistance, in which the device has a multilayer structure composed of a plurality of materials exhibiting giant magnetoresistance. Among several types of structures exhibiting giant magnetoresistance, a spin valve thin-film magnetic device may be mentioned as a device which has a relatively simple structure and a high rate of change in resistance with respect to application of a minute external magnetic field. As a spin valve thin-film magnetic device, a single spin valve thin-film magnetic device and a dual spin valve thin-film magnetic device may be mentioned.

FIGS. 28 and 29 show schematic cross-sectional views of conventional spin valve thin-film magnetic devices. FIG. 28 is a cross-sectional view observed from a recording medium side, and FIG. 29 is a cross-sectional view observed from a track width direction side.

In FIGS. 28 and 29, an $X_1$ direction in the figure is the track width direction of the spin valve thin-film magnetic device, a Y direction in the figure is the direction of a leakage magnetic field from the magnetic recording medium, and a Z direction in the figure is the moving direction of the magnetic recording medium.

The spin valve thin-film magnetic device 9 shown in FIGS. 28 and 29 is a so-called a dual spin valve thin-film magnetic device composed of a free magnetic layer provided on each surface thereof in the thickness direction with a nonmagnetic conductive layer, a fixed magnetic layer, and an antiferromagnetic layer, in that order, from the free magnetic layer.

In the spin valve thin-film magnetic device 9, an underlying layer 115 is formed on an insulating layer 264, and on the underlying layer 115, a second antiferromagnetic layer 172, a second fixed magnetic layer 151, a second nonmagnetic conductive layer 132, a free magnetic layer 141, a first nonmagnetic conductive layer 131, a first fixed magnetic layer 121, a first antiferromagnetic layer 171, and a cap layer 114 are sequentially formed, in that order.

In addition, on both sides of a laminate composed of the layers from the underlying layer 115 to the cap layer 114 in the $X_1$ direction in the figure, conductive layers 116 and 116, interlayers 117 and 117, bias layers 118 and 118, and bias underlying layers 119 and 119 are formed.

The first and the second fixed magnetic layers 121 and 151 are magnetized respectively by exchange anisotropic magnetic fields which appear at the interfaces between the first fixed magnetic layers 121 and the first antiferromagnetic layers 171 and between the second fixed magnetic layer 151 and the second antiferromagnetic layer 172, and the magnetization directions of the first and the second fixed magnetic layers 121 and 151 are fixed in the Y direction in the figure.

The free magnetic layer 141 is placed in a single domain state by the bias layers 118 and 118, and the magnetization direction of the free magnetic layer 141 is aligned in the direction opposite to the $X_1$ direction in the figure, i.e., in the direction crossing the magnetization directions of the first and the second fixed magnetic layers 121 and 151.

When the free magnetic layer 141 is placed in a single domain state, the generation of Barkhausen noise is prevented.

In this spin valve thin-film magnetic device 9, when sensing current is imparted from the conductive layers 116 and 116 to the free magnetic layer 141, the first and the second nonmagnetic conductive layers 131 and 132, and the first and the second fixed magnetic layers 121 and 151, and when leakage magnetic field from the magnetic recording medium running to the Z direction is imparted to the free magnetic layer 141 in the Y direction in the figure, the magnetization direction of the free magnetic layer 141 is changed from the direction opposite to the $X_1$ direction to the Y direction. The combination of the change in the magnetization direction in the free magnetic layer 141 and the magnetization directions of the first and the second fixed magnetic layers 121 and 151 changes the electrical resistance, and the leakage magnetic field from the recording medium is detected by the change in voltage in accordance with the change in the electrical resistance.

In a typical spin valve thin-film magnetic device, as shown in FIG. 30, when an external magnetic field from the recording medium is not applied, it is ideal for the magnetization direction $H_3$ of the free magnetic layer 141 to be perpendicular to the magnetic directions $H_1$ and $H_2$ of the first and the second fixed magnetic layers 121 and 151.

However, in the conventional spin valve thin-film magnetic device 9, ferromagnetic interlayer coupling occurs between the free magnetic layer 141 and the first and the second fixed magnetic layers 121 and 151 with the first and the second nonmagnetic conductive layers 131 and 132, respectively, and as a result, magnetic moments $H_4$ and $H_5$ are generated by the ferromagnetic interlayer coupling magnetic fields. The directions of the magnetic moments $H_4$ and $H_5$ are parallel to the magnetization directions of the first and the second fixed magnetic layers 121 and 151, i.e., the directions of the magnetic moments $H_4$ and $H_5$ are in the Y direction in the figure.

Consequently, since the magnetization direction $H_3$ of the free magnetic layer 141 is inclined by the magnetic field moments $H_4$ and $H_5$ to the Y direction so as to be $H_6$, and hence, the magnetization direction $H_6$ of the free magnetic layer 141 cannot be perpendicular to the magnetization directions $H_1$ and $H_2$ of the first and the second fixed magnetic layers 121 and 151, there is a problem in that an asymmetric property (hereinafter referred to as "asymmetry") of wave shapes for reading is increased.

In addition, in the conventional spin valve thin-film magnetic device 9, as shown in FIG. 31, when an external magnetic field from the recording medium is not applied, it is ideal for the magnetization direction $H_3$ of the free magnetic layer 141 to be perpendicular to the magnetic directions $H_1$ and $H_2$ of the first and the second fixed magnetic layers 121 and 151. However, dipole magnetic fields $H_{14}$ and $H_{15}$ leaked from the first and the second fixed magnetic layers 121 and 151, respectively, penetrate into the free magnetic layer 141 from the direction opposite to the Y direction in the figure and incline the magnetization direction $H_3$ of the free magnetic layer 141 toward the magnetization direction $H_{16}$ which is a direction opposite to the Y direction. As a result, the magnetization direction $H_{16}$ of the free magnetic layer 141 cannot be perpendicular to the magnetization directions $H_1$ and $H_2$ of the first and the second fixed magnetic layers 121 and 151, and there is a problem in that the asymmetry wave shapes for reading, i.e., the asymmetry, is increased.

SUMMARY OF THE INVENTION

In consideration of the problems described above, an object of the present invention is to provides a spin valve thin-film magnetic device in which the inclination of the magnetization direction of the free magnetic layer can be prevented, and the asymmetry can be reduced, a thin-film magnetic head provided with the spin valve thin-film magnetic device, and a floating type magnetic head provided with the thin-film magnetic head. The present invention also provides a method for manufacturing the spin valve thin-film magnetic device described above.

To these ends, the structures described below are employed in the present invention.

A spin valve thin-film magnetic device according to the present invention, comprises a free magnetic layer, a pair of nonmagnetic conductive layers formed on both sides of the free magnetic layer in the thickness direction thereof, a pair of fixed magnetic layers formed on the pair of nonconductive layers, a pair of antiferromagnetic layers formed on the pair of fixed magnetic layers, a pair of conductive layers imparting a sensing current to the free magnetic layer, the pair of nonmagnetic conductive layers, and the pair of fixed magnetic layers, and a pair of bias layers for aligning a magnetization direction of the free magnetic layer, wherein the free magnetic layer is a laminate composed of at least 2L ferromagnetic layers with a nonmagnetic interlayer provided therebetween, the L being an integer of 1 or more, in which magnetization directions of the ferromagnetic layers adjacent to each other are antiparallel to each other so that the entire free magnetic layer is in a ferrimagnetic state; one of the pair of the fixed magnetic layers is a laminate composed of at least 2M ferromagnetic layers with a nonmagnetic layer provided therebetween, the M being an integer of 1 or more, in which magnetization directions of the ferromagnetic layers adjacent to each other are antiparallel to each other so that the entire fixed magnetic layer is in a ferrimagnetic state, and a magnetization direction of the entire fixed magnetic layer is fixed in a direction crossing the magnetization direction of the entire free magnetic layer by an exchange coupling magnetic field formed by the fixed magnetic layer and one of the antiferromagnetic layers adjacent thereto; the other fixed magnetic layer is a laminate composed of at least 2N ferromagnetic layers with a nonmagnetic layer provided therebetween, the N being an integer of 1 or more, in which magnetization-directions of the ferromagnetic layers adjacent to each other are antiparallel to each other so that the entire other fixed magnetic layer is in a ferrimagnetic state, and a magnetization direction of the entire other fixed magnetic layer is fixed in a direction parallel to the magnetization direction of the fixed magnetic layer by an exchange coupling magnetic field formed by the other fixed magnetic layer and the other antiferromagnetic layer adjacent thereto; and a magnetization direction of a ferromagnetic layer, which is closest to the free magnetic layer among the ferromagnetic layers forming the fixed magnetic layer, and a magnetization direction of a ferromagnetic layer, which is closest to the free magnetic layer among the ferromagnetic layers forming the other fixed magnetic layer, are antiparallel to each other.

According to the spin valve thin-film magnetic device described above, the fixed magnetic layer is composed of the even number 2L of ferromagnetic layers, and the other fixed magnetic layer is composed of the even number 2N of ferromagnetic layers, in which, when magnetization directions of these fixed magnetic layers are parallel to each other, magnetization directions of ferromagnetic layers, which are closest to the free magnetic layer among ferromagnetic layers forming individual fixed magnetic layers, are simultaneously antiparallel to each other. Consequently, the magnetization direction of the free magnetic layer can be aligned in the direction perpendicular to the magnetization directions of these fixed magnetic layers.

The magnetization direction of the free magnetic layer can generally be aligned in one direction by the bias layers. However, the magnetization direction of the free magnetic layer provided between the fixed magnetic layers may be inclined depending on the magnetizations thereof, and as a result, the asymmetry may not be reduced in some cases.

However, according to the spin valve thin-film magnetic device described above, the magnetization direction of the free magnetic layer is unlikely to be influenced by the magnetizations of the fixed magnetic layers, and hence, the asymmetry can be reduced.

In the spin valve thin-film magnetic device of the present invention described above, the direction of a magnetic field moment $Hb_1$ of a ferromagnetic exchange coupling magnetic field formed by ferromagnetic interlayer coupling of the free magnetic layer and a ferromagnetic layer, which is closest to the free magnetic layer among the ferromagnetic layers forming the fixed magnetic layer, and the direction of a magnetic field moment $Hb_2$ of a ferromagnetic exchange coupling magnetic field formed by ferromagnetic interlayer coupling of the free magnetic layer and a ferromagnetic layer, which is closest to the free magnetic layer among the ferromagnetic layers forming the other fixed magnetic layer, are antiparallel to each other in the free magnetic layer.

According to the spin valve thin-film magnetic device described above, since the directions of the magnetic moments $Hb_1$ and $Hb_2$ of the ferromagnetic interlayer coupling magnetic fields formed by the free magnetic layer and the individual ferromagnetic layers, which are closest to the free magnetic layer among the ferromagnetic layers forming the fixed magnetic layer and the other fixed magnetic layer, are antiparallel to each other in the free magnetic layer, the ferromagnetic interlayer coupling magnetic fields counteract each other, and hence, the magnetization direction of the free magnetic layer is not inclined by the ferromagnetic interlayer coupling magnetic fields. As a result, the magnetization direction of the free magnetic layer can be aligned in the direction perpendicular to those of the fixed magnetic layers, and hence, the asymmetry of the spin valve thin-film magnetic device can be reduced.

In the spin valve thin-film magnetic device according to the present invention, it is preferable that the L be 1, the M be 1, and the N be 1.

When the spin valve thin-film magnetic device has the structure as described above, the thicknesses of the free magnetic layer and the fixed magnetic layers are decreased, and shunting of the sensing current can be prevented, whereby the rate of change in magnetoresistance can be increased.

In the spin valve thin-film magnetic device according to the present invention, it is preferable that one of the fixed magnetic layers described above be composed of a first ferromagnetic layer and a second ferromagnetic layer with a first nonmagnetic layer provided therebetween, in which the thickness of the second ferromagnetic layer formed at a location closer to the free magnetic layer is larger than that of the first ferromagnetic layer, and that the other fixed magnetic layer be composed of a third ferromagnetic layer and a fourth ferromagnetic layer with a second nonmagnetic layer provided therebetween, in which the thickness of the third ferromagnetic layer formed at a location closer to the free magnetic layer is smaller than that of the fourth ferromagnetic layer.

In addition, in the spin valve thin-film magnetic device according to the present invention, one of the fixed magnetic layers described above may be composed of a first ferromagnetic layer and a second ferromagnetic layer with a first nonmagnetic layer provided therebetween, in which the thickness of the second ferromagnetic layer formed at a location closer to the free magnetic layer is smaller than that of the first ferromagnetic layer, and that the other fixed magnetic layer may be composed of a third ferromagnetic layer and a fourth ferromagnetic layer with a second nonmagnetic layer provided therebetween, in which the thickness of the third ferromagnetic layer disposed at a location closer to the free magnetic layer is larger than that of the fourth ferromagnetic layer.

A thin-film magnetic head of the present invention is capable of reading magnetically written information, which comprises one of the spin valve thin-film magnetic devices described above.

A floating type magnetic head of the present invention comprises a slider and the thin-film magnetic head described above provided in the slider.

Since the thin-film magnetic head and the floating type magnetic head comprise the spin valve thin-film magnetic devices in which the asymmetry thereof is reduced, a superior symmetric property of wave shapes for reading can be obtained, and the rate of occurrence of errors in reading can be reduce.

A method for manufacturing a spin valve thin-film magnetic device of the present invention, comprises a step of forming an antiferromagnetic layer, a fixed magnetic layer composed of at least 2M ferromagnetic layers coupled antiferromagnetically with each other with a nonmagnetic layer provided therebetween, in which the M is an integer of 1 or more, a nonmagnetic conductive layer, a free magnetic layer composed of at least 2L ferromagnetic layers coupled antiferromagnetically with each other with a nonmagnetic interlayer provided therebetween, in which the L is an integer of 1 or more, the other nonmagnetic conductive layer, the other fixed magnetic layer composed of at least 2N ferromagnetic layers coupled antiferromagnetically with each other with a nonmagnetic layer provided therebetween, in which the N is an integer of 1 or more, and the other antiferromagnetic layer so as to form a laminate; and a step of performing a heat treatment for the laminate, while an external magnetic field is applied to the laminate, which is smaller than a magnetic field at which spin flop transformations occur in the ferromagnetic layers forming the fixed magnetic layer and the other fixed magnetic layer, whereby exchange coupling magnetic fields appear between the antiferromagnetic layer and the fixed magnetic layer and between the other antiferromagnetic layer and the other fixed magnetic layer.

The external magnetic field is preferably $8.0 \times 10^4$ A/m or less.

According to the method for manufacturing a spin valve thin-film magnetic device described above, by the step of forming the laminate composed of the free magnetic layer, the fixed magnetic layers, the nonmagnetic conductive layers, and the antiferromagnetic layers, as described above, followed by the step of performing the heat treatment while the external magnetic field is applied which is smaller than that at which spin flop transformations occur in the individual ferromagnetic layers forming the fixed magnetic layers, a spin valve thin-film magnetic device as described above can be easily manufactured.

In addition, in order to solve the conventional problems described above, the structures described below are employed in the present invention.

A spin valve thin-film magnetic device according to the present invention, comprises a free magnetic layer, a pair of nonmagnetic conductive layers formed on both sides of the free magnetic layer in the thickness direction thereof, a pair of fixed magnetic layers formed on the pair of nonconductive layers, a pair of antiferromagnetic layers formed on the pair of fixed magnetic layers, a pair of conductive layers imparting a sensing current to the free magnetic layer, the pair of nonmagnetic conductive layers, and the pair of fixed magnetic layers, and a pair of bias layers for aligning a magnetization direction of the free magnetic layer, wherein the free magnetic layer is a laminate composed of at least 2L ferromagnetic layers with a nonmagnetic interlayer provided therebetween, the L being an integer of 1 or more, in which magnetization directions of the ferromagnetic layers adjacent to each other are antiparallel to each other so that the entire free magnetic layer is in a ferrimagnetic state; one of the pair of fixed magnetic layers is a laminate composed of at least 2M ferromagnetic layers with a nonmagnetic layer provided therebetween, the M being an integer of 1 or more, in which magnetization directions of the ferromagnetic layers adjacent to each other are antiparallel to each other so that the entire fixed magnetic layer is in a ferrimagnetic state, and a magnetization direction of the entire fixed magnetic layer is fixed in a direction crossing the magnetization direction of the entire free magnetic layer by an exchange coupling magnetic field formed by the fixed magnetic layer and one of the antiferromagnetic layer adjacent thereto; the other fixed magnetic layer is one of a single ferromagnetic layer and a laminate composed of at least 2N+1 ferromagnetic layers with a nonmagnetic layer provided therebetween, the N being an integer of 1 or more, magnetization directions of the ferromagnetic layers adjacent to each other being antiparallel to each other so that the entire other fixed magnetic layer is in a ferrimagnetic state, and a magnetization direction of the entire other fixed magnetic layer is fixed so as to be antiparallel to the magnetization direction of the fixed magnetic layer by an exchange coupling magnetic field formed by the other fixed magnetic layer and the other antiferromagnetic layer adjacent thereto; and a magnetization direction of a ferromagnetic layer, which is closest to the free magnetic layer among the ferromagnetic layers forming the fixed magnetic layer, and a magnetization direction of a ferromagnetic layer, which is closest to the free magnetic layer among the ferromagnetic layers forming the other fixed magnetic layer, are antiparallel to each other.

According to the thin-film magnetic device described above, the fixed magnetic layer is composed of 2L ferromagnetic layers, i.e., an even number of ferromagnetic layers, and the other fixed magnetic layer is composed of a single ferromagnetic layer or 2N+1 ferromagnetic layers, i.e., an odd number of ferromagnetic layers, in which, when the magnetization directions of these fixed magnetic layers are antiparallel to each other, magnetization directions of ferromagnetic layers, which are closest to the free magnetic layers among ferromagnetic layers forming individual fixed magnetic layers, are simultaneously antiparallel to each other. Consequently, the magnetization direction of the free magnetic layer can be aligned in the direction perpendicular to the magnetization directions of these fixed magnetic layers.

The magnetization direction of the free magnetic layer can generally be aligned in one direction by the bias layers. However, the magnetization direction of the free magnetic layer provided between the fixed magnetic layers may be inclined depending on the magnetizations thereof, and as a result, the asymmetry may not be reduced in some cases.

However, according to the spin valve thin-film magnetic device described above, the magnetization direction of the free magnetic layer is unlikely to be influenced by the magnetizations of the fixed magnetic layers, and hence, the asymmetry can be reduced.

In the spin valve thin-film magnetic device of the present invention described above, the direction of a magnetic field moment $Hb_1$ of a ferromagnetic exchange coupling magnetic field formed by ferromagnetic interlayer coupling of the free magnetic layer and a ferromagnetic layer, which is closest to the free magnetic layer among the ferromagnetic layers forming the fixed magnetic layer, and the direction of a magnetic field moment $Hb_2$ of a ferromagnetic exchange coupling magnetic field formed by ferromagnetic interlayer coupling of the free magnetic layer and a ferromagnetic layer, which is closest to the free magnetic layer among the ferromagnetic layers forming the other fixed magnetic layer, are antiparallel to each other in the free magnetic layer.

According to the spin valve thin-film magnetic device described above, since the directions of the magnetic moments $Hb_1$ and $Hb_2$ of the ferromagnetic interlayer coupling magnetic fields formed by the free magnetic layer and the individual ferromagnetic layers, which are closest to the free magnetic layer among the ferromagnetic layers forming the fixed magnetic layer and the other fixed magnetic layer, are antiparallel to each other in the free magnetic layer, the ferromagnetic interlayer coupling magnetic fields counteract each other, and hence, the magnetization direction of the free magnetic layer is not inclined by the ferromagnetic interlayer coupling magnetic fields. As a result, the magnetization direction of the free magnetic layer can be aligned in the direction perpendicular to those of the fixed magnetic layers, and hence, the asymmetry of the spin valve thin-film magnetic device can be reduced.

According to the spin valve thin-film magnetic device of the present invention described above, the direction of a magnetic moment $Hd_1$ of a dipole magnetic field of the fixed magnetic layer and the direction of a magnetic moment $Hd_2$ of a dipole magnetic field of the other fixed magnetic layer is antiparallel to each other in the free magnetic layer.

In the spin valve thin-film magnetic device described above, since the directions of the magnetic moments $Hd_1$ and $Hd_2$ of the dipole magnetic fields of the fixed magnetic layer and the other fixed magnetic layer are antiparallel to each other in the free magnetic layer, the dipole moments of the fixed magnetic layers counteract each other, and the magnetization direction of the free magnetic layer is not inclined by these dipole magnetic fields, whereby the magnetization direction of the free magnetic layer can be aligned in the direction perpendicular to the magnetization directions of the fixed magnetic layers, and hence, the asymmetry of the spin valve thin-film magnetic device can be reduced.

In addition, according to the spin valve thin-film magnetic device of the present invention, when the sensing current flows in the pair of nonmagnetic conductive layers, a magnetic moment Hs of a sensing current magnetic field applied to the free magnetic layer is represented by the formula described below.

$$Hb_1 + Hb_2 + Hd_1 + Hd_2 + Hs \approx 0$$

According to the spin valve thin-film magnetic device described above, since the sum of the magnetic moments $Hb_1$ and $Hb_2$ of the ferromagnetic interlayer coupling magnetic fields applied to the free magnetic layer, the magnetic moments $Hd_1$ and $Hd_2$ of the dipole magnetic fields, and the magnetic moment Hs of the sensing current magnetic field is zero, the magnetization direction of the free magnetic layer is not inclined by these magnetic moments, and the asymmetry of the spin valve thin-film magnetic device can be zero.

In the spin valve thin-film magnetic device according to the present invention, it is preferable that the L be 1, the M be 1, and the other fixed magnetic layer be a single ferromagnetic layer.

In addition, in the spin valve thin-film magnetic device according to the present invention, the L may be 1, the M may be 1, and the N may be 1.

When the spin valve thin-film magnetic device is formed as described above, the thicknesses of the free magnetic layer and the fixed magnetic layers are decreased, and shunting of the sensing current can be prevented, whereby the rate of change in magnetoresistance can be increased.

In the spin valve thin-film magnetic device according to the present invention, when sensing current flows, the direction of the sensing current magnetic field applied to the fixed magnetic layer and the magnetization direction of the entire fixed magnetic layer are in the same direction, and the direction of the sensing current magnetic field applied to the other fixed magnetic layer and the magnetization direction of the entire other fixed magnetic layer are in the same direction.

According to the spin valve thin-film magnetic device described above, since the directions of the sensing current magnetic fields, which are generated when the sensing current flows in each nonmagnetic conductive layer, are in the same directions as the magnetization directions of the corresponding fixed magnetic layers, the magnetizations of the fixed magnetic layers are not counteracted by the sensing current magnetic fields, and the magnetizations of the fixed magnetic layers can be reliably fixed, whereby the asymmetry of the spin valve thin-film magnetic device can be reduced.

The thin-film magnetic head of the present invention is capable of reading magnetically written information, which comprises one of the spin valve thin-film magnetic devices described above.

In addition, the floating type magnetic head of the present invention comprises a slider and the thin-film magnetic head described above provided in the slider.

Since the thin-film magnetic head and the floating type magnetic head comprise the spin valve thin-film magnetic devices described above in which the asymmetry thereof is reduced, the symmetry of wave shapes for reading is superior, and the rate of occurrence of errors in reading can be reduced.

A method for manufacturing a spin valve thin-film magnetic device according to the present invention, comprises the steps of forming an antiferromagnetic layer, a fixed magnetic layer composed of at least 2M ferromagnetic layers with a nonmagnetic layer provided therebetween, in which the M is an integer of 1 or more, a nonmagnetic conductive layer, a free magnetic layer composed of at least 2L ferromagnetic layers with a nonmagnetic interlayer provided therebetween, in which the L is an integer of 1 or more, the other nonmagnetic conductive layer, the other fixed magnetic layer composed of one of a single ferromagnetic layer and at least 2N+1 ferromagnetic layers with a nonmagnetic layer provided therebetween, in which the N is an integer of 1 or more, and the other antiferromagnetic layer so as to form a laminate; and performing a heat treatment for the laminate, while an external magnetic field is applied to the laminate so as to align magnetization directions of all ferromagnetic layers forming the fixed magnetic layer and the other fixed magnetic layer in the same direction, whereby exchange coupling magnetic fields appear between the antiferromagnetic layer and the fixed magnetic layer and between the other antiferromagnetic layer and the other fixed magnetic layer.

In addition, the external magnetic field is preferably $4.0 \times 10^5$ A/m or more.

According to the method for manufacturing a spin valve thin-film magnetic device, by the step of forming the laminate composed of the free magnetic layer, the fixed magnetic layers, the nonmagnetic conductive layers, and the antiferromagnetic layers, as described above, followed by the step of performing the heat treatment while the external magnetic field is applied which is sufficient so as to align the magnetization directions of all ferromagnetic layers forming the fixed magnetic layers in the same direction, a spin valve thin-film magnetic device as described above can be easily manufactured.

BRIEF DESCRIPTION OF THE DRAWINGS

FIG. 5 is a schematic view illustrating ferromagnetic interlayer coupling magnetic fields which appear between a free magnetic layer and a first and a second fixed magnetic layer, in the spin valve thin-film magnetic device shown in FIG. 1;

FIG. 18 is a schematic view illustrating dipole magnetic fields which are applied to the free magnetic layer from the first and the second fixed magnetic layers in the spin valve thin-film magnetic device shown in FIG. 15;

FIG. 19 is a schematic view illustrating the relationship of the sensing current magnetic field, which is generated by sensing current flowing in the first and the second nonmagnetic conductive layer, and the magnetization directions of the first and the second fixed magnetic layers, in the spin valve thin-film magnetic device shown in FIG. 15;

FIG. 30 is a schematic view illustrating ferromagnetic interlayer coupling magnetic fields which are applied to a free magnetic layer in the spin valve thin-film magnetic device shown in FIG. 28; and FIG. 31 is a schematic view illustrating dipole magnetic fields which are applied to a free magnetic layer from a first and a second fixed magnetic layers in a conventional spin valve thin-film magnetic device.

DESCRIPTION OF THE PREFERRED EMBODIMENTS

Hereinafter, the embodiments of the present invention will be described with reference to FIGS. 1 to 27.

In FIGS. 1 to 27, a Z direction in the figure indicates a moving direction of a magnetic recording medium, a Y direction in the figure is a direction of leakage flux from the magnetic recording medium, and an $X_1$ direction shown in the figure is a track width direction of a spin valve thin-film magnetic device.

Embodiment 1

Figure 1:
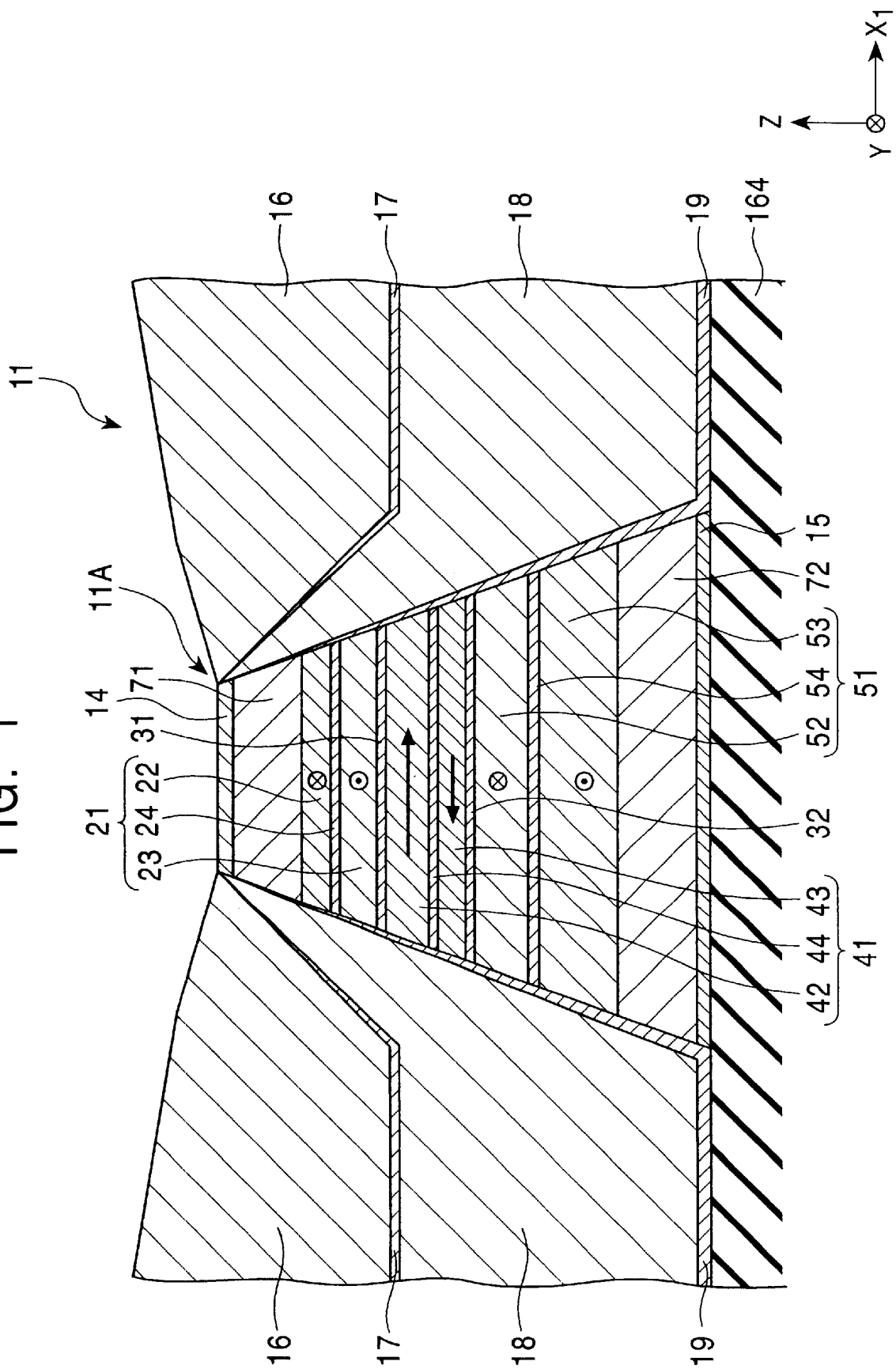
FIG. 1 is a schematic cross-sectional view of a spin valve thin-film magnetic device observed from a magnetic recording medium side, according to a first embodiment of the present invention.
Figure 2:
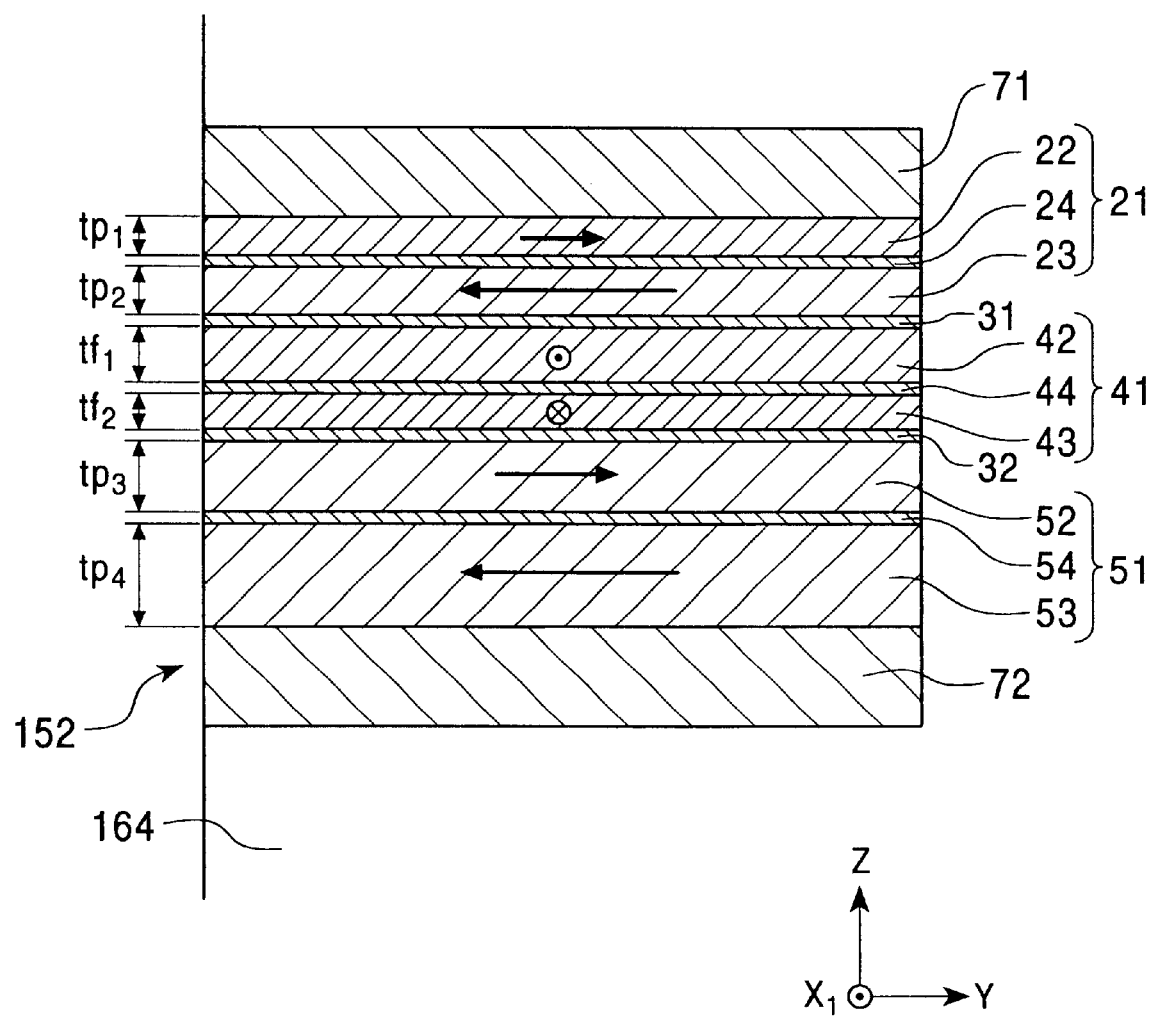
FIG. 2 is a schematic cross-sectional view of the spin valve thin-film magnetic device shown in FIG. 1 observed from a track width direction side.

FIG. 1 is a schematic cross-sectional view of a spin valve thin-film magnetic device 11 observed from the magnetic recording medium side, according to the first embodiment of the present invention, FIG. 2 is a schematic cross-sectional view of the spin valve thin-film magnetic device 11 observed from the track width direction.

Figure 3:
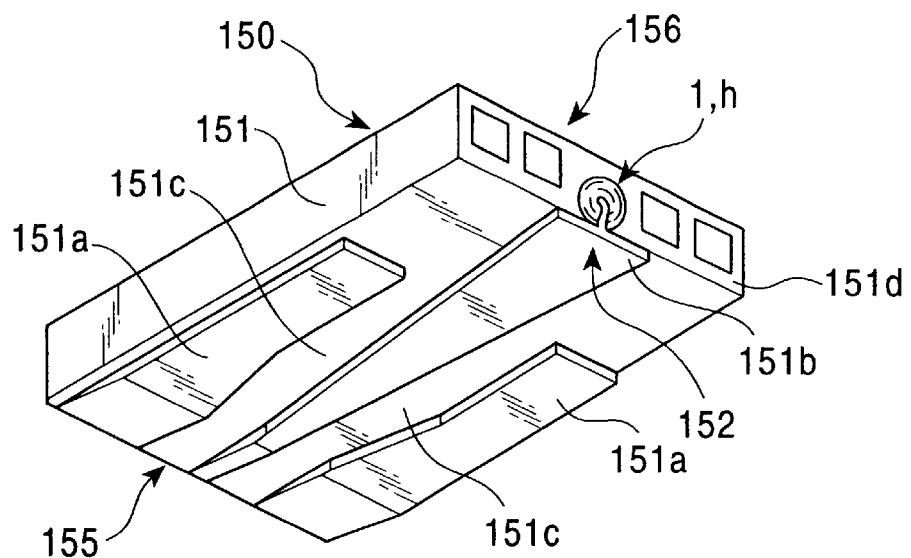
FIG. 3 is a perspective view of a floating type magnetic head comprising the spin valve thin-film magnetic device according to the first embodiment of the present invention.
Figure 4:
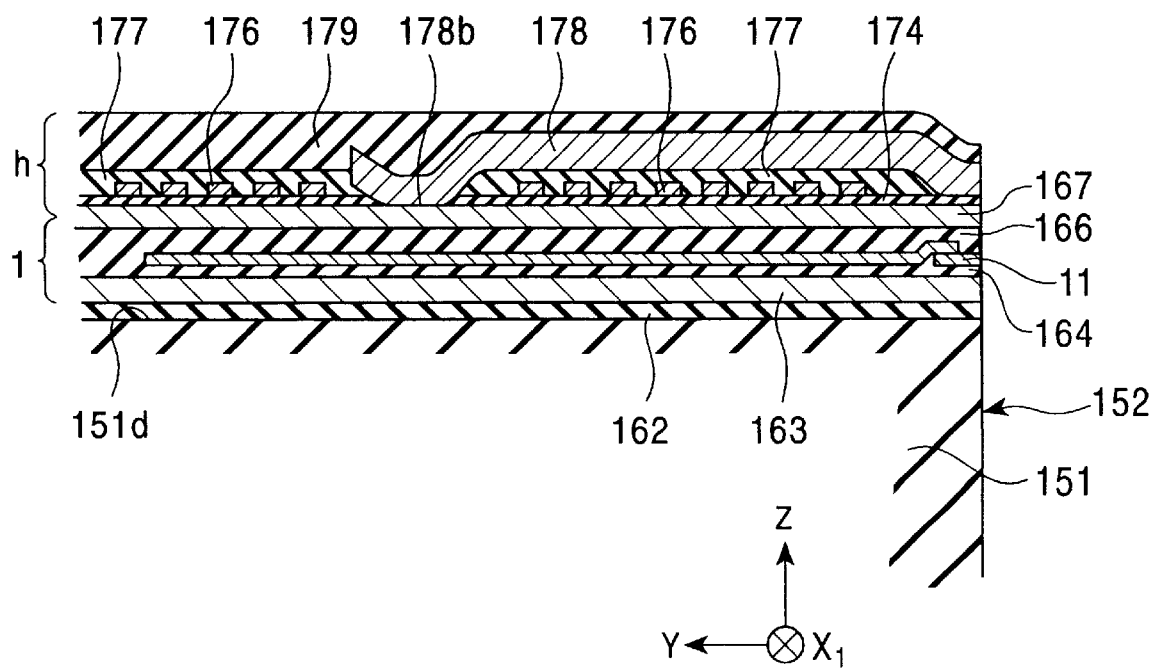
FIG. 4 is a perspective view of a thin-film magnetic head comprising the spin valve thin-film magnetic device according to the first embodiment of the present invention.

FIG. 3 shows a floating type magnetic head 150 comprising a thin-film magnetic head 1 provided with the spin valve thin-film magnetic device 11, and FIG. 4 is a cross-sectional view of an important portion of the thin-film magnetic head 1.

The floating type magnetic head 150 shown in FIG. 3 is primarily composed of a slider 151, the thin-film magnetic head 1 according to the present invention, and an inductive head h, which are provided at an edge face 151d of the slider 151. Numeral 155 indicates a leading side, i.e., an upstream side in the moving direction of the magnetic recording medium, and reference numeral 156 indicates a trailing side. On an opposing face 152 opposing a medium of the slider 151, rails 151a, 151a, and 151b are formed, and between individual rails, air grooves 151c and 151c are formed.

As shown in FIG. 4, the thin-film magnetic head 1 of the present invention is formed on an insulating layer 162 formed on the edge face 151d of the slider 151 and is composed of a lower shield layer 163 formed on the insulating layer 162, a lower insulating layer 164 formed on the lower shield layer 163, the spin valve thin-film magnetic device 11 of the present invention, which is formed on the lower insulating layer 164 and is exposed at the opposing face 152 opposing a medium, an upper insulating layer 166 covering the spin valve thin-film magnetic device 11, and an upper shield layer 167 covering the upper insulating layer 166.

The upper shield layer 167 is also used as a lower core layer of the inductive head h described below.

The inductive head h is composed of the lower core layer 167, i.e., the upper shield layer, a gap layer 174 formed on the lower core layer 167, a coil layer 176, an upper insulating layer 177 covering the coil 176, and an upper core layer 178 which is in contact with the gap layer 174 and is in contact with the lower core layer 176 at the coil 176 side.

The coil 176 has a planar-coiled pattern. In addition, a base portion 178b of the upper core layer 178 is magnetically coupled with the lower core layer 167 at approximately the central portion of the coil 176. A core protective layer 179 composed of alumina or the like is formed on the upper core layer 178.

As shown in FIGS. 1 and 2, the spin valve thin-film magnetic device 11 is a so-called a dual spin valve thin-film magnetic device composed of a free magnetic layer provided on each surface in the thickness direction thereof with a nonmagnetic conductive layer, a fixed magnetic layer, and an antiferromagnetic layer, in that order, from the free magnetic layer.

Since the dual spin valve thin-film magnetic device has two sets of layered structures composed of the free magnetic layer, nonmagnetic conductive layer, and the fixed magnetic layer, when compared to a single spin valve thin-film magnetic device having one set of the layered structure described above, a significantly high rate of the change in resistance can be expected, and hence the requirement for high density writing can be satisfied.

In FIG. 1, reference numeral 164 indicates the lower insulating layer composed of $Al_2O_3$ or the like, and reference numeral 15 indicates an underling layer composed of tantalum (Ta) formed on the lower insulating layer 164. On the underlying layer 15, a second antiferromagnetic layer 72, a second fixed magnetic layer 51, a second nonmagnetic conductive layer 32, a free magnetic layer 41, a first nonmagnetic conductive layer 31, and a first fixed magnetic layer 21, a first antiferromagnetic layer 71, and a cap layer 14 composed of Ta or the like are sequentially formed, in that order.

A laminate 11A having a cross-section in an approximately trapezoid is formed so as to have the width equivalent to the track width, in which individual layers are sequentially formed from the underlying layer 15 to the cap layer 14.

On both sides of the laminate 11A in the $X_1$ direction shown in the figure, a pair of bias layers 18 and 18 are formed which are composed of a cobalt-platinum (Co—Pt) alloy or the like. The bias layers 18 and 18 are formed so as to extend from the lower insulating layer 164 to the top of the laminate 11A along both side surfaces thereof. The bias layers 18 and 18 serve to align the magnetizing direction of the free magnetic layer 41 and to reduce Barkhausen noise of the free magnetic layer 41.

Conductive layers 16 and 16 are formed above the bias layers 18 and 18. The conductive layers 16 and 16 primarily serve to apply a sensing current to the free magnetic layer 41, the first and the second nonmagnetic conductive layer 31 and 32, and the first and the second fixed magnetic layer 21 and 51.

At each side of the laminate 11A, a bias underlying layer 19 composed of, for example, a nonmagnetic metal such as chromium (Cr) is provided between the bias layer 18 and the underlying layer 164 and between the bias layer 18 and the laminate 11A. By forming the bias layer 18 on the bias underlying layer 19, which is composed of Cr having the body-centered cubic structure (bcc structure), the coercive force and the remanence ratio of the bias layer 18 are increased, and hence, the bias magnetic field can be increased which is required for single domain formation of the free magnetic layer 41.

In addition, an interlayer 17 is provided between the bias layer 18 and the conductive layer 16, which is composed of nonmagnetic metal, such as Ta or Cr. When Cr is used for the conductive layer 16, the interlayer 17 composed of Ta functions as a diffusion barrier in a thermal step, such as resist curing in a backend process, so as to prevent the degradation of magnetic characteristics of the bias layer 18. In addition, when Ta is used for the conductive layer 16, the interlayer 17 composed of Cr has the effect of easily forming the body-centered cubic crystalline Ta having a lower resistance, which is deposited on the Cr.

The first and the second antiferromagnetic layers 71 and 72 are preferably composed of a platinum-manganese (Pt—Mn) alloy. Compared to a Ni—Mn alloy and a Fe—Mn alloy, which are conventionally used for antiferromagnetic layers, a Pt—Mn alloy has superior corrosion resistance, higher blocking temperatures, and larger exchange coupling magnetic field.

The first and the second antiferromagnetic layers 71 and 72 may be composed of an alloy represented by the formula X—Mn, in which the X is an element selected from Pt, Pd, Ru, Ir, Rh, or Os, or an alloy represented by the formula X'—Pt—Mn, in which the X' is at least one element selected from Pd, Cr, Ni, Ru, Ir, Rh, Os, Au, and Ag.

In the Pt—Mn alloy and the alloy represented by the formula X—Mn, Pt or X is preferably in the range of 37 to 63 atomic %, and more preferably, of 44 to 57 atomic %.

In addition, in the alloy represented by the formula X'—Pt—Mn, the total of the X' and Pt is preferably in the range of 37 to 63 atomic %, and more preferably, of 44 to 57 atomic %.

When alloys having appropriate compositions as described above suitable for the first and the second antiferromagnetic layers 71 and 72 are heat-treated in magnetic fields, the first and the second antiferromagnetic layers 71 and 72 can be obtained which generate larger exchange coupling magnetic fields. In particular, when a Pt—Mn alloy is used, the first and the second antiferromagnetic layers 71 and 72 can be obtained having an exchange coupling magnetic field exceeding $6.4 \times 10^4$ A/m and a significantly higher blocking temperature of 653 K (380° C.) at which the exchange coupling magnetic field disappears.

As shown in FIGS. 1 and 2, the free magnetic layer 41 is composed of a first ferromagnetic free layer 42, i.e., ferromagnetic layer, and a second ferromagnetic free layer 43, i.e., ferromagnetic layer, with a nonmagnetic interlayer 44 provided therebetween.

The first and the second ferromagnetic free layers 42 and 43 are preferably composed of a Ni—Fe alloy, and the nonmagnetic interlayer 44 is preferably composed of one element selected from Ru, Rh, Ir, Cr, Re, and Cu, or of a nonmagnetic material composed of an alloy thereof, and more preferably, is composed of Ru.

The thickness $tf_1$ of the first ferromagnetic free layer 42 is preferably 1 to 4 nm, and the thickness $tf_2$ of the second ferromagnetic free layer 43 is preferably 1 to 4 nm.

In addition, the thickness of the nonmagnetic interlayer 44 is preferably 0.3 to 1.2 nm.

The magnetization direction of the first ferromagnetic free layer 42 is aligned in the $X_1$ direction in the figure by the bias magnetic field of the bias layers 18 and 18, and the second ferromagnetic free layer 43 is coupled antiferromagnetically with the first ferromagnetic free layer 42 so that the magnetization direction the second ferromagnetic free layer 43 is aligned in the direction opposite to the $X_1$ direction in the figure.

Accordingly, the magnetization directions of the first and the second ferromagnetic free layers 42 and 43 adjacent to each other with the nonmagnetic interlayer 44 provided therebetween are antiparallel to each other, and the first and the second ferromagnetic free layers 42 and 43 are coupled antiferromagnetically with each other.

In order to place the free magnetic layer 41 in a ferrimagnetic state, it is preferable that the magnetic moment by the magnetization of the first ferromagnetic free layer 42 be slightly different from that of the second ferromagnetic free layer 43.

In order to differ the moment of the first ferromagnetic free layer 42 from that of the second ferromagnetic free layer 43, in the case in which the first and the second ferromagnetic free layers 42 and 43 are composed of the same material, it is preferable that the $tf_1$ may slightly be different from the $tf_2$. In the embodiment, the $tf_1$ is set to be larger than the $tf_2$.

In the case in which a material forming the first ferromagnetic free layer 42 differs from that forming the second ferromagnetic free layer 43, when the saturation magnetizations of the first and the second ferromagnetic free layers 42 and 43 are represented by $Mf_1$ and $Mf_2$, respectively, and the magnetic thicknesses of the first and the second ferromagnetic free layers 42 and 43 are represented by $Mf_1 \cdot tf_1$ and $Mf_2 \cdot tf_2$, respectively, it is preferable that the $Mf_1 \cdot tf_1$ and the $Mf_2 \cdot tf_2$ slightly differ from each other.

Since the magnetization directions of the first and the second ferromagnetic free layers 42 and 43 are antiparallel to each other, the magnetic moments thereof counteract each other. However, since the $tf_1$ is set to be larger than the $tf_2$ in the free magnetic layer 41, the magnetization (magnetic moment) of the first ferromagnetic free layer slightly remains, the magnetization direction of the entire free magnetic layer 41 is aligned in the $X_1$ direction shown in the figure.

As described above, since the first and the second ferromagnetic free layers 42 and 43 are coupled antiferromagnetically with each other, and the magnetization of the first ferromagnetic free layer 42 remains, the free magnetic layer 41 is placed in a synthetic ferrimagnetic state (synthetic ferri free).

In the free magnetic layer 41 in the ferrimagnetic state as described above, the magnetization direction thereof can be rotated by application of a minute external magnetic field in accordance with the direction thereof.

The free magnetic layer 41 shown in FIGS. 1 and 2 is composed of two ferromagnetic layers, i.e., the first and the second ferromagnetic free layers 42 and 43; however, the present invention is not limited thereto. The free magnetic layer 41 may be composed of an even number of ferromagnetic layers, i.e., at least 2L ferromagnetic layers, in which the L is an integer of not less than 1. In the case described above, it is preferable that a nonmagnetic interlayer be provided at each location between the ferromagnetic layers adjacent to each other, the magnetization directions of the adjacent ferromagnetic layers be antiparallel to each other, and the entire free magnetic layer 41 be in a ferrimagnetic state. In order to prevent shunting of the sensing current, the L is preferably set to be 1 as described in this embodiment.

In addition, the first and the second ferromagnetic free layers 42 and 43 may be formed of laminates each composed of a diffusion-blocking layer and a ferromagnetic base layer. In the case mentioned above, the individual diffusion blocking layers are preferably in contact with the first and the second nonmagnetic conductive layers, respectively, and the individual ferromagnetic base layers are preferably in contact with the nonmagnetic interlayer. In this case, the diffusion-blocking layer is preferably composed of cobalt (Co), and the first and the second ferromagnetic base layers are preferably composed of a Ni—Fe alloy.

By forming the diffusion-blocking layers, diffusions are prevented between the first nonmagnetic conductive layer 31 and the first ferromagnetic base layer and between the second nonmagnetic conductive layer 32 and the second ferromagnetic base layer, and as a result, disorders of the interfaces are prevented, which are between the first nonmagnetic conductive layer 31 and the first ferromagnetic free layer 42 and between the second conductive layer 32 and the second ferromagnetic free layer 43.

The first and the second nonmagnetic conductive layers 31 and 32 are layers in which the ferromagnetic interlayer couplings of the free magnetic layer 41 with the first and the second fixed magnetic layers 21 and 51 are reduced, and the sensing currents primarily flow therein. Accordingly, the first and the second nonmagnetic conductive layers 31 and 32 are preferably composed of a nonmagnetic conductive material, such as Cu, Cr, Au, or Ag, and more preferably, are composed of Cu.

The first fixed magnetic layer 21 is composed of a first pinned ferromagnetic layer 22, i.e., ferromagnetic layer, and a second pinned ferromagnetic layer 23, i.e., ferromagnetic layer, with a first nonmagnetic layer 24, i.e., nonmagnetic layer, provided therebetween. The first pinned ferromagnetic layer 22 is provided at a location closer to the first antiferromagnetic layer 71 than the first nonmagnetic layer 24 so as to be in contact with the first antiferromagnetic layer 71, and the second pinned ferromagnetic layer 23 is provided at a location closer to the first nonmagnetic conductive layer 31 than the first nonmagnetic layer 24 so as to be in contact with the first nonmagnetic conductive layer 31.

The first and the second pinned ferromagnetic layers 22 and 23 are formed of a Ni—Fe alloy, Co, a Co—Ni—Fe alloy, a Co—Fe alloy, a Co—Ni alloy, or the like and are preferably composed of Co. In addition, the first and the second pinned ferromagnetic layers 22 and 23 are preferably composed of the same material. The first nonmagnetic layer 24 is preferably composed of one of Ru, Rh, Ir, Cr, Re, Cu, and an alloy thereof, and more preferably, is composed of Ru.

The thickness $tp_1$ of the first pinned ferromagnetic layer 22 is preferably 1 to 3 nm, and the thickness $tp_2$ of the second pinned ferromagnetic layer 23 is preferably 1 to 3 nm and is preferably larger than that of the first pinned ferromagnetic layer.

The thickness of the first nonmagnetic layer 24 is preferably 0.3 to 1.2 nm.

The magnetization direction of the first pinned ferromagnetic layer 22 is fixed in the Y direction shown in the figure by the exchange coupling magnetic field with the first antiferromagnetic layer 71, and the second pinned ferromagnetic layer 23 is coupled antiferromagnetically with the first pinned ferromagnetic layer 22, so that the magnetization direction of the second pinned ferromagnetic layer 23 is fixed in the direction opposite to the Y direction shown in the figure.

Consequently, the magnetization directions of the first pinned ferromagnetic layer 22 and the second pinned ferromagnetic layer 23 are set to be antiparallel to each other, and the first and the second pinned ferromagnetic layers 22 and 23 are coupled antiferromagnetically with each other.

In order to place the first fixed magnetic layer 21 in a ferrimagnetic state, the magnetic moments by the magnetizations of the first and the second pinned ferromagnetic layers 22 and 23 preferably differ from each other, and for the purpose thereof, when the first and the second pinned ferromagnetic layers 22 and 23 are composed of the same material, it is preferable that the $tp_1$ slightly differ from the $tp_2$. In the embodiment, the $tp_2$ is set to be larger than the $tp_1$.

In contrast, in the case in which the first pinned ferromagnetic layers 22 is composed of a material differing from that of the second pinned ferromagnetic layer 23, when the saturation magnetizations of the first and the second ferromagnetic pined layers 22 and 23 are represented by $Mp_1$ and $Mp_2$, respectively, and the magnetic thicknesses thereof are represented by $Mp_1 \cdot tp_1$ and $Mp_2 \cdot tp_2$, respectively, it is preferable that the $Mp_1 \cdot tp_1$ and the $Mp_2 \cdot tp_2$ slightly differ from each other.

Since the magnetization directions of the first and the second pinned ferromagnetic layers 22 and 23 are antiparallel to each other, the magnetic moments thereof counteract each other. However, since the $tp_2$ is set to be larger than the $tp_1$ in the first fixed magnetic layer 21, the magnetization (magnetic moment) of the second pinned ferromagnetic layer 23 slightly remains. The remaining magnetization is further increased by the exchange coupling magnetic field with the first antiferromagnetic layer 71, and the magnetization direction of the entire first fixed magnetic layer 21 is fixed in the direction opposite to the Y direction shown in the figure, whereby the direction thereof crosses the magnetization direction of the free magnetic layer 41.

As described above, since the first pinned ferromagnetic layer 22 is coupled antiferromagnetically with the second pinned ferromagnetic layer 23, and the magnetization of the second pinned ferromagnetic layer 23 remains, the first fixed magnetic layer 21 is in a synthetic ferrimagnetic state (synthetic ferri pinned).

In this embodiment, the first fixed magnetic layer 21 is composed of two ferromagnetic layers, i.e., the first and the second pinned ferromagnetic layers 22 and 23; however the present invention is not limited thereto. The first fixed magnetic layer 21 may be composed of an even number of ferromagnetic layers, i.e., at least 2M ferromagnetic layers, in which the M is an integer of not less than 1. In the case described above, it is preferable that a nonmagnetic layer be provided at each location between the ferromagnetic layers, the magnetization directions of the adjacent ferromagnetic layers be antiparallel to each other, and the entire first fixed magnetic layer 21 be in a ferrimagnetic state. In order to prevent shunting of the sensing current, the M is preferably set to be 1 as described in this embodiment.

The second fixed magnetic layer 51 is composed of a third pinned ferromagnetic layer 52, i.e., ferromagnetic layer, and a fourth pinned ferromagnetic layer 53, i.e., ferromagnetic layer, with a second nonmagnetic layer 54, i.e., nonmagnetic layer, provided therebetween. The third pinned ferromagnetic layer 52 is provided at a location closer to the second nonmagnetic conductive layer 32 than the second nonmagnetic layer 54 so as to be in contact with the second nonmagnetic conductive layer 32, and the fourth pinned ferromagnetic layer 53 is provided at a location closer to the second antiferromagnetic layer 72 than the second nonmagnetic layer 54 so as to be in contact with the second antiferromagnetic layer 72.

The third and the fourth pinned ferromagnetic layers 52 and 53 are formed of a Ni—Fe alloy, Co, a Co—Ni—Fe alloy, a Co—Fe alloy, a Co—Ni alloy, or the like and, in particular, are preferably composed of Co. In addition, the third and the fourth pinned ferromagnetic layers 52 and 53 are preferably composed of the same material. The second nonmagnetic layer 54 is preferably composed of one of Ru, Rh, Ir, Cr, Re, Cu, and an alloy thereof and in particular, is preferably composed of Ru.

The thickness $tp_3$ of the third pinned ferromagnetic layer 52 is preferably 1 to 3 nm, and the thickness $tp_4$ of the fourth pinned ferromagnetic layer 53 is preferably 1 to 3 nm and is preferably larger than that of the third pinned ferromagnetic layer 52.

The thickness of the second nonmagnetic layer 54 is preferably 0.3 to 1.2 nm.

The magnetization direction of the fourth pinned ferromagnetic layer 53 is fixed in the direction opposite to the Y direction shown in the figure by the exchange coupling magnetic field with the second antiferromagnetic layer 72, and the third pinned ferromagnetic layer 52 is coupled antiferromagnetically with the fourth pinned ferromagnetic layer 53, so that the magnetization direction of the third pinned ferromagnetic layer 52 is fixed in the Y direction shown in the figure.

Consequently, the magnetization directions of the third and the fourth pinned ferromagnetic layers 52 and 53 are set to be antiparallel to each other, and the third and the fourth pinned ferromagnetic layers 52 and 53 are coupled antiferromagnetically with each other.

In order to place the second fixed magnetic layer 51 in a ferrimagnetic state, it is preferable that the magnetic moments by the magnetizations of the third and the fourth pinned ferromagnetic layers 52 and 53 slightly differ from each other, and for the purpose thereof, when the third and the fourth pinned ferromagnetic layers 52 and 53 are composed of the same material, it is preferable that the $tp_3$ slightly differ from the $tp_4$. In the embodiment, the $tp_4$ is set to be larger than the $tp_3$.

In contrast, in the case in which the third pinned ferromagnetic layer 52 is composed of a material differing from that of the fourth pinned ferromagnetic layer 53, when the saturation magnetizations of the third and the fourth ferromagnetic pined layers 52 and 53 are represented by $Mp_3$ and $Mp_4$, respectively, and the magnetic thicknesses thereof are represented by $Mp_3 \cdot tp_3$ and $Mp_4 \cdot tp_4$, respectively, it is preferable that the $Mp_3 \cdot tp_3$ slightly differ from the $Mp_4 \cdot tp_4$.

Since the magnetization directions of the third and the fourth pinned ferromagnetic layers 52 and 53 are antiparallel to each other, the magnetic moments thereof counteract each other. However, since the $tp_4$ is set to be larger than the $tp_3$ in the second fixed magnetic layer 51, the magnetization (magnetic moment) of the fourth pinned ferromagnetic layer 53 slightly remains. The remaining magnetization is further increased by the exchange coupling magnetic field with the second antiferromagnetic layer 72, and the magnetization direction of the entire second fixed magnetic layer 51 is fixed in the direction opposite to the Y direction shown in the figure and is parallel to the magnetization direction of the first fixed magnetic layer 21.

As described above, since the third pinned ferromagnetic layer 52 is antiferromagnetically coupled with the fourth pinned ferromagnetic layer 53, and the magnetization of the third pinned ferromagnetic layer 53 remains, the second fixed magnetic layer 51 is in a synthetic ferrimagnetic state (synthetic ferri pinned).

In this embodiment, the second fixed magnetic layer 51 is composed of two ferromagnetic layers, i.e., the third and the fourth pinned ferromagnetic layers 52 and 53; however the present invention is not limited thereto. The second fixed magnetic layer 51 may be composed of an even number of ferromagnetic layers, i.e., at least 2N ferromagnetic layers, in which the N is an integer of not less than 1. In the case described above, it is preferable that a nonmagnetic layer is provided at each location between the ferromagnetic layers adjacent to each other, the magnetization directions of the adjacent ferromagnetic layers be antiparallel to each other, and the entire second fixed magnetic layer 51 be in a ferrimagnetic state. In order to prevent shunting of the sensing current, the N is preferably set to be 1 as described in this embodiment.

When the first and the second fixed magnetic layers 21 and 51 and the free magnetic layer 41 are formed as described above, as shown in FIGS. 1 and 2, the individual magnetization directions of the first and the second fixed magnetic layer 21 and 51 cross that of the free magnetic layer 41, and the magnetization directions of the first and the second fixed magnetic layers 21 and 51 are parallel to each other.

In particular, since the thickness $tp_2$ of the second pinned ferromagnetic layer 23 is formed so as to be larger than that of the first pinned ferromagnetic layer 22, and the thickness $tp_4$ of the fourth pinned ferromagnetic layer 53 is formed so as to be larger than that of the third pinned ferromagnetic layer 52, the magnetization direction, i.e., the direction opposite to the Y direction in the figure, of the second pinned ferromagnetic layer 23 and the magnetization direction, i.e., the Y direction in the figure, of the third pinned ferromagnetic layer 52 are antiparallel to each other. The second pinned ferromagnetic layer 23 is the layer closest to the free magnetic layers 41 among the ferromagnetic layers forming the first fixed magnetic layer 21, and the third pinned ferromagnetic layer 52 is the layer closest to the free magnetic layer 41 among the ferromagnetic layers forming the second fixed magnetic 51.

In FIG. 5, the magnetic moments of the second pinned ferromagnetic layer 23, the first ferromagnetic free layer 42, the second ferromagnetic free layer 43, and the third pinned ferromagnetic layer 52 are indicated by arrows.

Reference numeral $Hp_1$ indicates the magnetic moment by the magnetization of the second pinned ferromagnetic layer 23, and reference numeral $Hp_2$ indicates the magnetic moment by the magnetization of the third pinned ferromagnetic layer 52. The direction of the $Hp_1$ is the direction opposite to the Y direction in the figure, and the direction of the $Hp_2$ is the Y direction in the figure.

In addition, reference numeral $Hf_1$ indicates the magnetic moment by the magnetization of the first ferromagnetic free layer 42, and reference numeral $Hf_2$ indicates the magnetic moment by the magnetization of the second ferromagnetic free layer 43. The direction of the $Hf_1$ is the $X_1$ direction in the figure, and the direction of the $Hf_2$ is the direction opposite to the $X_1$ direction in the figure.

Even though not shown, the first nonmagnetic conductive layer 31 is provided between the second pinned ferromagnetic layer 23 and the first ferromagnetic free layer 42, the second nonmagnetic conductive layer 32 is provided between the third pinned ferromagnetic layer 52 and the second ferromagnetic free layer 43, and the nonmagnetic interlayer 44 is provided between the first and the second ferromagnetic free layers 42 and 43.

The second pinned ferromagnetic layer 23 performs ferromagnetic interlayer coupling with the first ferromagnetic free layer 42 via the first nonmagnetic conductive layer 31, and magnetic field moment $Hb_1$ is generated by this ferromagnetic interlayer coupling magnetic field. The direction of the magnetic field moment $Hb_1$ is parallel to the magnetization direction of the second pinned ferromagnetic layer 23 and is in the direction opposite to the Y direction in the figure.

The third pinned ferromagnetic layer 52 performs ferromagnetic interlayer coupling with the second ferromagnetic free layer 43 via the second nonmagnetic conductive layer 32, and magnetic field moment $Hb_2$ is generated by this ferromagnetic interlayer coupling magnetic field. The direction of the magnetic field moment $Hb_2$ is parallel to the magnetization direction of the third pinned ferromagnetic layer 52 and is in the Y direction in the figure. Accordingly, the directions of the magnetic field moments $Hb_1$ and $Hb_2$ are antiparallel to each other.

Consequently, since the magnetic field moments $Hb_1$ and $Hb_2$ counteract each other, which are applied to the free magnetic layer 41, the direction of the magnetization of the entire free magnetic layer 41, which is the synthetic magnetization of the $Hf_1$ and $Hf_2$, is not inclined by the ferromagnetic interlayer coupling magnetic fields of the first and the second fixed magnetic layers 21 and 51 and is aligned in the $X_1$ direction shown in the figure by the bias layers 18 and 18.

As magnetic field applied to the free magnetic layer 41, in addition to the bias magnetic fields by the bias layer 18 and 18, the magnetic moments $Hb_1$ and $Hb_2$ of the magnetic fields of the ferromagnetic interlayer coupling described above are mentioned. However, according to the spin valve thin-film magnetic device 11, since the sum of the magnetic fields described above can be zero, the magnetization direction of the free magnetic layer 41 is not inclined by the magnetic moments described above, and the asymmetry of the spin valve thin-film magnetic device 11 can be reduced.

Next, a method for manufacturing the spin valve thin-film magnetic device 11 described above will be described.

Figure 6:
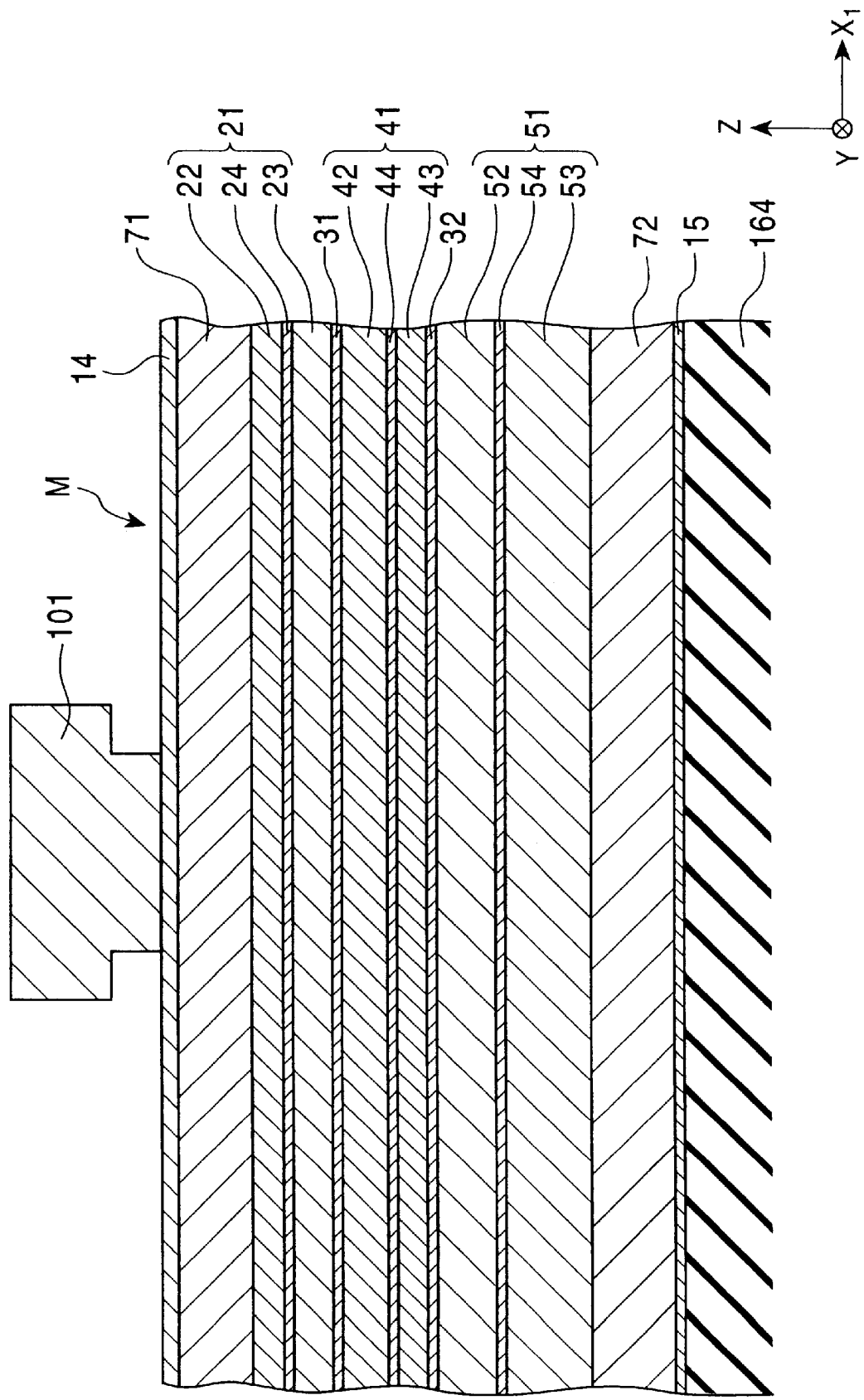
FIG. 6 is a view illustrating a manufacturing step for the spin valve thin-film magnetic device shown in FIG. 1.

As shown in FIG. 6, on the lower insulating layer 164, a laminate M is formed in which the underlying layer 15, the second antiferromagnetic layer 72, the second fixed magnetic layer 51, the second nonmagnetic conductive layer 32, the free magnetic layer 41, the first nonmagnetic conductive layer 31, the first fixed magnetic layer 21, the first antiferromagnetic layer 71, and the cap layer 14 are sequentially formed by sputtering, deposition, or the like. Subsequently, a lift-off resist 101 is formed on the laminate M.

The first fixed magnetic layer 21 is a laminate formed of the first pinned ferromagnetic layer 22, the first nonmagnetic layer 24, and the second pinned ferromagnetic layer 23, in that order.

The free magnetic layer 41 is a laminate formed of the first ferromagnetic free layer 42, the nonmagnetic interlayer 44, and the second ferromagnetic free layer 43, in that order.

The second fixed magnetic layer 51 is a laminate formed of the third pinned ferromagnetic layer 52, the second nonmagnetic layer 54, and the fourth pinned ferromagnetic layer 53, in that order.

As shown in FIG. 6, the second pinned ferromagnetic layer 23 is formed so as to be thicker than the first pinned ferromagnetic layer 22, the first ferromagnetic free layer 42 is formed so as to be thicker than the second ferromagnetic free layer 43, and the fourth pinned ferromagnetic layer 53 is formed so as to be thicker than the third pinned ferromagnetic layer 52.

Figure 7:
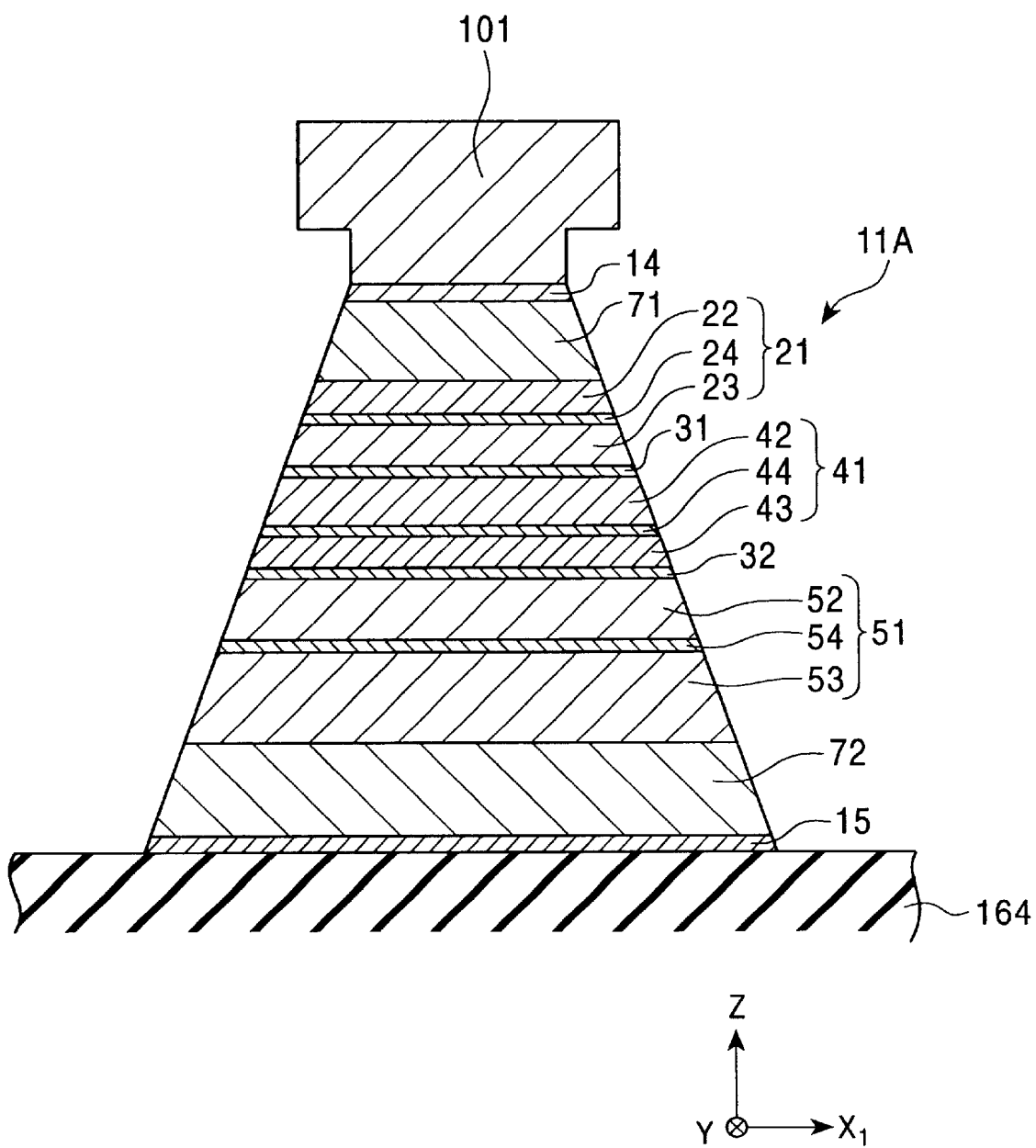
FIG. 7 is a view illustrating a manufacturing step for the spin valve thin-film magnetic device shown in FIG. 1.

Next, as shown in FIG. 7, parts of the laminate M, which are not covered by the lift-off resist 101, are removed by ion milling to form inclined surfaces so as to form the laminate 11A in the form of a regular trapezoid.

Figure 8:
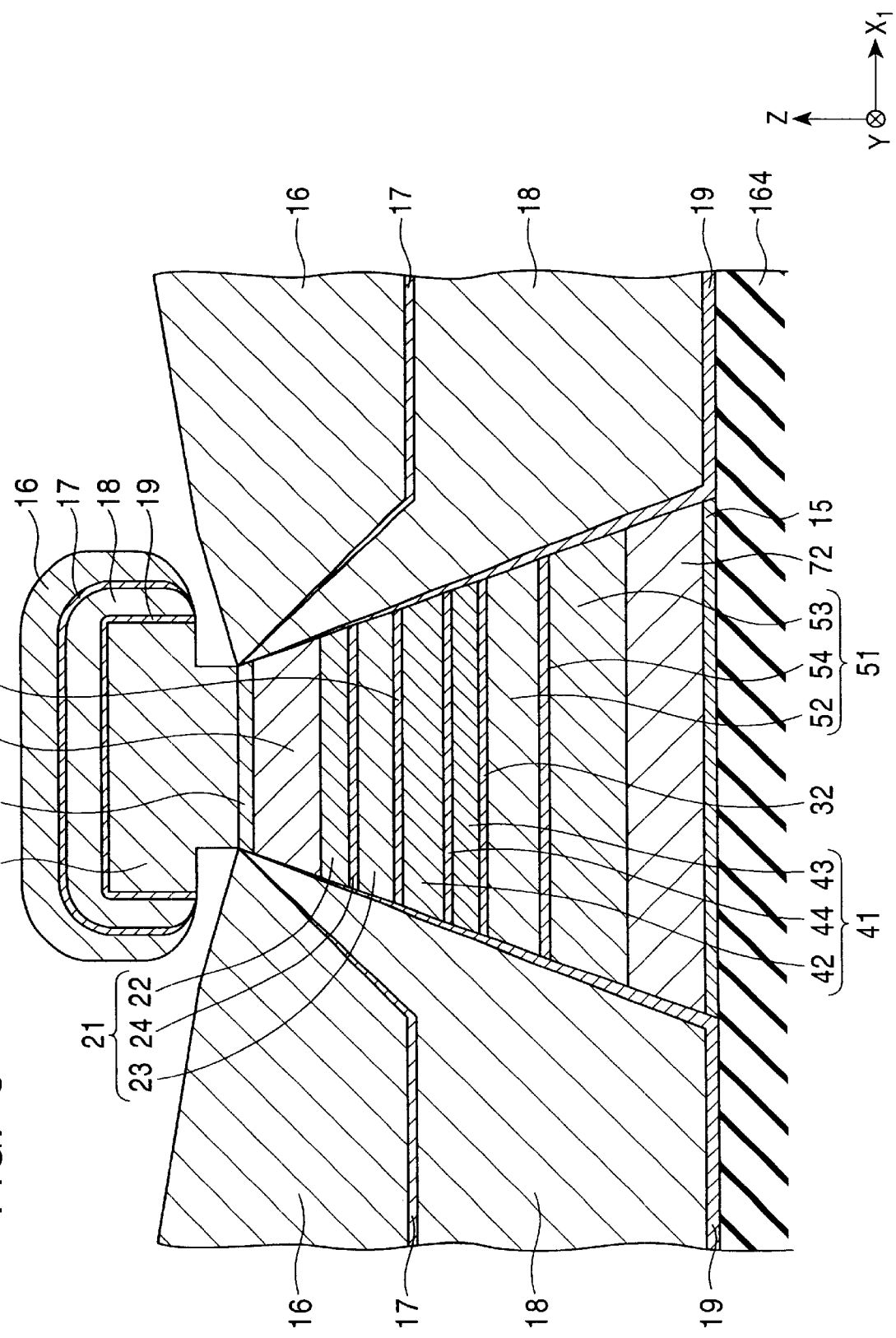
FIG. 8 is a view illustrating a manufacturing method step for the spin valve thin-film magnetic device shown in FIG. 1.

Next, as shown in FIG. 8, on the lift-off resist and on each side of the laminate 11A, the bias underlying layer 19, the bias layer 18, the interlayer 17, and the conductive layer 16 are sequentially formed.

Figure 9:
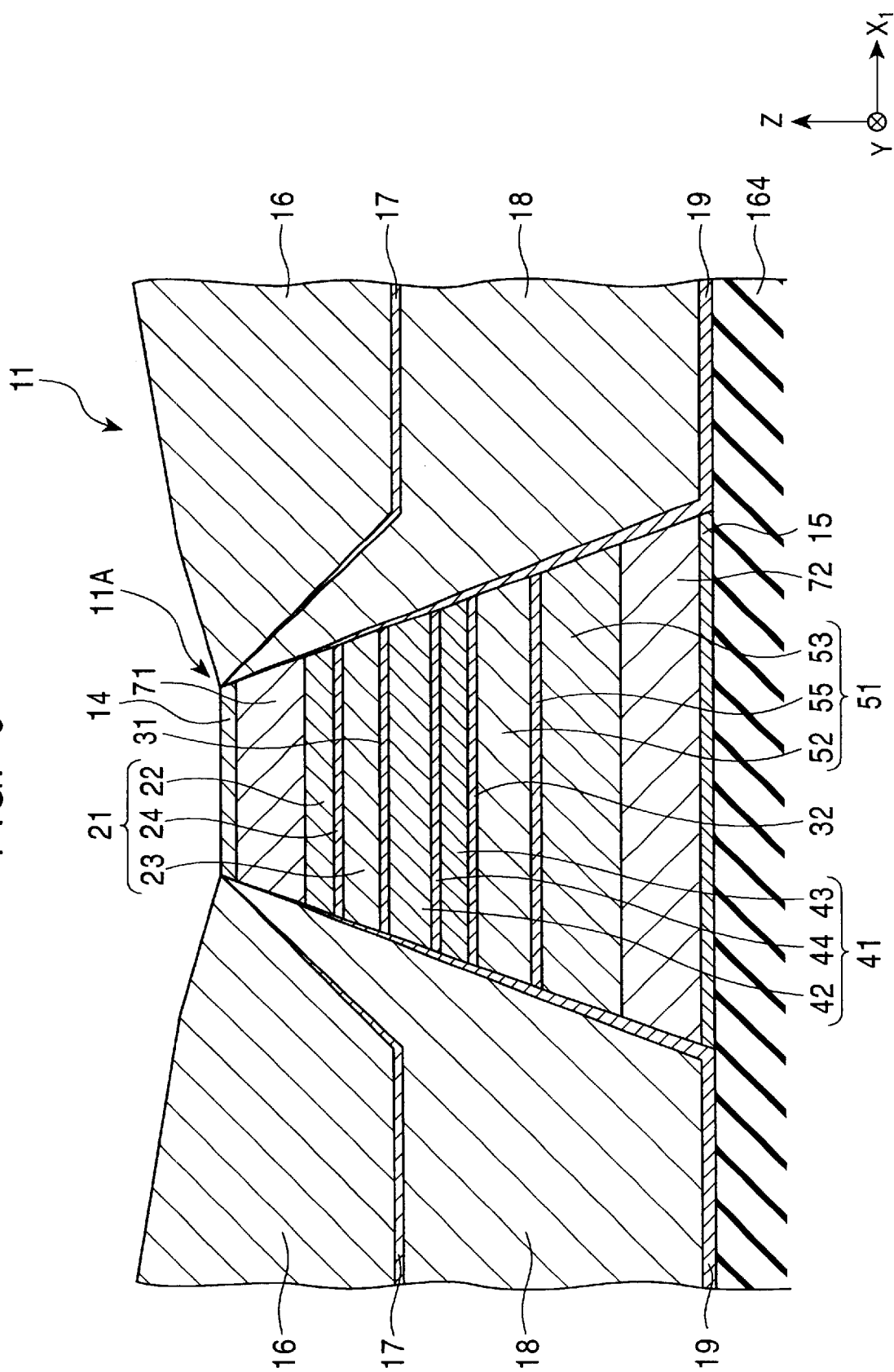
FIG. 9 is a view illustrating a manufacturing method step for the spin valve thin-film magnetic device shown in FIG. 1.

Next, as shown in FIG. 9, the lift-off resist 101 is removed. As described above, the spin valve thin-film magnetic device 11 is formed.

Subsequently, the first and the second antiferromagnetic layer 71 and 72 of the spin valve thin-film magnetic device 11 are processed by a heat treatment in a magnetic field, and exchange coupling magnetic fields are generated at the interfaces between the first antiferromagnetic layer 71 and the first fixed magnetic layer 21 and between the second antiferromagnetic layer 72 and the second fixed magnetic layer 51.

Figure 10:
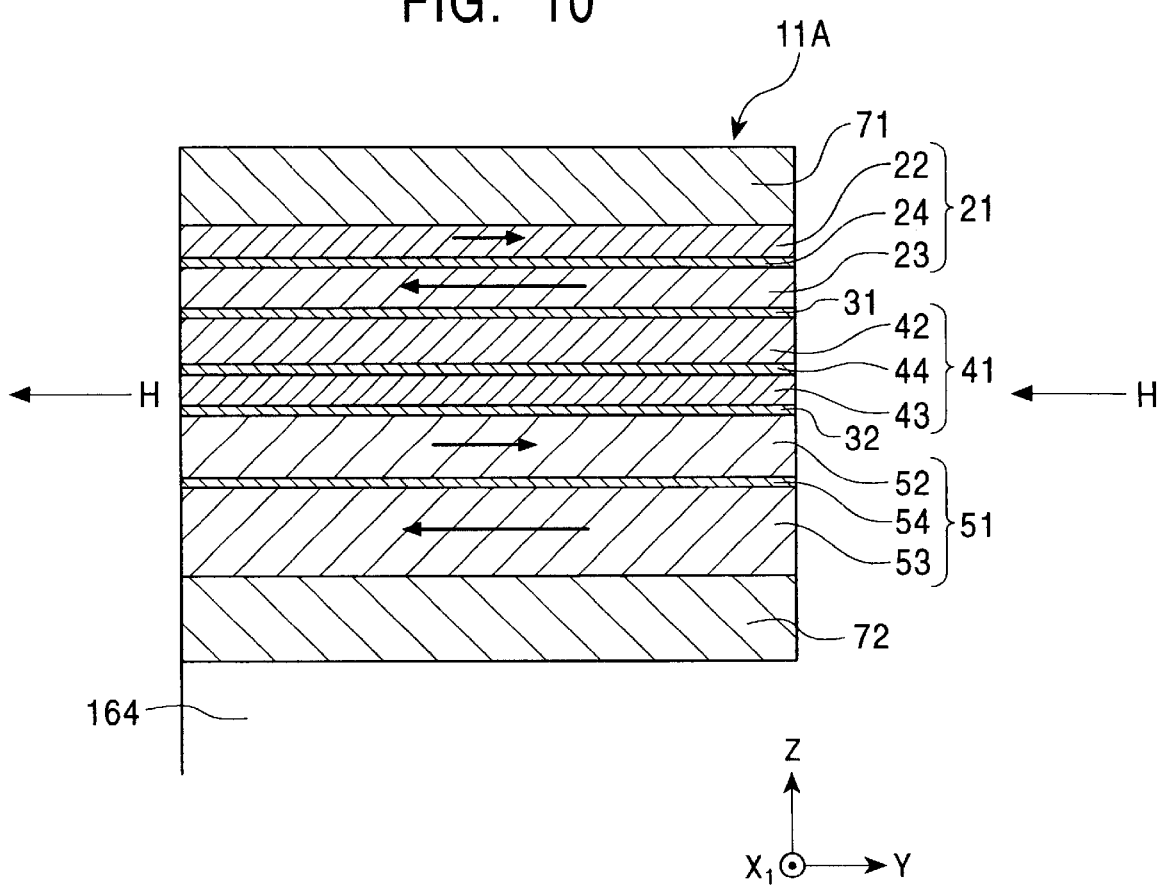
FIG. 10 is a view illustrating a manufacturing method step for the spin valve thin-film magnetic device shown in FIG. 1.

FIG. 10 is a cross-sectional view of the spin valve thin-film magnetic device 11 shown in FIG. 9, which is observed from the track width direction.

As shown in FIG. 10, the spin valve thin-film magnetic device 11 is processed by a heat treatment while an external magnetic field H is applied thereto toward the direction opposite to the Y direction shown in the figure. In the step described above, the external magnetic field H is preferably smaller than a magnetic field (hereinafter referred to as "spin flop magnetic field") at which the pinned ferromagnetic layer 22 and 23, which form the first fixed magnetic layer 21, and the pinned ferromagnetic layer 52 and 53, which form the second fixed magnetic layer 51, perform spin flop transformation.

The spin flop magnetic field is the strength of an external magnetic field at which, when an external magnetic field is applied to two magnetic layers in which the magnetization directions thereof are antiparallel to each other, the magnetization directions thereof becomes not antiparallel to each other.

Figure 11:
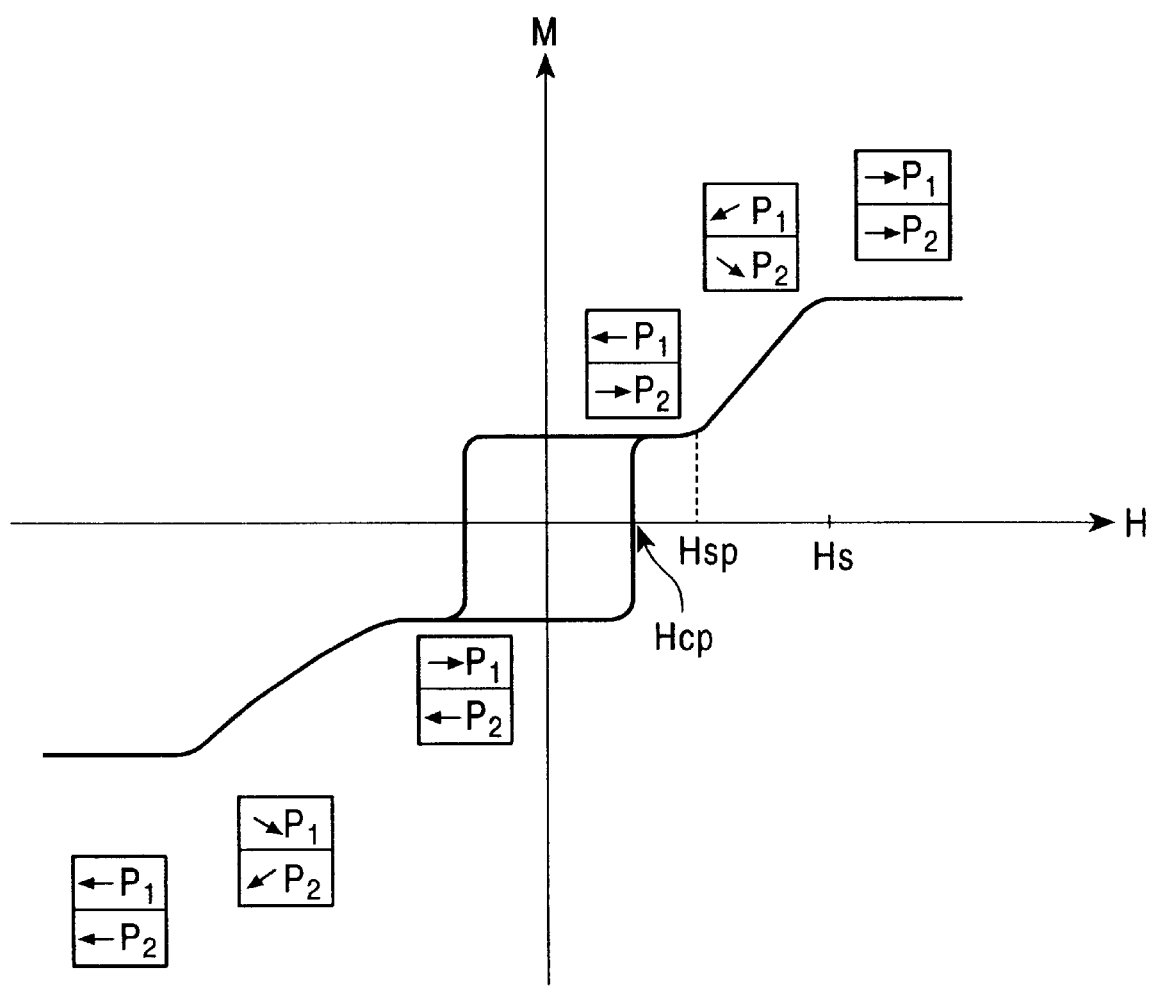
FIG. 11 is a graph showing the curve of the relationship between M and H in a fixed magnetic layer.

FIG. 11 is a graph showing the curve of the relationship between M and H for illustrating the spin flop magnetic field. The curve of the relationship between M and H shows an example of the change in magnetization M of the first fixed magnetic layer 21 when an external magnetic field H is applied to the first fixed magnetic layer 21 shown in FIG. 1.

In FIG. 11, the arrow indicated by $P_1$ shows the magnetization direction of the first pinned ferromagnetic layer 22, and the arrow indicated by $P_2$ shows the magnetization direction of the second pinned ferromagnetic layer 23.

As shown in FIG. 11, when the external magnetic field H is small, the first and the second pinned ferromagnetic layers 22 and 23 are in an antiferromagnetically coupling state, i.e., the direction of the arrow $P_1$ and the direction of the arrow $P_2$ are antiparallel to each other. However, when the external magnetic field H exceeds a predetermined value, the antiferromagnetically coupling state of the first and the second pinned ferromagnetic layers 22 and 23 is destroyed, and the ferrimagnetic state cannot be maintained. The phenomenon described above is the spin flop transformation. In addition, an external magnetic field at which the spin flop transformation occurs is a spin flop magnetic field, and in FIG. 11, the spin flop magnetic field is represented by Hsp.

In the figure, the coercive force of the first fixed magnetic layer 21 is represented by Hcp, and the saturation magnetization thereof is represented by Hs.

Accordingly, as shown in FIG. 10, when the external magnetic field H, which is smaller than the spin flop magnetic field, is applied to the spin valve thin-film magnetic device 11 in the direction from the height side to the opposing face 152 opposing a medium, i.e., the direction opposite to the Y direction in the figure, the magnetization directions of the second and the fourth pinned ferromagnetic layers 23 and 53 are in the same direction as that of the external magnetic field H, i.e., the direction opposite to the Y direction in the figure, and the magnetization directions of the first and the third pinned ferromagnetic layers 22 and 52 are in the direction opposite to those of the second and the fourth pinned ferromagnetic layers 23 and 53, i.e., the Y direction in the figure.

The reason the magnetization directions of the second and the fourth pinned ferromagnetic layers 23 and 53 are in the same direction as that of the external magnetic field H is, since the thicknesses of the second and the fourth pinned ferromagnetic layers 23 and 53 are larger than those of the first and the third ferromagnetic layers 22 and 52, the external magnetic filed H acts on the second and the fourth ferromagnetic layers 23 and 53 more easily than the first and the third ferromagnetic layers 22 and 52.

The external magnetic field H is preferably smaller than the spin flop magnetic fields of the first and the second fixed magnetic layers 21 and 22 and, in particular, is preferably $8.0 \times 10^4$ A/m or less.

The heat treatment is preferably performed at 473 to 573 K for 60 to 600 minutes in a vacuum or an inert gas atmosphere.

When the heat treatment is performed as described above, the crystalline structures of the first and the second antiferromagnetic layers 71 and 72 are regulated, and exchange coupling magnetic fields appear at the interfaces between the first antiferromagnetic layer 71 and the first fixed magnetic layer 21 and between the second antiferromagnetic layer 72 and the second fixed magnetic layer 51.

Figure 12:
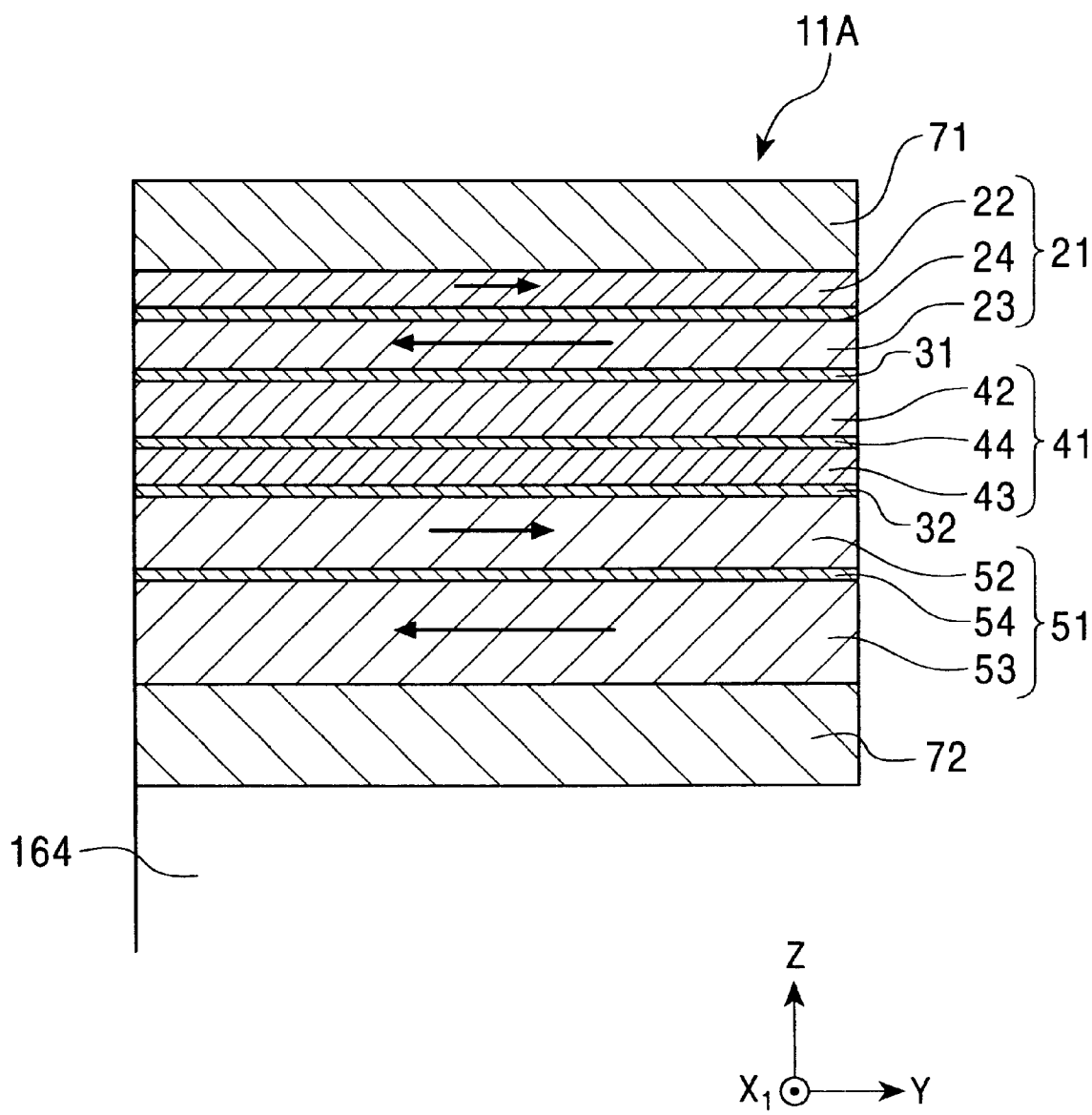
FIG. 12 is a view illustrating a manufacturing method step for the spin valve thin-film magnetic device shown in FIG. 1.

The external magnetic field is removed after the heat treatment is complete. When the external magnetic field H is removed, as shown in FIG. 12, the magnetization directions of the second and the fourth pinned ferromagnetic layers 23 and 53 are in the direction opposite to the Y direction in the figure, and the magnetization directions of the first and the third pinned ferromagnetic layers 22 and 52 are in the Y direction in the figure.

As described above, the first and the second pinned ferromagnetic layers 22 and 23 are coupled antiferromagnetically with each other, so that the first fixed magnetic layer 21 is in a ferrimagnetic state, and the magnetization direction of the entire first fixed magnetic layer 21 is in the direction opposite to the Y direction in the figure.

In a manner similar to the above, the third and the fourth pinned ferromagnetic layers 52 and 53 are coupled antiferromagnetically with each other, so that the second fixed magnetic layer 51 is in a ferrimagnetic state, and the magnetization direction of the entire first fixed magnetic layer 51 is in the Y direction in the figure.

The bias layers 18 and 18 are magnetized last so that a bias magnetic field appears, and the magnetization direction of the entire free magnetic layer 41 is aligned in the $X_1$ direction in the figure.

As described above, a spin valve thin-film magnetic device 11 as shown in FIGS. 1 and 2 can be obtained.

According to the spin valve thin-film magnetic device 11, since the magnetization directions of the second pinned ferromagnetic layer 23 and the third pinned ferromagnetic layers 52 are antiparallel to each other, the magnetic field moments $Hb_1$ and $Hb_2$ of the magnetic fields of the ferromagnetic interlayer coupling counteract each other, which appear by ferromagnetic interlayer coupling between the free magnetic layer 41 and the second and the third pinned ferromagnetic layers 22 and 52. Consequently, the magnetization direction of the entire free magnetic layer 41 is not inclined, and hence, the asymmetry can be reduced.

Embodiment 2

Next, the second embodiment of the present invention will be described with reference to the figures.

Figure 13:
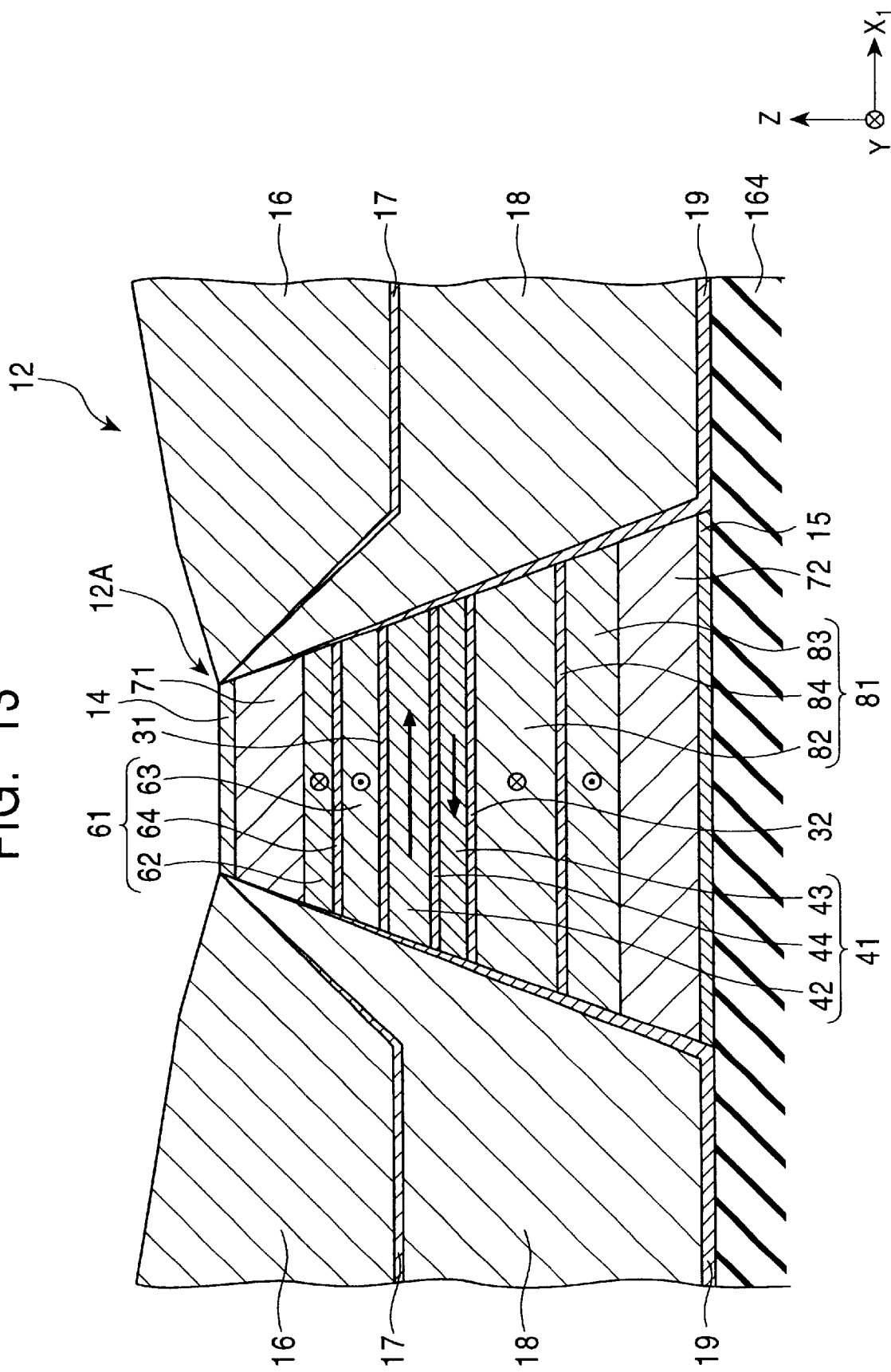
FIG. 13 is a schematic cross-sectional view of a spin valve thin-film magnetic device observed from a magnetic recording medium side, according to a second embodiment of the present invention.
Figure 14:
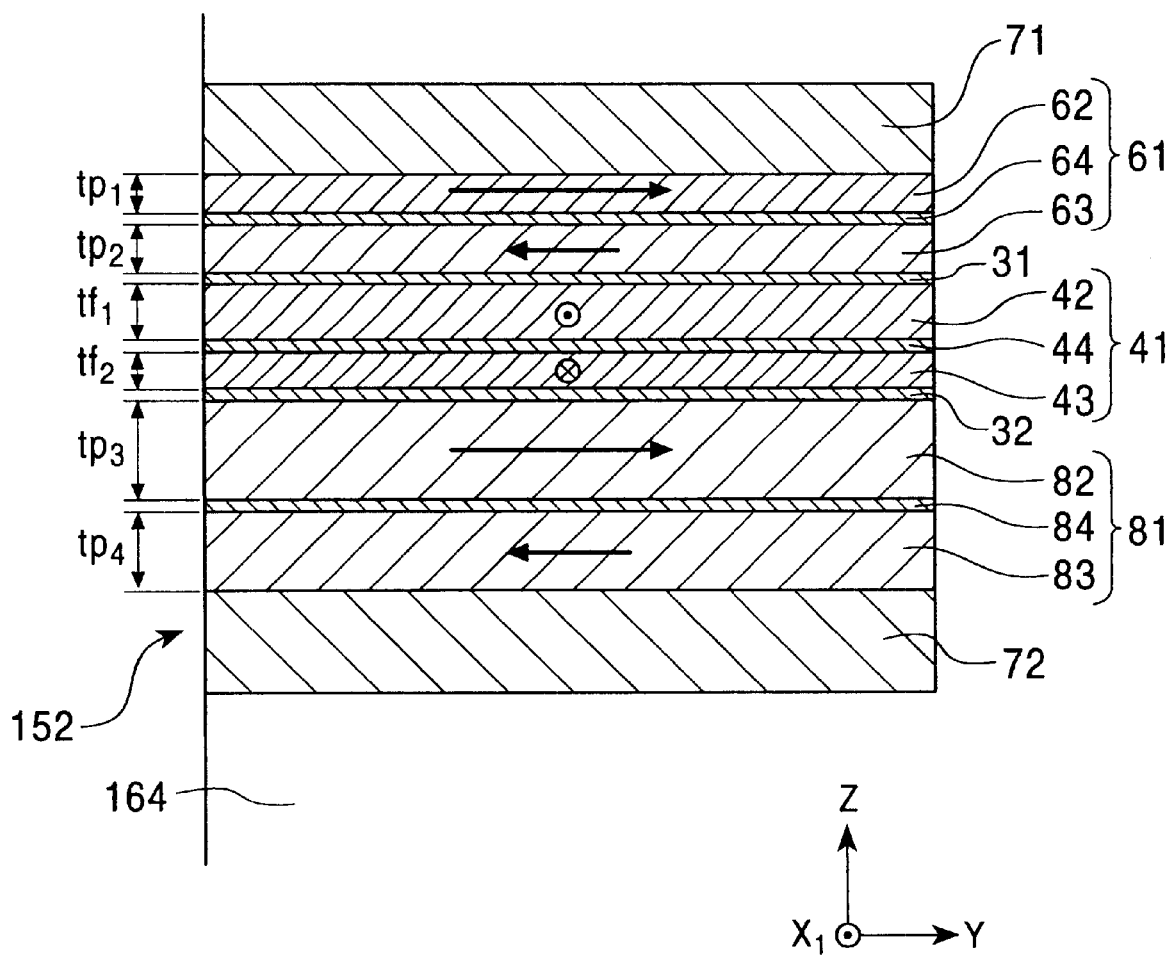
FIG. 14 is a schematic cross-sectional view of the spin valve thin-film magnetic device shown in FIG. 13 observed from a track width direction side.

FIG. 13 is a schematic cross-sectional view of a spin valve thin-film magnetic device 12 observed from the magnetic recording medium side, according to the second embodiment of the present invention, and FIG. 14 is a schematic cross-sectional view of the spin valve thin-film magnetic device 12 observed from the track width direction.

In a manner similar to the spin valve thin-film magnetic device 11 of the first embodiment, the spin valve thin-film magnetic device 12 shown in FIGS. 13 and 14 forms a thin-film magnetic head 1, and the thin-film magnetic head 1 forms a floating type magnetic head 150 together with an inductive head h.

The spin valve thin-film magnetic device 12 is a dual spin valve thin-film magnetic device in which, in a manner similar to the spin valve thin-film magnetic device 11 of the first embodiment, a nonmagnetic conductive layer, a fixed magnetic layer, and an antiferromagnetic layer are sequentially formed on each side of a free magnetic layer 41 in the thickness direction thereof.

That is, the spin valve thin-film magnetic device 12 is composed of a second antiferromagnetic layer 72, a second fixed magnetic layer 81, a second nonmagnetic conductive layer 32, the free magnetic layer 41, a first nonmagnetic conductive layer 31, a first fixed magnetic layer 61, a first antiferromagnetic layer 71, and a cap layer 14, which are sequentially formed on an underlying layer 15 formed on an lower insulating layer 164.

As described above, a laminate 12A having a cross-section in an approximately trapezoid is formed so as to have the width equivalent to the track width, in which individual layers are sequentially formed from the underlying layer 15 to the cap layer 14.

Points of the spin valve thin-film magnetic device 12 differing from the spin valve thin-film magnetic device 11 of the first embodiment described above are that the thicknesses of pinned ferromagnetic layers 62 and 63 forming the first fixed magnetic layer 61 and the thicknesses of pinned ferromagnetic layers 82 and 83 forming the second fixed magnetic layer 81 are opposite to those described in the first embodiment.

Since the following constituents shown in FIGS. 13 and 14 are equivalent to those described in the first embodiment in arrangement and in material, the descriptions thereof are omitted. That is, the first and the second antiferromagnetic layers 71 and 72, the first and the second nonmagnetic conductive layers 31 and 32, the free magnetic layer 41, i.e., first and the second ferromagnetic free layers 42 and 43, and nonmagnetic interlayer 44, conductive layers 16 and 16, interlayers 17 and 17, bias layers 18 and 18, and bias underlying layers 19 and 19 in the second embodiment are equivalent to the upper and the lower antiferromagnetic layers 71 and 72, the upper and the lower nonmagnetic conductive layers 31 and 32, the free magnetic layer 41, i.e., the first and the second ferromagnetic free layers 42 and 43 and the nonmagnetic interlayer 44, the conductive layers 16 and 16, the interlayers 17 and 17, the bias layers 18 and 18, and the bias underlying layers 19 and 19 described in the first embodiment, respectively.

The first fixed magnetic layer 61 is composed of the first pinned ferromagnetic layer 62, i.e., ferromagnetic layer, and the second pinned ferromagnetic layer 63, i.e., ferromagnetic layer, with a first nonmagnetic layer 64, i.e., nonmagnetic layer, provided therebetween. The first pinned ferromagnetic layer 62 is provided so as to be in contact with the first antiferromagnetic layer 71, and the second pinned ferromagnetic layer 63 is provided so as to be in contact with the first nonmagnetic conductive layer 31.

The first and the second pinned ferromagnetic layers 62 and 63 and the first nonmagnetic layer 64 are formed of materials equivalent to those of the first and the second pinned ferromagnetic layers 22 and 23 and the first nonmagnetic layer 24, respectively.

The thickness $tp_1$ of the first pinned ferromagnetic layer 62 is preferably 1 to 3 nm, and the thickness $tp_2$ of the second pinned ferromagnetic layer 63 is preferably 1 to 3 nm and is preferably smaller than that of the first pinned ferromagnetic layer 62.

In addition, the thickness of the first nonmagnetic layer 64 is preferably 0.3 to 1.2 nm.

The magnetization direction of the first pinned ferromagnetic layer 62 is fixed in the Y direction shown in the figure by an exchange coupling magnetic field with the first antiferromagnetic layer 71, and the second pinned ferromagnetic layer 63 is coupled antiferromagnetically with the first pinned ferromagnetic layer 62, so that the magnetization direction of the second pinned ferromagnetic layer 63 is fixed in the direction opposite to the Y direction shown in the figure.

Consequently, the magnetization directions of the first and the second pinned ferromagnetic layers 62 and 63 are set to be antiparallel to each other, and the first and the second pinned ferromagnetic layers 62 and 63 are coupled antiferromagnetically with each other.

In order to place the first fixed magnetic layer 61 in a ferrimagnetic state, it is preferable that the magnetic moments by the magnetizations of the first and the second pinned ferromagnetic layers 62 and 63 slightly differ from each other, and for the purpose thereof, when the first and the second pinned ferromagnetic layers 62 and 63 are composed of the same material, it is preferable that the $tp_1$ slightly differ from the $tp_2$. In this embodiment, the $tp_1$ is set to be larger than the $tp_2$.

In contrast, in the case in which the first pinned ferromagnetic layers 62 is composed of a material differing from that of the second pinned ferromagnetic layer 63, as is the case in the first embodiment, it is preferable that the $Mp_1 \cdot tp_1$ slightly differ from the $Mp_2 \cdot tp_2$.

Since the magnetization directions of the first and the second pinned ferromagnetic layers 62 and 63 are antiparallel to each other, the magnetic moments thereof counteract each other. However, since the $tp_1$ is set to be larger than the $tp_2$ in the first fixed magnetic layer 61, the magnetization (magnetic moment) of the first pinned ferromagnetic layer 62 slightly remains. The remaining magnetization is further increased by the exchange coupling magnetic field with the first antiferromagnetic layer 71, and the magnetization direction of the entire first fixed magnetic layer 61 is fixed in the Y direction shown in the figure so as to cross the magnetization direction of the free magnetic layer 41.

As described above, since the first pinned ferromagnetic layer 62 is coupled antiferromagnetically with the second pinned ferromagnetic layer 63, and the magnetization of the first pinned ferromagnetic layer 62 remains, the first fixed magnetic layer 61 is in a synthetic ferrimagnetic state.

In this embodiment, in a manner similar to the first embodiment, the first fixed magnetic layer 61 may be composed of an even number of ferromagnetic layers, i.e., at least 2M ferromagnetic layers, in which the M is an integer of 1 or more. In order to prevent shunting of sensing current, the M is preferably set to be 1.

The second fixed magnetic layer 81 is composed of the third pinned ferromagnetic layer 82, i.e., ferromagnetic layer, and the fourth pinned ferromagnetic layer 83, i.e., ferromagnetic layer, with a second nonmagnetic layer 84, i.e., nonmagnetic layer, provided therebetween. The third pinned ferromagnetic layer 82 is provided so as to be in contact with the second nonmagnetic conductive layer 32, and the fourth pinned ferromagnetic layer 83 is provided so as to be in contact with the second antiferromagnetic layer 72.

The third and the fourth pinned ferromagnetic layers 82 and 83, and the second nonmagnetic layer 84 are composed of materials equivalent to those of the third and the fourth pinned ferromagnetic layers 52 and 53, and the second nonmagnetic layer 54 in the first embodiment.

The thickness $tp_3$ of the third pinned ferromagnetic layer 82 is preferably 1 to 3 nm, and the thickness $tp_4$ of the fourth pinned layer 83 is preferably 1 to 3 nm and is preferably smaller than that of the third pinned ferromagnetic layer 82.

The thickness of the second nonmagnetic layer 84 is preferably 0.3 to 1.2 nm.

The magnetization direction of the fourth pinned ferromagnetic layer 83 is fixed in the direction opposite to the Y direction shown in the figure by the exchange coupling magnetic field with the second antiferromagnetic layer 72, and the third pinned ferromagnetic layer 82 is coupled antiferromagnetically with the fourth pinned ferromagnetic layer 83, so that the magnetization direction of the third pinned ferromagnetic layer 82 is fixed in the Y direction shown in the figure.

Consequently, the magnetization directions of the third and the fourth pinned ferromagnetic layers 82 and 83 are set to be antiparallel to each other, and the third and the fourth pinned ferromagnetic layers 82 and 83 are coupled antiferromagnetically with each other.

In order to place the second fixed magnetic layer 81 in a ferrimagnetic state, it is preferable that the magnetic moments by the magnetizations of the third and the fourth pinned ferromagnetic layers 82 and 83 slightly differ from each other, and for the purpose thereof, when the third and the fourth pinned ferromagnetic layers 82 and 83 are composed of the same material, it is preferable that the $tp_3$ slightly differ from the $tp_4$. In this embodiment, the $tp_3$ is set to be larger than the $tp_4$.

In contrast, in the case in which the third pinned ferromagnetic layers 82 is composed of a material differing from that of the fourth pinned ferromagnetic layer 83, it is preferable that the $Mp_3 \cdot tp_3$ slightly differ from the $Mp_4 \cdot tp_4$, as is the case in the first embodiment.

Since the magnetization directions of the third and the fourth pinned ferromagnetic layers 82 and 83 are antiparallel to each other, the magnetic moments thereof counteract each other. However, since the $tp_3$ is set to be larger than the $tp_4$ in the second fixed magnetic layer 81, the magnetization (magnetic moment) of the third pinned ferromagnetic layer 82 slightly remains. The remaining magnetization is further increased by the exchange coupling magnetic field with the second antiferromagnetic layer 72, and the magnetization direction of the entire second fixed magnetic layer 81 is fixed in the Y direction shown in the figure and is parallel to the magnetization direction of the first fixed magnetic layer 61.

As described above, since the third pinned ferromagnetic layer 82 is coupled antiferromagnetically with the fourth pinned ferromagnetic layer 83, and the magnetization of the third pinned ferromagnetic layer 83 remains, the second fixed magnetic layer 81 is in a synthetic ferrimagnetic state.

In this embodiment, as is the case in the first embodiment, the second fixed magnetic layer 81 may be composed of an even number of ferromagnetic layers, i.e., at least 2N ferromagnetic layers, in which the N is an integer of not less than 1. In order to prevent shunting of the sensing current, the N is preferably set to be 1.

In the spin valve thin-film magnetic device 12, as described above, since the thickness $tp_2$ of the second pinned ferromagnetic layer 63 is smaller than that of the first pinned ferromagnetic layer 62, and the thickness $tp_4$ of the fourth pinned ferromagnetic layer 83 is smaller than that of the third pinned ferromagnetic layer 82, the magnetization direction, i.e., the direction opposite to the Y direction in the figure, of the second pinned ferromagnetic layer 63, which is closest to the free magnetic layer 41 among the ferromagnetic layers forming the first fixed magnetic layer 61, and the magnetization direction, i.e., the Y direction in the figure, of the third pinned ferromagnetic layer 82, which is closest to the free magnetic layer 41 among the ferromagnetic layers forming the second fixed magnetic layer 81, are antiparallel to each other.

Consequently, in the spin valve thin-film magnetic device 12 described above, as is the case with the spin valve thin-film magnetic device 11 in the first embodiment, the direction of the magnetic field moment $Hb_1$ of the ferromagnetic exchange coupling magnetic field, which is imparted to the free magnetic layer 41 by ferromagnetic interlayer coupling of the second pinned ferromagnetic layer 63 and the first ferromagnetic free layer 42, and the direction of the magnetic field moment $Hb_2$ of the ferromagnetic exchange coupling magnetic field, which is imparted to the free magnetic layer 41 by ferromagnetic interlayer coupling of the third pinned ferromagnetic layer 82 and the second ferromagnetic free layer 43, are antiparallel to each other.

Accordingly, since the magnetic field moment $Hb_1$ and the magnetic field moment $Hb_2$ counteract each other in the free magnetic layer 41, the magnetization direction of the entire free magnetic layer 41 is not inclined by the ferromagnetic interlayer coupling magnetic field of the first and the second fixed magnetic layers 61 and 81 and is aligned in the track width direction by the bias layers 18 and 18.

The spin valve thin-film magnetic device 12 described above can be manufactured in a manner similar to the spin valve thin-film magnetic device 11 in the first embodiment except that the thickness of the second pinned ferromagnetic layer 63 is set to be smaller than that of the first pinned ferromagnetic layer 62, and the thickness of the fourth pinned ferromagnetic layer 83 is set to be smaller than that of the third pinned ferromagnetic layer 82.

According to the spin valve thin-film magnetic device 12 described above, effects can be obtained which are equivalent to those of the first embodiment.

As has thus been described in detail, in the spin valve thin-film magnetic device of the present invention, one of the pair of fixed magnetic layers is composed of 2L ferromagnetic layers, i.e., the even number of ferromagnetic layers, and the other fixed magnetic layer is composed of 2N ferromagnetic layers, i.e., the even number of ferromagnetic layers, in which the magnetization directions of the fixed magnetic layers are parallel to each other, and each magnetic direction of the ferromagnetic layer, which is closest to the free magnetic layer among the ferromagnetic layers forming each fixed magnetic layer, is simultaneously antiparallel to the other. Consequently, the magnetization direction of the free magnetic layer can be aligned in the direction perpendicular to those of the fixed magnetic layers.

Accordingly, in the spin valve thin-film magnetic device of the present invention, the magnetization direction of the free magnetic layer is unlikely to be influenced by the magnetizations of the fixed magnetic layers, and the asymmetry can be reduced.

The thin-film magnetic head according to the present invention is a thin-film magnetic capable of reading magnetically written information comprising the spin valve thin-film magnetic device described above, and the floating type magnetic head according to the present invention comprises the slider and the thin-film magnetic head described above provided therein.

Accordingly, since the thin-film magnetic head and the floating type magnetic head described above comprise the thin-film magnetic devices in which the asymmetry is small, the symmetric property of the wave shapes for reading is superior, and the rate of occurrence of errors in reading can be reduced.

In the method for manufacturing a spin valve thin-film magnetic device, according to the present invention, a laminate is formed of a fixed magnetic layer composed of at least 2M ferromagnetic layers, in which the M is an integer of 1 or more, with a nonmagnetic layer provided therebetween, a free magnetic layer composed of at least 2L ferromagnetic layers, in which the L is an integer of 1 or more, with a nonmagnetic interlayer provided therebetween, and the other fixed magnetic layer composed of at least 2N ferromagnetic layers, in which the N is an integer of 1 or more, with a nonmagnetic layer provided therebetween. In addition, in the method described above, the laminate thus obtained is processed by a heat treatment, while an external magnetic field is applied which is smaller than a magnetic field at which the ferromagnetic layers forming the fixed magnetic layer and the other fixed magnetic layer, so as to appear exchange coupling magnetic fields between the antiferromagnetic layer and the fixed magnetic layer and between the other antiferromagnetic layer and the other fixed magnetic layer, whereby a spin valve thin-film magnetic device having the structure described above can be easily manufactured.

Embodiment 3

Figure 15:
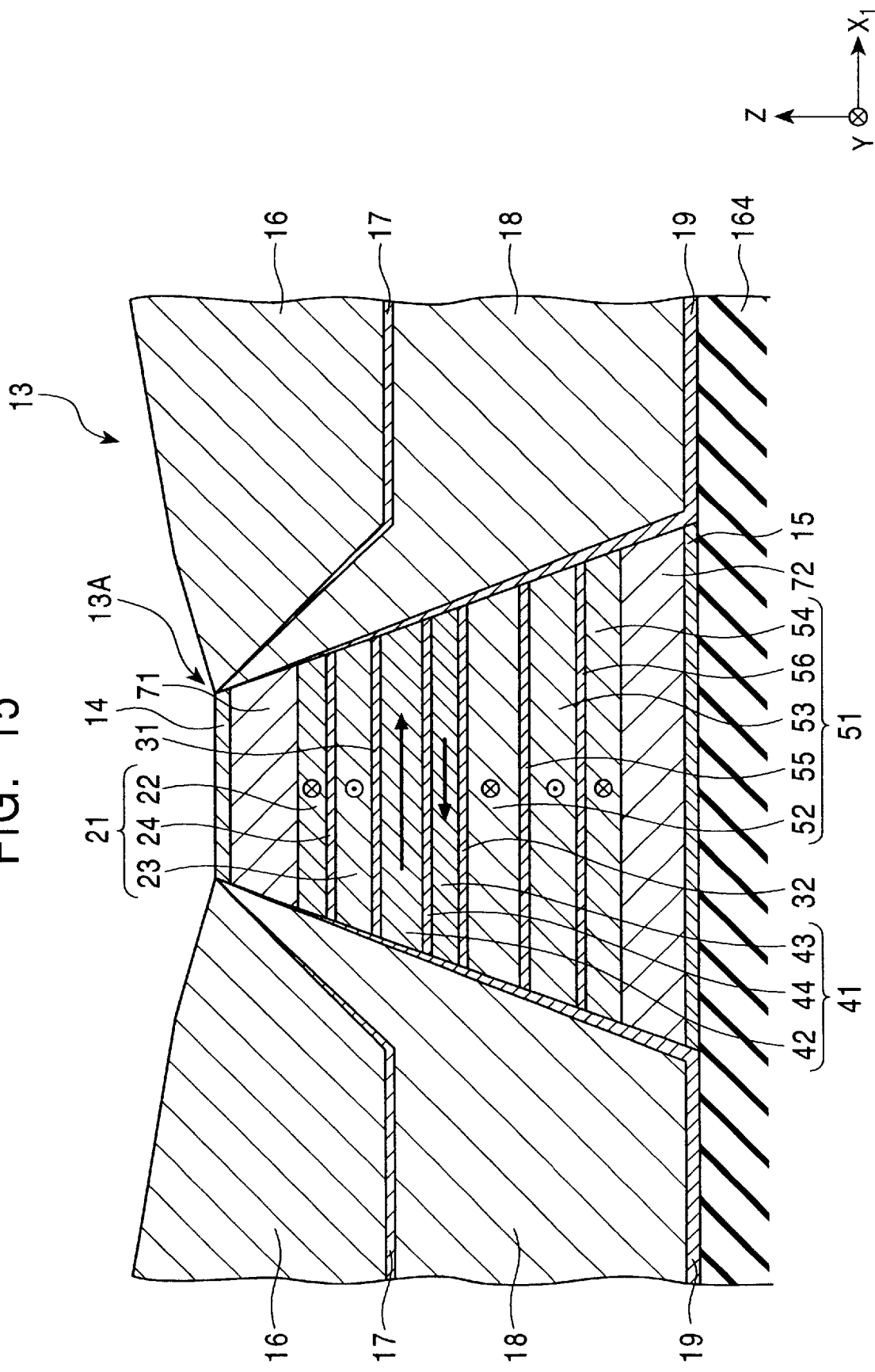
FIG. 15 is a schematic cross-sectional view of a spin valve thin-film magnetic device observed from a magnetic recording medium side, according to a third embodiment of the present invention.
Figure 16:
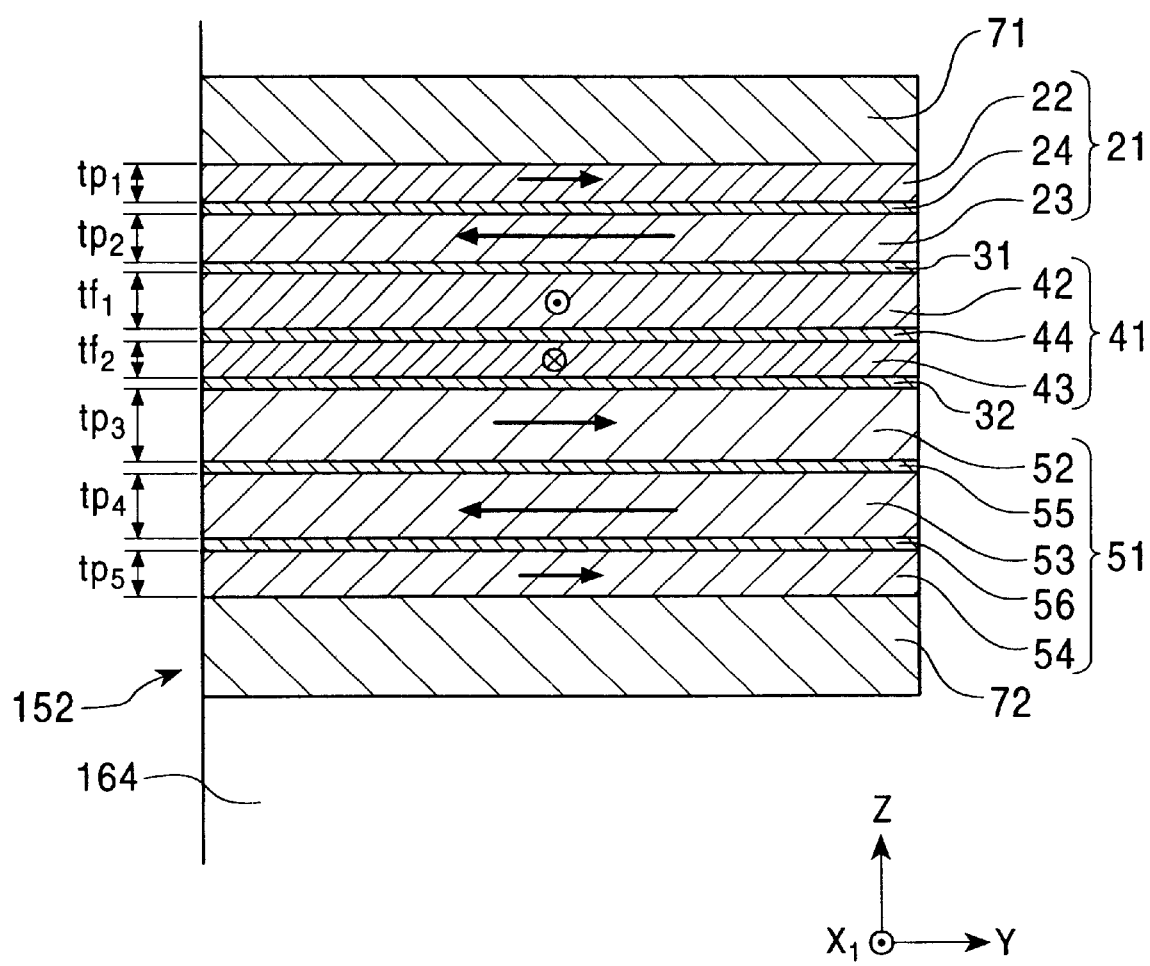
FIG. 16 is a schematic cross-sectional view of the spin valve thin-film magnetic device shown in FIG. 15 observed from a track width direction side.

FIG. 15 is a schematic cross-sectional view of a spin valve thin-film magnetic device 13 observed from the magnetic recording medium side, according to the third embodiment of the present invention, FIG. 16 is a schematic cross-sectional view of the spin valve thin-film magnetic device 13 observed from the track width direction.

In this embodiment, descriptions of the constituent elements equivalent to those in the first and the second embodiments are omitted.

As shown in FIGS. 15 and 16, a free magnetic layer 41 is composed of a first ferromagnetic free layer 42, i.e., ferromagnetic layer, and a second ferromagnetic free layer 43, i.e., ferromagnetic layer, with a nonmagnetic interlayer 44 provided therebetween.

The first and the second ferromagnetic free layers 42 and 43 are preferably composed of a Ni—Fe alloy, and the nonmagnetic interlayer 44 is preferably composed of one selected from Ru, Rh, Ir, Cr, Re, Cu, and an alloy thereof, and more preferably, is composed of Ru.

The thickness $tf_1$ of the first ferromagnetic free layer 42 is preferably 1 to 4 nm, and the thickness $tf_2$ of the second ferromagnetic free layer 43 is preferably 1 to 4 nm.

In addition, the thickness of the nonmagnetic interlayer 44 is preferably 0.3 to 1.2 nm.

The magnetization direction of the first ferromagnetic free layer 42 is aligned in the $X_1$ direction shown in the figure by the bias magnetic field of bias layers 18 and 18, and the second ferromagnetic free layer 43 is coupled antiferromagnetically with the first ferromagnetic free layer 42 so that the magnetization direction of second ferromagnetic free layer 43 is aligned in the direction opposite to the $X_1$ direction shown in the figure.

Accordingly, in the free magnetic layer 41, the magnetization directions of the first and second ferromagnetic free layers 42 and 43 adjacent to each other with the nonmagnetic interlayer 44 provided therebetween are antiparallel to each other, and the first and the second ferromagnetic free layers 42 and 43 are coupled antiferromagnetically with each other.

In order to place the free magnetic layer 41 in a ferrimagnetic state, it is preferable that the magnetic moment by the magnetization of the first ferromagnetic free layer 42 be slightly different from that of the second ferromagnetic free layer 43.

In order to differ the magnetic moment of the first ferromagnetic free layers 42 from that of the second ferromagnetic free layer 43, in the case in which the first and the second ferromagnetic free layers 42 and 43 are composed of the same materials, it is preferable that the $tf_1$ slightly be different from the $tf_2$. In this embodiment, the $tf_1$ is set to be larger than the $tf_2$.

In the case in which a material forming the first ferromagnetic free layer 42 differs from that forming the second ferromagnetic free layer 43, when the saturation magnetizations of the first and the second ferromagnetic free layers 42 and 43 are represented by $Mf_1$ and $Mf_2$, respectively, and when the magnetic thickness of the first and the second ferromagnetic free layers 42 and 43 are represented by $Mf_1 \cdot tf_1$ and $Mf_2 \cdot tf_2$, respectively, it is preferable that the $Mf_1 \cdot tf_1$ slightly be different from the $Mf_2 \cdot tf_2$.

Since the magnetization directions of the first and the second ferromagnetic free layers 42 and 43 are antiparallel to each other, the magnetic moments thereof counteract each other. However, since the $tf_1$ is set to be larger than the $tf_2$ in the free magnetic layer 41, the magnetization (magnetic moment) of the first ferromagnetic free layer 42 slightly remains, and the magnetization direction of the entire free magnetic layer 41 is aligned in the $X_1$ direction shown in the figure.

As described above, since the first and the second ferromagnetic free layers 42 and 43 are coupled antiferromagnetically with each other, and the magnetization of the first ferromagnetic free layer 42 remains, the free magnetic layer 41 is in a synthetic ferrimagnetic state (synthetic ferri free).

In the free magnetic layer 41 in the ferrimagnetic state as described above, the magnetization direction thereof can be rotated by application of a minute external magnetic field in accordance with the direction thereof.

The free magnetic layer 41 shown in FIGS. 15 and 16 is composed of two ferromagnetic layers, i.e., the first and the second ferromagnetic free layers 42 and 43; however, the present invention is not limited thereto. The free magnetic layer 41 may be composed of an even number of ferromagnetic layers, i.e., at least 2L ferromagnetic layers, in which the L is an integer of not less than 1. In the case described above, it is preferable that a nonmagnetic interlayer be provided at each location between the ferromagnetic layers adjacent to each other, the magnetization directions of the adjacent ferromagnetic layers be antiparallel to each other, and the entire free magnetic layer 41 be in a ferrimagnetic state. In order to prevent shunting of the sensing current, the L is preferably set to be 1 as described in this embodiment.

The first and the second nonmagnetic conductive layers 31 and 32 are layers so as to reduce magnetic coupling of the free magnetic layer 41 with the first and the second fixed magnetic layers 21 and 51, in which the sensing current primarily flows therein, and the first and the second nonmagnetic conductive layers 31 and 32 are preferably composed of a nonmagnetic conductive material, such as Cu, Cr, Au, or Ag, and more preferably, are composed of Cu.

The first fixed magnetic layer 21 is composed of a first pinned ferromagnetic layer 22, i.e., ferromagnetic layer, and a second pinned ferromagnetic layer 23, i.e., ferromagnetic layer, with a first nonmagnetic layer 24, i.e., nonmagnetic layer, provided therebetween. The first pinned ferromagnetic layer 22 is provided at a location closer to a first antiferromagnetic layer 71 than the first nonmagnetic layer 24 so as to be in contact with the first antiferromagnetic layer 71, and the second pinned ferromagnetic layer 23 is provided at a location closer to a first nonmagnetic conductive layer 31 than the first nonmagnetic layer 24 so as to be in contact with the first nonmagnetic conductive layer 31.

The first and the second pinned ferromagnetic layers 22 and 23 are formed of a Ni—Fe alloy, Co, a Co—Ni—Fe alloy, a Co—Fe alloy, a Co—Ni alloy, or the like and are preferably composed of Co. In addition, the first and the second pinned ferromagnetic layers 22 and 23 are preferably composed of the same material. The first nonmagnetic layer 24 is preferably composed of one of Ru, Rh, Ir, Cr, Re, Cu, and an alloy thereof, and more preferably, is composed of Ru.

The thickness $tp_1$ of the first pinned ferromagnetic layer 22 is preferably 1 to 3 nm, and the thickness $tp_2$ of the second pinned ferromagnetic layer 23 is preferably 1 to 3 nm.

The thickness of the first nonmagnetic layer 24 is preferably 0.3 to 1.2 nm.

The magnetization direction of the first pinned ferromagnetic layer 22 is fixed in the Y direction shown in the figure by the exchange coupling magnetic field with the first antiferromagnetic layer 71, and the second pinned ferromagnetic layer 23 is coupled antiferromagnetically with the first pinned ferromagnetic layer 22, so that the magnetization direction of the second pinned ferromagnetic layer 23 is fixed in the direction opposite to the Y direction shown in the figure.

Consequently, in the first fixed magnetic layer 21, the magnetization directions of the first and the second pinned ferromagnetic layers 22 and 23 are set to be antiparallel to each other with the first nonmagnetic layer 24 provided therebetween, and the first and the second pinned ferromagnetic layers 22 and 23 are coupled antiferromagnetically with each other.

In order to place the first fixed magnetic layer 21 in a ferrimagnetic state, the magnetic moments by the magnetizations of the first and the second pinned ferromagnetic layers 22 and 23 preferably differ from each other, and for the purpose thereof, when the first and the second pinned ferromagnetic layers 22 and 23 are composed of the same material, it is preferable that the $tp_1$ slightly differ from the $tp_2$. In this embodiment, the $tp_2$ is set to be larger than the $tp_1$.

In contrast, in the case in which the first pinned ferromagnetic layers 22 is composed of a material differing from that of the second pinned ferromagnetic layer 23, when the saturation magnetizations of the first and the second ferromagnetic pined layers 22 and 23 are represented by $Mp_1$ and $Mp_2$, respectively, and the magnetic thicknesses thereof are represented by $Mp_1 \cdot tp_1$ and $Mp_2 \cdot tp_2$, respectively, it is preferable that the $Mp_1 \cdot t_{p1}$ slightly differ from the $Mp_2 \cdot t_{P2}$.

Since the magnetization directions of the first and the second pinned ferromagnetic layers 22 and 23 are antiparallel to each other, the magnetic moments thereof counteract each other. However, since the $tp_2$ is set to be larger than the $tp_1$ in the first fixed magnetic layer 21, the magnetization (magnetic moment) of the second pinned ferromagnetic layer 23 slightly remains. The remaining magnetization is further increased by the exchange coupling magnetic field with the first antiferromagnetic layer 71, and the magnetization direction of the entire first fixed magnetic layer 21 is fixed in the direction opposite to the Y direction shown in the figure so as to cross the magnetization direction of the free magnetic layer 41.

As described above, since the first pinned ferromagnetic layer 22 is coupled antiferromagnetically with the second pinned ferromagnetic layer 23, and the magnetization of the second pinned ferromagnetic layer 23 remains, the first fixed magnetic layer 21 is in a synthetic ferrimagnetic state (synthetic ferri pinned).

In this embodiment, the first fixed magnetic layer 21 is composed of two ferromagnetic layers, i.e., the first and the second pinned ferromagnetic layers 22 and 23; however the present invention is not limited thereto. The first fixed magnetic layer 21 may be composed of an even number of ferromagnetic layers, i.e., at least 2M ferromagnetic layers, in which the M is an integer of not less than 1. In the case described above, it is preferable that a nonmagnetic layer be provided at each location between the ferromagnetic layers adjacent to each other, the magnetization directions of the adjacent ferromagnetic layers be antiparallel to each other, and the entire first fixed magnetic layer 21 be in a ferrimagnetic state. In order to prevent shunting of the sensing current, the M is preferably set to be 1.

The second fixed magnetic layer 51 is a laminate composed of a third pinned ferromagnetic layer 52, i.e., ferromagnetic layer, a second nonmagnetic layer 55, i.e., nonmagnetic layer, a fourth pinned ferromagnetic layer 53, i.e., ferromagnetic layer, a third nonmagnetic layer 56, i.e., nonmagnetic layer, and a fifth pinned ferromagnetic layer 54, i.e., ferromagnetic layer, in that order. The third pinned ferromagnetic layer 52 is provided at a location closer to the second nonmagnetic conductive layer 32 than the fourth pinned ferromagnetic layer 53 so as to be in contact with the second nonmagnetic conductive layer 32, and the fifth pinned ferromagnetic layer 54 is provided at a location closer to the second antiferromagnetic layer 72 than the fourth pinned ferromagnetic layer 53 so as to be in contact with the second antiferromagnetic layer 72.

The third, the fourth, and the fifth pinned ferromagnetic layers 52, 53, and 54 are formed of a Ni—Fe alloy, Co, a Co—Ni—Fe alloy, a Co—Fe alloy, a Co—Ni alloy, or the like and are preferably composed of Co. In addition, the third, the fourth, and the fifth pinned ferromagnetic layers 52, 53, and 54 are preferably composed of the same material. The second and the third nonmagnetic layer 55 and 56 are preferably composed of one of Ru, Rh, Ir, Cr, Re, Cu, and an alloy thereof, and in particular, is preferably composed of Ru.

The thickness $tp_3$ of the third pinned ferromagnetic layer 52 is preferably 1 to 3 nm, the thickness $tp_4$ of the fourth pinned ferromagnetic layer 53 is preferably 1 to 3 nm, and the thickness $tp_5$ of the fifth pinned ferromagnetic layer 54 is preferably 1 to 3 nm.

The thickness of the second nonmagnetic layer 54 is preferably 0.3 to 1.2 nm, and the thickness of the third nonmagnetic layer 55 is preferably 0.3 to 1.2 nm.

The magnetization direction of the fifth pinned ferromagnetic layer 54 is fixed in the Y direction shown in the figure by the exchange coupling magnetic field with the second antiferromagnetic layer 72, the fourth pinned ferromagnetic layer 53 is coupled antiferromagnetically with the fifth pinned ferromagnetic layer 54, so that the magnetization direction of the fourth pinned ferromagnetic layer 53 is fixed in the direction opposite to the Y direction shown in the figure, and the third pinned ferromagnetic layer 52 is coupled antiferromagnetically with the fourth pinned ferromagnetic layer 53, so that the magnetization direction of the third pinned ferromagnetic layer 52 is fixed in the Y direction shown in the figure.

Consequently, in the second fixed magnetic layer 51, the magnetization directions of the third pinned ferromagnetic layer 52, the fourth pinned ferromagnetic layer 53, and the fifth pinned ferromagnetic layer 54 with the first and the second nonmagnetic layers 55 and 56 provided therebetween, respectively, are set to be antiparallel to each other, and hence, the third, the fourth, and the fifth pinned ferromagnetic layers 52, 53, and 54 are coupled antiferromagnetically with each other.

In order to place the second fixed magnetic layer 51 in a ferrimagnetic state, it is preferable that the synthetic magnetic moment of the third and the fifth pinned ferromagnetic layers 52 and 54, in which the magnetization directions, i.e., the Y direction in the figure, are in the same direction, and the magnetic moment of the fourth pinned ferromagnetic layer 53, in which the magnetization direction, i.e., direction opposite to the Y direction in the figure, is opposite to the third and fifth ferromagnetic layers 52 and 54, slightly differ from each other.

In order to make the synthetic magnetic moment slightly different from the magnetic moment of the fourth pinned ferromagnetic layer 53, when the third, the fourth, and the fifth pinned ferromagnetic layers 52, 53 and 54 are composed of the same material, it is preferable that the $(tp_3+tp_5)$ slightly differ from the $tp_4$. In this embodiment, the $tp_4$ is set to be larger than the $tp_3$, the $tp_3$ is set to be larger than the $tp_5$, and the $(tp_3+tp_5)$ is set to be larger than the $tp_4$.

In contrast, in the case in which the third, the fourth, and the fifth pinned ferromagnetic layer 52, 53, and 54 are composed of materials differing from each other, when the saturation magnetizations of the third, the fourth, and the fifth pinned ferromagnetic layer 52, 53, and 54 are represented by $Mp_3$, $Mp_4$, and $Mp_5$, respectively, and the magnetic thicknesses thereof are represented by $Mp_3 \cdot tp_3$, $Mp_4 \cdot tp_4$, and $Mp_5 \cdot tp_5$ and respectively, it is preferable that the $(Mp_3 \cdot tp_3 + Mp_5 \cdot tp_5)$ slightly differ from the $Mp_4 \cdot tp_4$.

Since the magnetization directions of the third, the fourth, and the fifth pinned ferromagnetic layer 52, 53, and 54 are antiparallel to each other, the magnetic moments thereof counteract each other. However, since the $(tp_3+tp_5)$ is set to be larger than the $tp_4$ in the second fixed magnetic layer 51, the synthetic magnetization (synthetic magnetic moment) of the third and the fifth pinned ferromagnetic layer 52 and 54 slightly remains. The remaining magnetization is further increased by the exchange coupling magnetic field with the second antiferromagnetic layer 72, and the magnetization direction of the entire second fixed magnetic layer 51 is fixed in the Y direction shown in the figure and is antiparallel to the magnetization direction of the first fixed magnetic layer 21.

As described above, since the third, the fourth, and the fifth pinned ferromagnetic layer 52, 53, and 54 are coupled antiferromagnetically with each other, and the synthetic magnetization of the third and fifth pinned ferromagnetic layer 52 and 54 remains, the second fixed magnetic layer 51 is in a synthetic ferrimagnetic state (synthetic ferri pinned).

In this embodiment, the second fixed magnetic layer 51 is composed of three ferromagnetic layers, i.e., the third, the fourth, and the fifth pinned ferromagnetic layer 52, 53, and 54; however the present invention is not limited thereto. The second fixed magnetic layer 51 may be a single ferromagnetic layer or may be a laminate composed of an odd number of ferromagnetic layers, i.e., at least 2N ferromagnetic layers, in which the N is an integer of not less than 1, and a nonmagnetic layer is provided at each location between the ferromagnetic layers. In order to prevent shunting of the sensing current, the N is preferably set to be 1 as described in this embodiment.

When the first and the second fixed magnetic layers 21 and 51 and the free magnetic layer 41 are formed as described above, as shown in FIGS. 15 and 16, the individual magnetization directions of the first and the second fixed magnetic layer 21 and 51 cross that of the free magnetic layer 41, and the magnetization directions of the first and the second fixed magnetic layers 21 and 51 are antiparallel to each other.

In addition, the magnetization direction, i.e., the direction opposite to the Y direction in the figure, of the second pinned ferromagnetic layer 23, which is closest to the free magnetic layer 41 among the ferromagnetic layers forming the first fixed magnetic layer 21, and the magnetization direction, i.e., the Y direction in the figure, of the third pinned ferromagnetic layer 52, which is closest to the free magnetic layer 41 among the ferromagnetic layers forming the second fixed magnetic layer 51, are antiparallel to each other.

Figure 17:
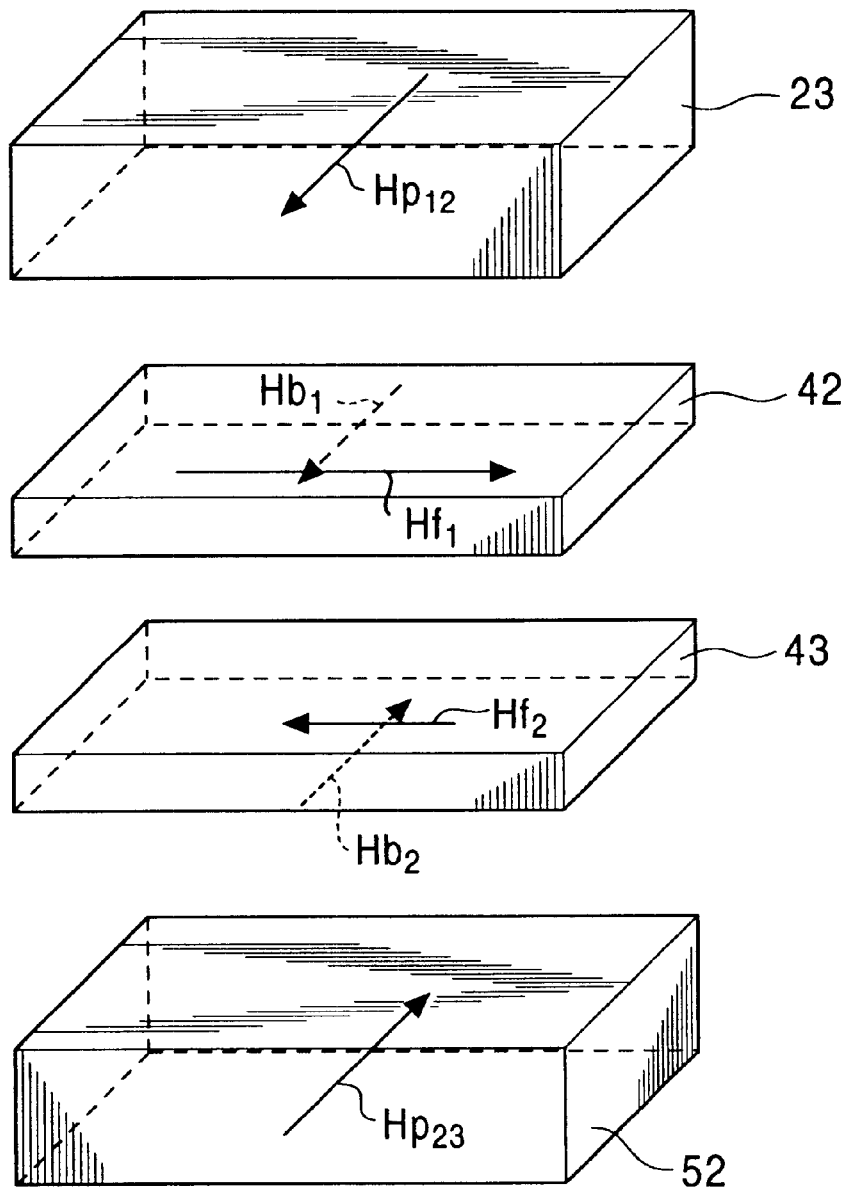
FIG. 17 is a schematic view illustrating ferromagnetic interlayer coupling magnetic fields which appear between a free magnetic layer and a first and a second fixed magnetic layer in the spin valve thin-film magnetic device shown in FIG. 15.

In FIG. 17, the magnetic moments of the second pinned ferromagnetic layer 23, the first ferromagnetic free layer 42, the second ferromagnetic free layer 43, and the third pinned ferromagnetic layer 52 are indicated by the arrows.

Reference numeral $Hp_{12}$ indicates the magnetic moment by the magnetization of the second pinned ferromagnetic layer 23, and reference numeral $Hp_{23}$ indicates the magnetic moment by the magnetization of the third pinned ferromagnetic layer 52. The direction indicated by the $Hp_{12}$ is the direction opposite to the Y direction in the figure, and the direction indicated by the $Hp_{23}$ is the Y direction in the figure.

Reference numeral $Hf_1$ indicates the magnetic moment by the magnetization of the first ferromagnetic free layer 42, and reference numeral $Hf_2$ indicates the magnetic moment by the magnetization of the second ferromagnetic free layer 43. The direction indicated by the $Hf_1$ is the $X_1$ direction in the figure, and the direction indicated by the $Hf_2$ is the direction opposite to the $X_1$ direction in the figure.

Even though not shown, the first nonmagnetic conductive layer 31 is provided between the second pinned ferromagnetic layer 23 and the first ferromagnetic free layer 42, the second nonmagnetic conductive layer 32 is provided between the third pinned ferromagnetic layer 52 and the second ferromagnetic free layer 43, and the nonmagnetic interlayer 44 is provided between the first and the second ferromagnetic free layers 42 and 43.

The second pinned ferromagnetic layer 23 performs ferromagnetic interlayer coupling with the first ferromagnetic free layer 42 via the first nonmagnetic conductive layer 31, and magnetic field moment $Hb_1$ is generated by this ferromagnetic interlayer coupling magnetic field. The direction of the magnetic field moment $Hb_1$ is parallel to the magnetization direction of the second pinned ferromagnetic layer 23 and is in the direction opposite to the Y direction in the figure.

The third pinned ferromagnetic layer 52 performs ferromagnetic interlayer coupling with the second ferromagnetic free layer 43 via the second nonmagnetic conductive layer 32, and magnetic field moment $Hb_2$ is generated by this ferromagnetic interlayer coupling magnetic field. The direction of the magnetic field moment $Hb_2$ is parallel to the magnetization direction of the third pinned ferromagnetic layer 52 and is in the Y direction in the figure. Accordingly, the directions of the magnetic field moments $Hb_1$ and $Hb_2$ are antiparallel to each other.

Consequently, since the magnetic field moments $Hb_1$ and $Hb_2$ counteract each other, which are applied to the free magnetic layer 41, the direction of the magnetization of the entire free magnetic layer 41, which is the synthetic magnetization of the $Hf_1$ and $Hf_2$, is not inclined by the ferromagnetic interlayer coupling magnetic filed of the second and the third fixed magnetic layers 23 and 52 and is aligned in the $X_1$ direction shown in the figure by the bias layers 18 and 18.

Next, in the spin valve thin-film magnetic device 13, the relationship between the magnetization direction of the free magnetic layer 41 and the leakage magnetic fields of the first and the second fixed magnetic layers 21 and 51 will be described.

In FIG. 18, the individual magnetic moments of the first fixed magnetic layer 21, the free magnetic layer 41, and the second fixed magnetic layer 51 are shown by the arrows.

Reference numeral $Hp_1$ indicates the magnetic moment by the magnetization of the entire first fixed magnetic layer 21, reference numeral $Hp_2$ indicates the magnetic moment by the magnetization of the entire second fixed magnetic layer 51. The direction of $Hp_1$ is the direction opposite to the Y direction in the figure, and the direction of $Hp_2$ is the Y direction in the figure.

In addition, reference numeral Hfr indicates the magnetic moment by the magnetization of the entire free magnetic layer 41, and the direction of Hfr is the $X_1$ direction in the figure.

Even though not shown in the figure, the first nonmagnetic conductive layer 31 is provided between the first fixed magnetic layer 21 and the free magnetic layer 41, and the second nonmagnetic conductive layer 32 is provided between the second fixed magnetic layer 51 and the free magnetic layer 41.

In the spin valve thin-film magnetic device 13, as shown in FIG. 18, dipole magnetic fields $Hd_1$ and $Hd_2$ leaked from the first and the second fixed magnetic layers 21 and 51, respectively, are applied to the free magnetic layer 41.

The dipole magnetic field $Hd_1$ from the first fixed ferromagnetic layer 21 extends to the direction opposite to the Y direction in the figure and is then penetrated into the free magnetic layer 41 along the Y direction by describing an arc, and the dipole magnetic fields $Hd_1$ is in the Y direction in the free magnetic layer 41. In addition, the dipole magnetic field $Hd_2$ from the second fixed ferromagnetic layer 51 extends to the Y direction in the figure and is then penetrated into the free magnetic layer 41 along the direction opposite to the Y direction by describing an arc, and the dipole magnetic fields $Hd_2$ is in the direction opposite to the Y direction in the free magnetic layer 41. Accordingly, the direction of the dipole magnetic fields $Hd_1$ and $Hd_2$ are antiparallel with each other.

Accordingly, since the dipole magnetic fields $Hd_1$ and $Hd_2$ counteract each other, the direction of the magnetic moment Hfr of the entire free magnetic layer 41 is not inclined by the dipole magnetic fields $Hd_1$ and $Hd_2$ of the first and the second fixed magnetic layers 21 and 51, whereby the magnetization direction of the free magnetic layer 41 is aligned in the $X_1$ direction in the figure by the bias layers 18 and 18.

Next, in the spin valve thin-film magnetic device 13 described above, the relationship between the direction of sensing current magnetic field by sensing current and the magnetization directions of the first and the second fixed magnetic layers 21 and 51 will be described.

In FIG. 19, the individual magnetic moments of the first fixed magnetic layer 21, the free magnetic layer 41, and the second fixed magnetic layer 51 are shown by the arrows.

Reference numeral $Hp_1$ indicates the magnetic moment by the magnetization of the entire first fixed magnetic layer 21, reference numeral $Hp_2$ indicates the magnetic moment by the magnetization of the second fixed magnetic layer 51. The direction of $Hp_1$ is the direction opposite to the Y direction in the figure, and the direction of $Hp_2$ is the Y direction in the figure.

In addition, reference Hrf indicates the magnetic moment by the magnetization of the entire free magnetic layer 41, and the direction of Hfr is the $X_1$ direction in the figure.

Even though not shown in the figure, the first nonmagnetic conductive layer 31 is provided between the first fixed magnetic layer 21 and the free magnetic layer 41, and the second nonmagnetic conductive layer 32 is provided between the second fixed magnetic layer 51 and the free magnetic layer 41.

When the sensing current flows in the spin valve thin-film magnetic device 13, the sensing current primarily in the nonmagnetic conductive layers (between the free magnetic layer 41 and the first and the second fixed magnetic layers 21 and 51).

In this step, when the sensing current flows in the $X_1$ direction, a sensing current indicated by reference numeral $i_1$ flows in the first nonmagnetic conductive layer 31 (between the free magnetic layer 41 and the first fixed magnetic layer 21), and a sensing current indicated by reference numeral $i_2$ flows in the second nonmagnetic conductive layer 32 (between the free magnetic layer 41 and the second fixed magnetic layer 51), whereby sensing current magnetic fields $Hi_1$ and $Hi_2$ are generated by the sensing current $i_1$ and $i_2$.

The sensing current magnetic field $Hi_1$ is in the direction opposite to the Y direction at the first fixed magnetic layer 21 side and is in the direction of the magnetic moment $Hp_1$ of the entire first fixed magnetic layer 21.

In addition, the sensing current magnetic field $Hi_2$ is in the Y direction at the second fixed magnetic layer 51 side and is in the direction of the magnetic moment $Hp_2$ of the entire second fixed magnetic layer 51.

Accordingly, in the spin valve thin-film magnetic device 13 described above, when the sensing current $i_1$ and $i_2$ flow in the $X_1$ direction in the figure, the individual directions of the sensing current magnetic fields $Hi_1$ and $Hi_2$ are in the magnetization directions of the first and the second fixed magnetic layers 21 and 51, respectively. As a result, the magnetizations of the first and the second magnetic layers 21 and 51 are not counteracted with the sensing current magnetic fields $Hi_1$ and $Hi_2$, respectively, and hence, the magnetizations of the first and the second magnetic layers 21 and 51 can be reliably fixed, whereby the asymmetry of the spin valve thin-film magnetic device 13 can be reduced.

In addition, as shown in FIG. 19, the sensing current magnetic fields $Hi_1$ and $Hi_2$ described above are antiparallel to each other at the free magnetic layer 41 side and counteract each other in the free magnetic layer 41. As a result, the strength of the magnetic moment Hs of the sensing current magnetic field applied to the free magnetic layer 41 is $|Hi_1 - Hi_2|$.

However, since the sensing current magnetic fields $Hi_1$ and $Hi_2$ counteract each other in the free magnetic layer 41, the strength of the magnetic moment Hs is significantly decreased.

In addition to the bias magnetic field of the bias layers 18 and 18 applied to the free magnetic layer 41, the magnetic moments $Hb_1$ and $Hb_2$ of the ferromagnetic interlayer coupling magnetic fields, the magnetic moments $Hd_1$ and $Hd_2$, of the dipole magnetic fields, and the magnetic moment Hs of the sensing current magnetic field are also applied to the free magnetic layer 41. According to the spin valve thin-film magnetic device 13 described above, since the sum of those described above can be zero, that is, $Hb_1 + Hb_2 + Hd_1 + Hd_1 + Hs \cong 0$, the magnetization direction of the free magnetic layer 41 is not inclined by those magnetic moments described above, and the asymmetry of the spin valve thin-film magnetic device 13 can be reduced.

Next, a method for manufacturing the spin valve thin-film magnetic device 13 described above will be described.

Figure 20:
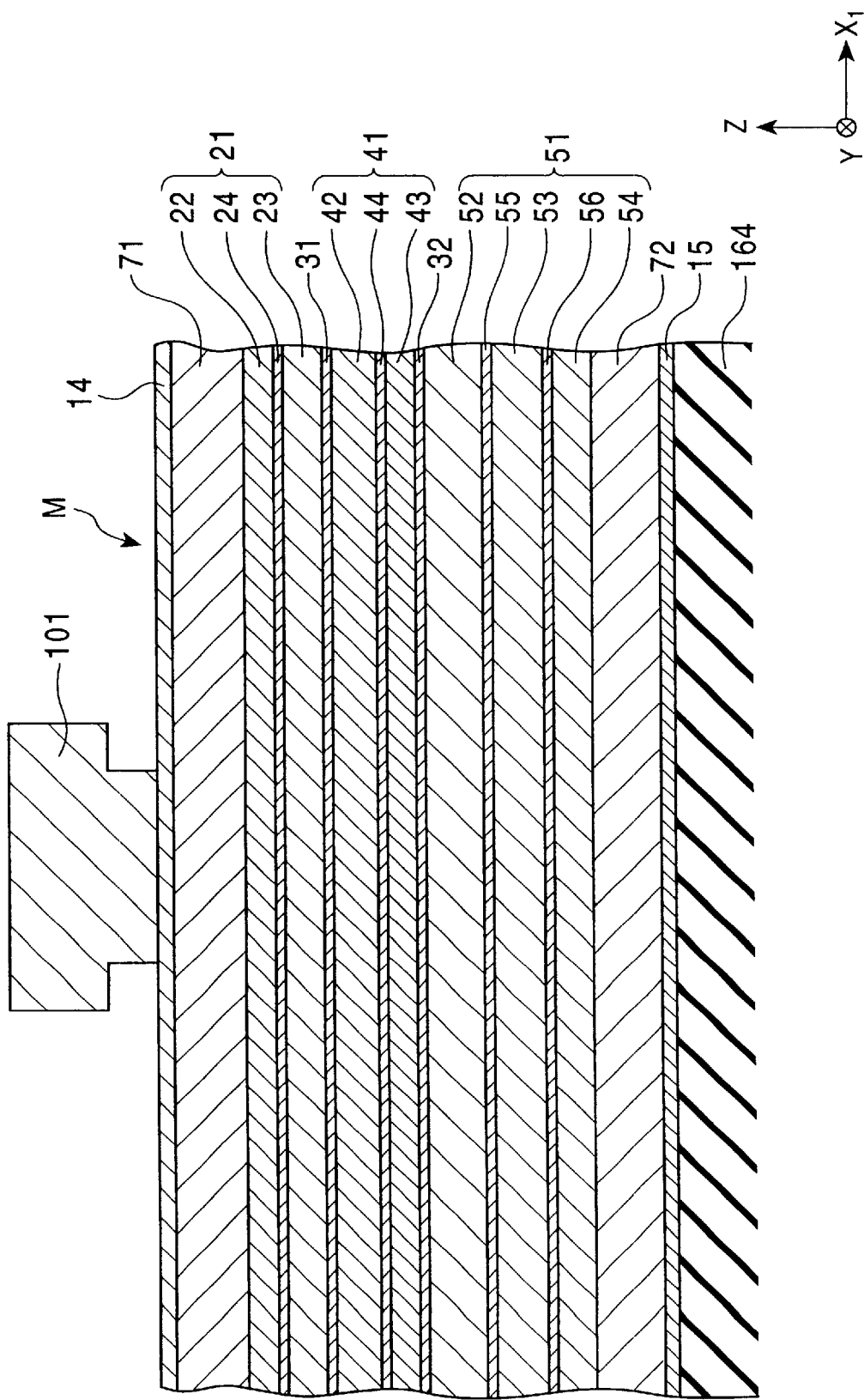
FIG. 20 is a view illustrating a manufacturing method step for the spin valve thin-film magnetic device shown in FIG. 15.

As shown in FIG. 20, on the lower insulating layer 164, a laminate M is formed in which the underlying layer 15, the second antiferromagnetic layer 72, the second fixed magnetic layer 51, the second nonmagnetic conductive layer 32, the free magnetic layer 41, the first nonmagnetic conductive layer 31, the first fixed magnetic layer 21, the first antiferromagnetic layer 71, and the cap layer 14 are sequentially formed on the lower insulating layer 164 by sputtering, deposition, or the like. Subsequently, a lift-off resist 101 is formed on the laminate M.

The first fixed magnetic layer 21 is a laminate formed of the first pinned ferromagnetic layer 22, the first nonmagnetic layer 24, and the second pinned ferromagnetic layer 23, in that order.

The free magnetic layer 41 is a laminate formed of the first ferromagnetic free layer 42, the nonmagnetic interlayer 44, and the second ferromagnetic free layer 43, in that order.

The second fixed magnetic layer 51 is a laminate formed of the third pinned ferromagnetic layer 52, the second nonmagnetic layer 55, the fourth pinned ferromagnetic layer 53, the third nonmagnetic layer 56, and the fifth pinned ferromagnetic layer 54, in that order.

As shown in FIG. 20, the second pinned ferromagnetic layer 23 of the first fixed magnetic layer 21 is formed so as to be thicker than the first pinned ferromagnetic layer 22, and the first ferromagnetic free layer 42 of the free magnetic layer 41 is formed so as to be thicker than the second ferromagnetic free layer 43.

In addition, in the second fixed magnetic layer 51, the fourth pinned ferromagnetic layer 53 is formed so as to have the largest thickness, and the fifth pinned ferromagnetic layer 54 is formed so as to have smallest thickness.

Figure 21:
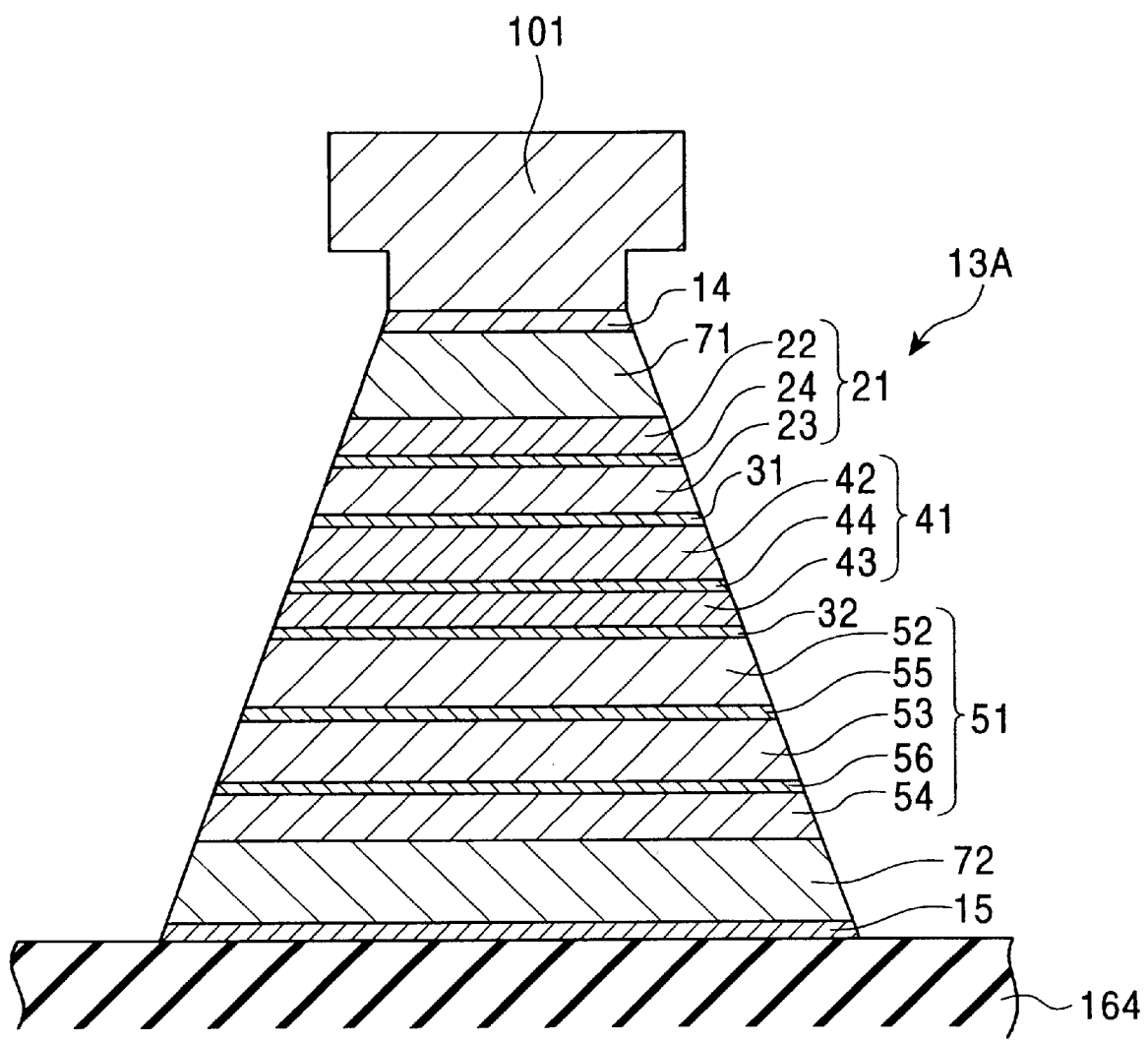
FIG. 21 is a view illustrating a manufacturing method step for the spin valve thin-film magnetic device shown in FIG. 15.

Next, as shown in FIG. 21, parts of the laminate M, which are not covered by the lift-off resist 101, are removed by ion milling to form inclined surfaces so as to form a regular trapeziform laminate 13A.

Figure 22:
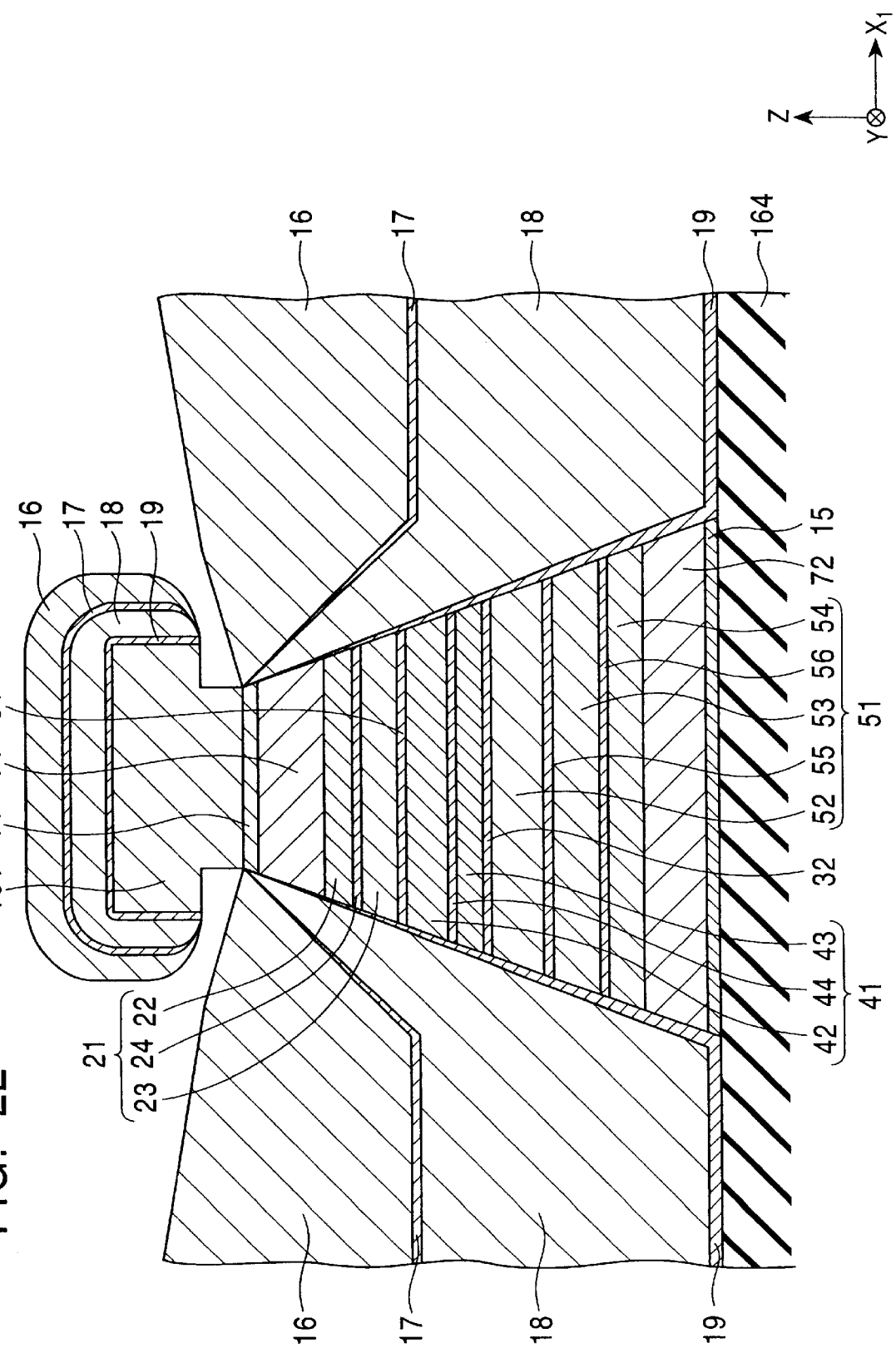
FIG. 22 is a view illustrating a manufacturing method step for the spin valve thin-film magnetic device shown in FIG. 15.

Next, as shown in FIG. 22, on the lift-off resist 101 and on both sides of the laminate 11A, bias underlying layers 19, the bias layers 18, the interlayers 17, and conductive layers 16 are sequentially formed.

Figure 23:
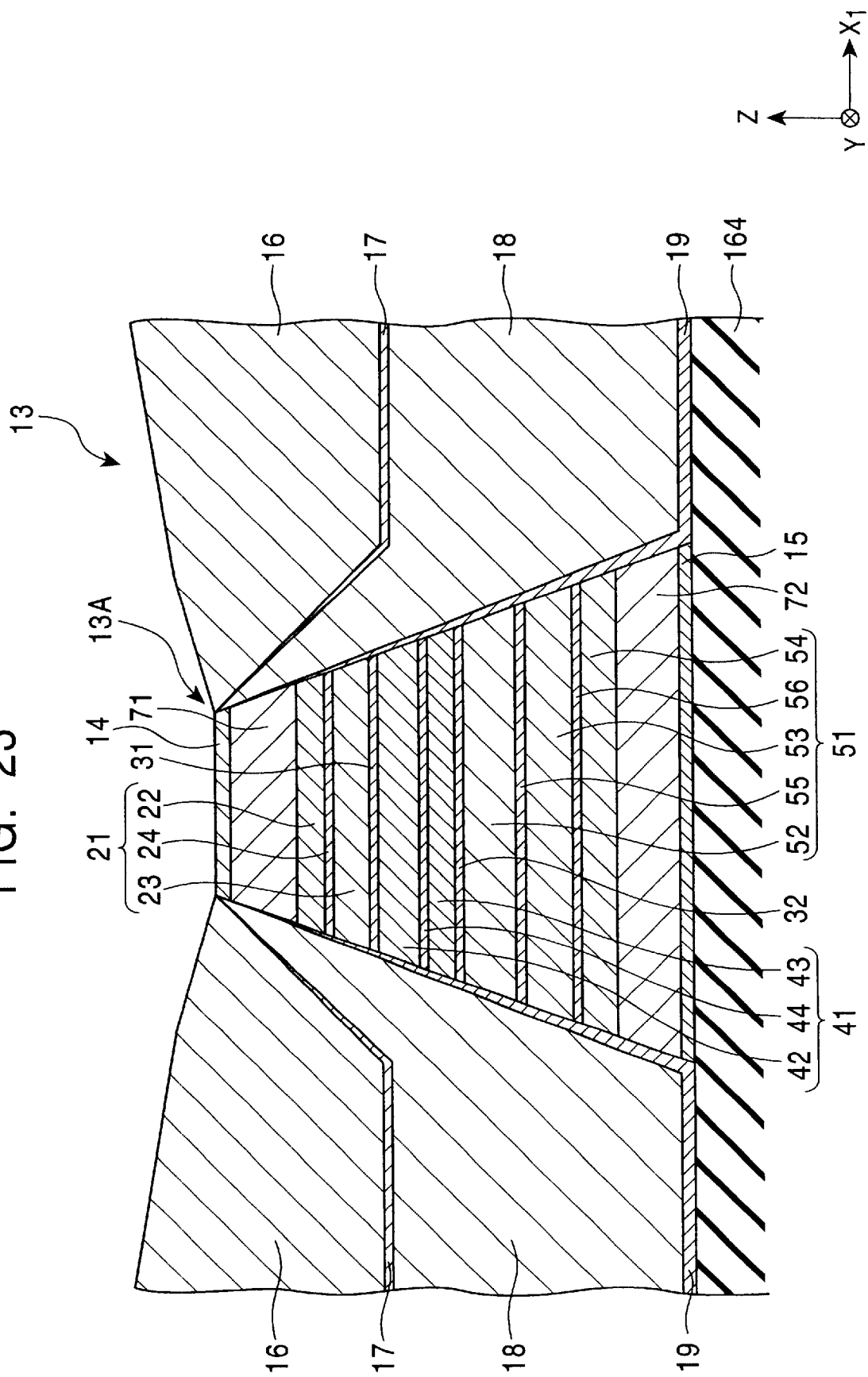
FIG. 23 is a view illustrating a manufacturing method step for the spin valve thin-film magnetic device shown in FIG. 15.

Next, as shown in FIG. 23, the lift-off resist 101 is removed. As described above, the spin valve thin-film magnetic device 13 is formed.

Subsequently, the first and the second antiferromagnetic layer 71 and 72 of the spin valve thin-film magnetic device 13 are processed by a heat treatment in a magnetic field, and exchange coupling magnetic fields are generated at the interfaces between the first antiferromagnetic layer 71 and the first fixed magnetic layer 21 and between the second antiferromagnetic layer 72 and the second fixed magnetic layer 51.

Figure 24:
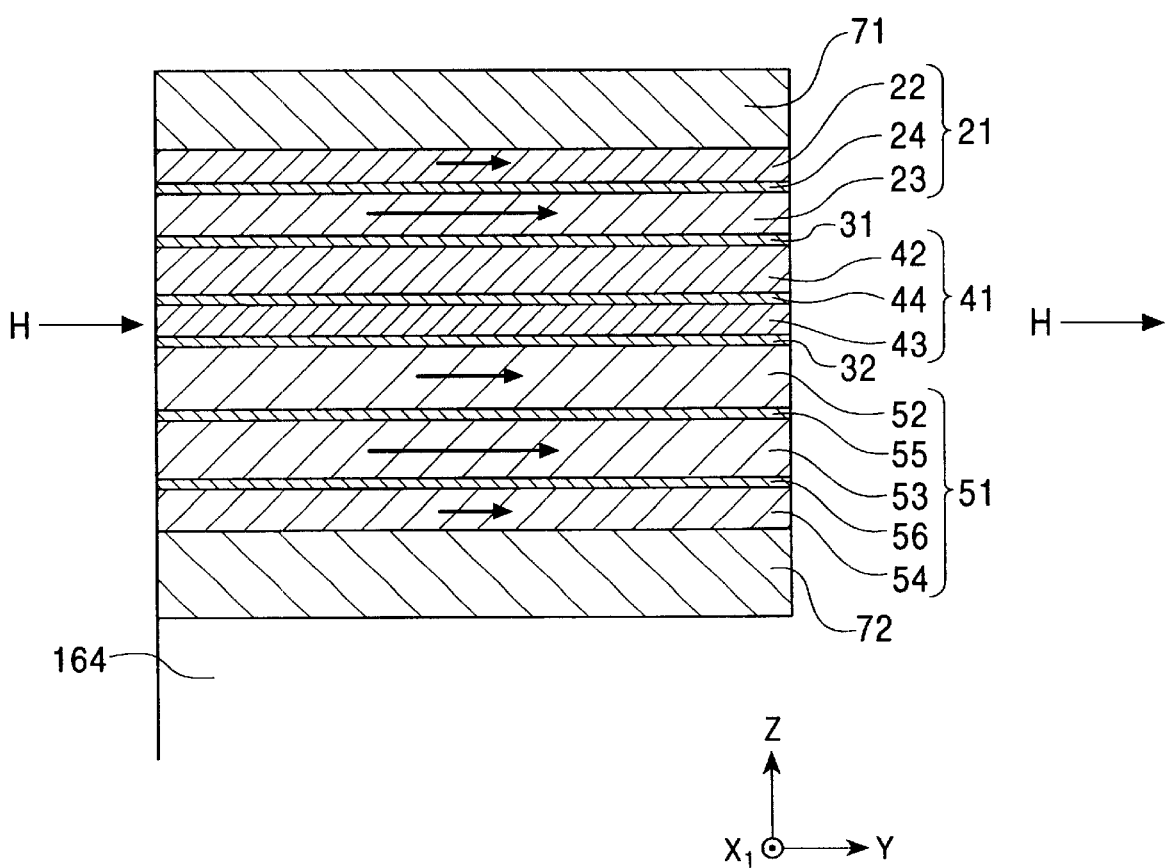
FIG. 24 is a view illustrating a manufacturing method step for the spin valve thin-film magnetic device shown in FIG. 15.

FIG. 24 is a cross-sectional view of the spin valve thin-film magnetic device 13 shown in FIG. 23, which is observed from the track width direction.

As shown in FIG. 24, the spin valve thin-film magnetic device 13 is processed by a heat treatment while an external magnetic field H is applied thereto toward the Y direction shown in the figure. In the step described above, the external magnetic field H preferably has a sufficient strength so that all magnetization directions of the ferromagnetic layers 22, 23, 42, 43, 52, 53, and 54, which form the free magnetic layer 41 and the first and the second fixed magnetic layers 21 and 51, and in particular, an external magnetic field of $4.0 \times 10^5$ A/cm or more is preferably applied.

The heat treatment is preferably performed at 473 to 573 K for 60 to 600 minutes in a vacuum or an inert gas atmosphere.

When the heat treatment is performed as described above, the crystalline structures of the first and the second antiferromagnetic layers 71 and 72 are regulated, and exchange coupling magnetic fields appear at the interfaces between the first antiferromagnetic layer 71 and the first fixed magnetic layer 21 and between the second antiferromagnetic layer 72 and the second fixed magnetic layer 51.

Figure 25:
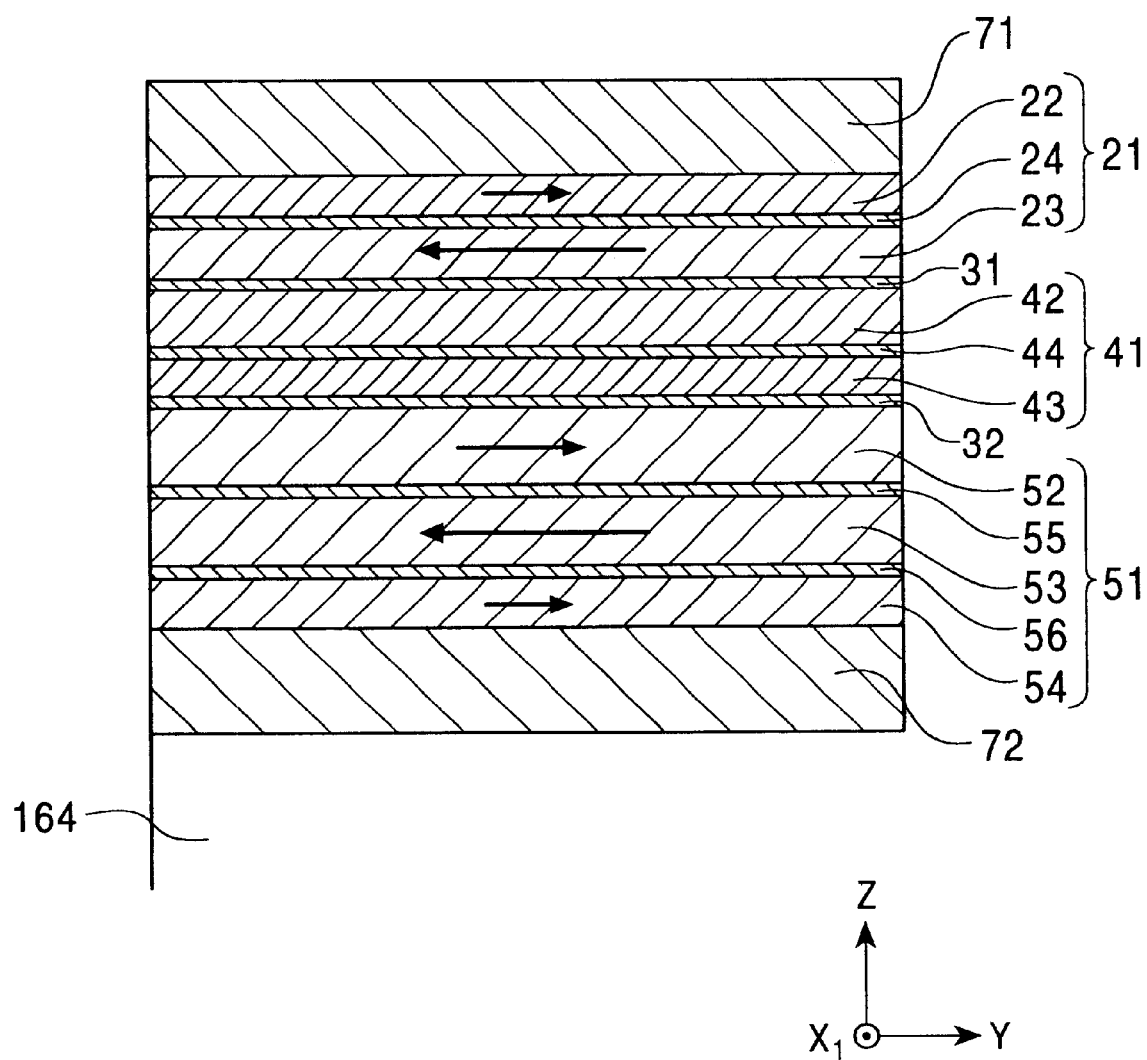
FIG. 25 is a view illustrating a manufacturing method step for the spin valve thin-film magnetic device shown in FIG. 15.

The external magnetic field is removed after the heat treatment is complete. When the external magnetic field H is removed, as shown in FIG. 25, since the first and the second pinned ferromagnetic layers 22 and 23, which form the first fixed magnetic layer 21, are coupled antiferromagnetically with each other, the magnetization direction of the second pinned ferromagnetic layer 23 is turned around.

In addition, since the third, the fourth, and the fifth pinned ferromagnetic layers 52, 53, and 54, which form the second fixed magnetic layer 51, are coupled antiferromagnetically with each other, the magnetization direction of the fourth pinned ferromagnetic layer 53 is turned around.

That is, in the first fixed magnetic layer 21, since the magnetization direction of the first pinned ferromagnetic layer 22 is fixed in the Y direction in the figure by the first antiferromagnetic layer 71, the magnetization direction of the second pinned ferromagnetic layer 23 is turned around to the direction opposite to the Y direction in the figure.

In a manner similar to the above, in the second fixed magnetic layer 51, since the magnetization direction of the fifth pinned ferromagnetic layer 54 is fixed in the Y direction in the figure by the second antiferromagnetic layer 72, the magnetization direction of the fourth pinned ferromagnetic layer 53 is turned around to the direction opposite to the Y direction in the figure. The magnetization direction of the third pinned ferromagnetic layer 52 is fixed in the Y direction in the figure by antiferromagnetic coupling with the fourth pinned ferromagnetic layer 53.

The bias layers 18 and 18 are magnetized last so that a bias magnetic field appears, and the magnetization direction of the entire free magnetic layer 41 is aligned in the $X_1$ direction in the figure.

As described above, a spin valve thin-film magnetic device 13 as shown in FIGS. 15 and 16 can be obtained.

According to the spin valve thin-film magnetic device 13, since the magnetization directions of the second pinned ferromagnetic layer 23 and the third pinned ferromagnetic layer 52 are antiparallel to each other, the magnetic field moments $Hb_1$ and $Hb_2$ of the ferromagnetic interlayer coupling magnetic fields counteract each other, which appear by ferromagnetic interlayer coupling between the free magnetic layer 41 and the second and the third pinned ferromagnetic layers 22 and 52. Consequently, the magnetization direction of the entire free magnetic layer 41 is not inclined, and hence, the asymmetry can be reduced.

Since the magnetization directions of the entire first fixed magnetic layer 21 and the entire second fixed magnetic layer 51 are antiparallel to each other, the dipole magnetic fields $Hd_1$ and $Hd_2$ applied to the free magnetic layer 41 counteract each other, and hence, the direction of the magnetic moment Hfr of the entire free magnetic layer 41 is not inclined by the dipole magnetic fields of the first and the second fixed magnetic layers 21 and 51, and hence, the asymmetry can be reduced.

In addition, in the spin valve thin-film magnetic device 13, when the sensing currents i1 and i2 flow in the $X_1$ direction in the figure, since the directions of the individual sensing current magnetic fields $Hi_1$ and $Hi_2$ are in the magnetization directions of the first and the second fixed magnetic layers 21 and 51, respectively, the sensing current magnetic fields Hi1 and Hi2 do not counteract the magnetizations of the first and the second fixed magnetic layers 21 and 51, and hence, the magnetizations of the first and the second fixed magnetic layers 21 and 51 can be reliably fixed, whereby the asymmetry of the spin valve thin-film magnetic device 13 can be reduced.

Furthermore, in the spin valve thin-film magnetic device 13 described above, since it is possible that $Hb_1+Hb_2+Hd_1+Hd_2+Hs \cong 0$, the magnetization direction of the free magnetic layer 41 is not inclined by these magnetic moments, and hence, the asymmetry of the spin valve thin-film magnetic device 13 can be reduced.

Embodiment 4

Next, the fourth embodiment of the present invention will be described with reference to the figures.

Figure 26:
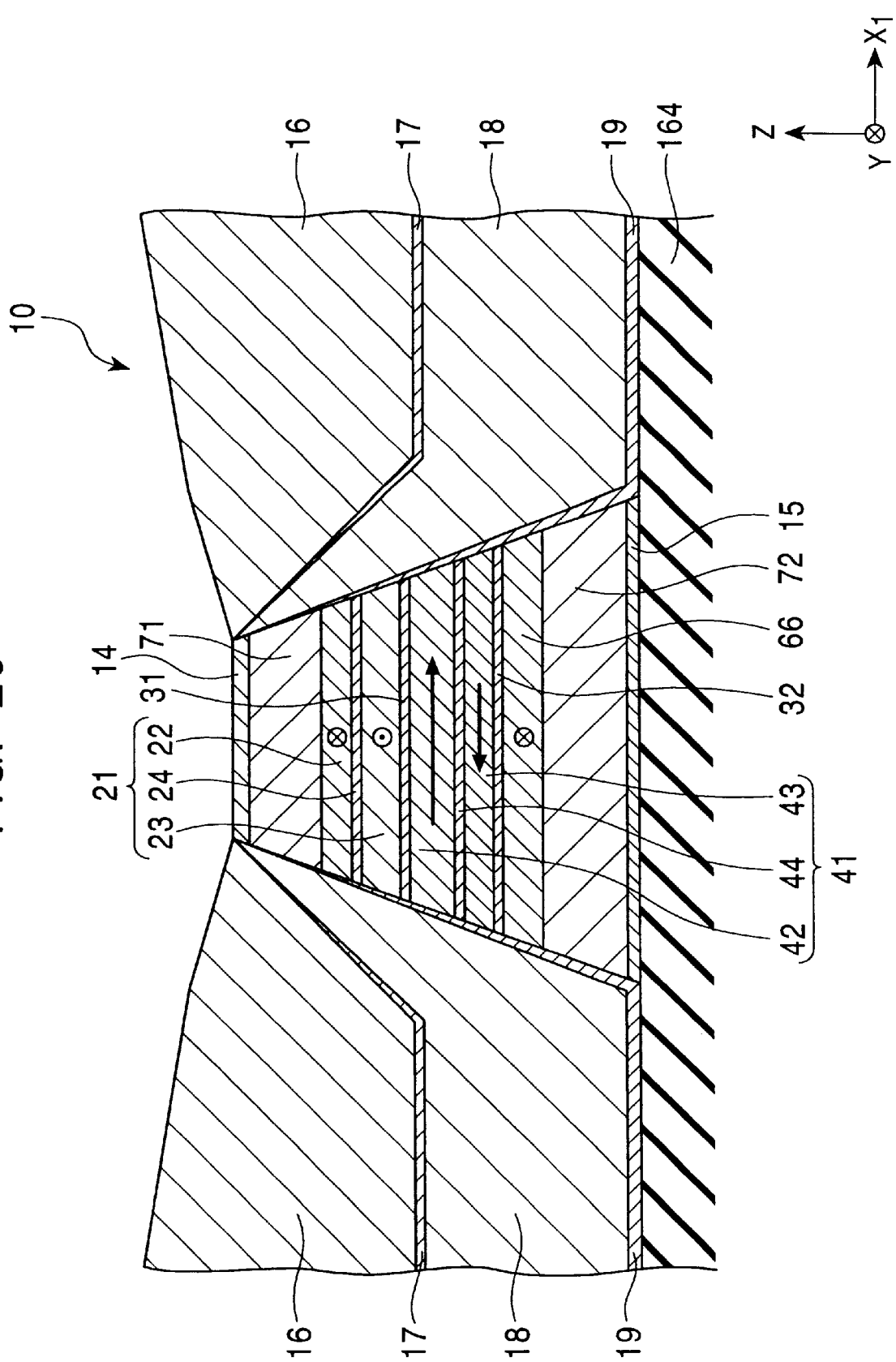
FIG. 26 is a schematic cross-sectional view of a spin valve thin-film magnetic device observed from a magnetic recording medium side, according to a fourth embodiment of the present invention.
Figure 27:
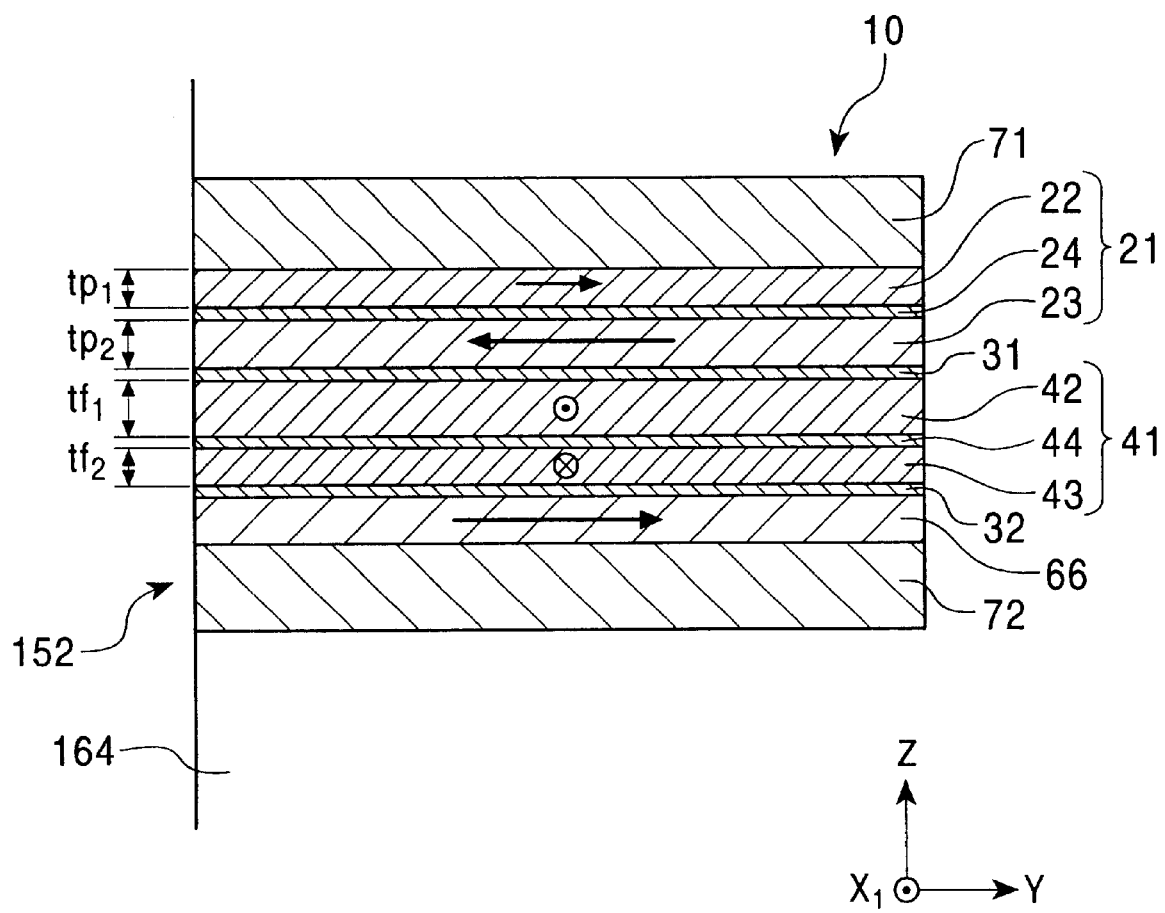
FIG. 27 is a schematic cross-sectional view of the spin valve thin-film magnetic device shown in FIG. 26 observed from a track width direction side.
Figure 28:
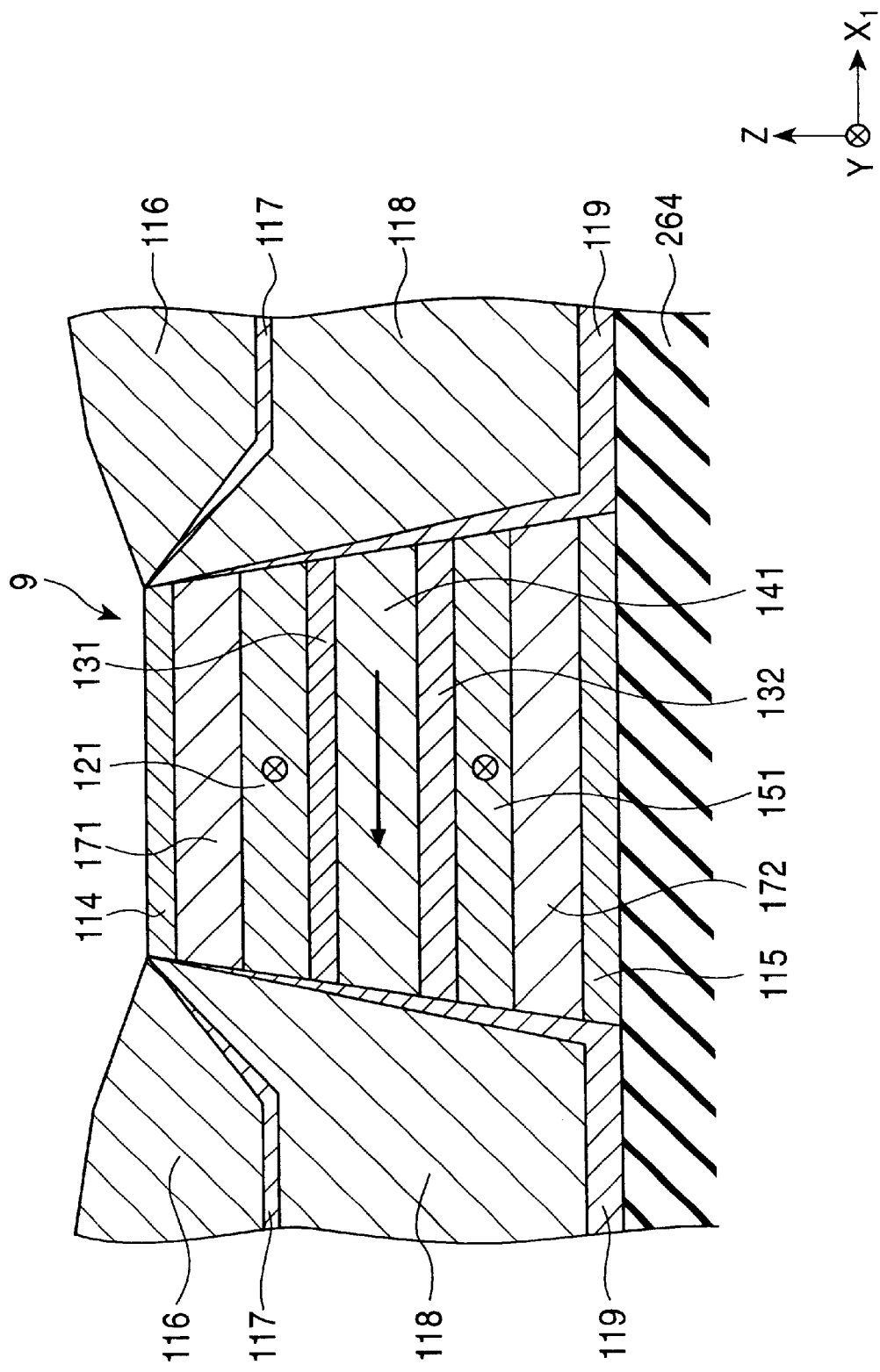
FIG. 28 is a schematic cross-sectional view of a conventional spin valve thin-film magnetic device observed from a magnetic recording medium side.
Figure 29:
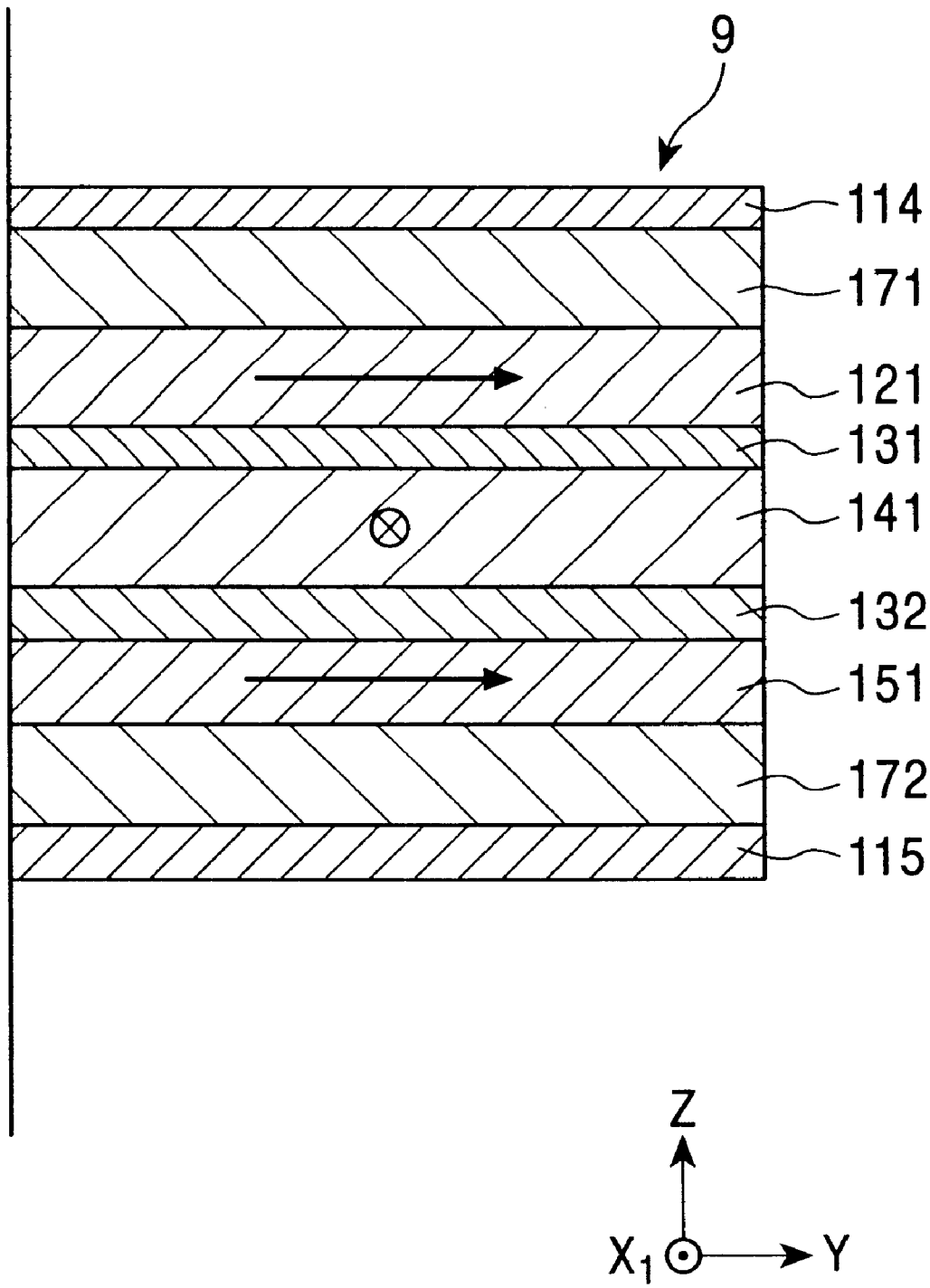
FIG. 29 is a schematic cross-sectional view of the conventional spin valve thin-film magnetic device shown in FIG. 28 observed from a track width direction side.

FIG. 26 is a schematic cross-sectional view of a spin valve thin-film magnetic device 10 according to the fourth embodiment of the present invention, which is observed from the magnetic recording medium side, and FIG. 27 is a schematic cross-sectional view of the spin valve thin-film magnetic device 10 observed from the track width direction.

In a manner similar to the spin valve thin-film magnetic device 11 of the first embodiment, the spin valve thin-film magnetic device 10 shown in FIGS. 26 and 27 form a thin-film magnetic head, and the thin-film magnetic head forms a floating type magnetic head together with an inductive head.

The spin valve thin-film magnetic device 10, in a manner similar to the spin valve thin-film magnetic device 13 of the third embodiment, is a dual spin valve thin-film magnetic device in which a nonmagnetic conductive layer, a fixed magnetic layer, and an antiferromagnetic layer are sequentially formed on each side of a free magnetic layer 41 in the thickness direction thereof.

That is, the spin valve thin-film magnetic device 10 is composed of a second antiferromagnetic layer 72, a second fixed magnetic layer 66, a second nonmagnetic conductive layer 32, the free magnetic layer 41, a first nonmagnetic conductive layer 31, a first fixed magnetic layer 21, a first antiferromagnetic layer 71, and a cap layer 14, which are sequentially formed on an underlying layer 15 formed on an underlying insulating layer 164.

As described above, a laminate 12A having a cross-section in an approximately trapezoid is formed so as to have the width equivalent to the track width, in which individual layers are sequentially formed from the underlying layer 15 to the cap layer 14.

A point of the spin valve thin-film magnetic device 10 differing from the spin valve thin-film magnetic device 13 of the third embodiment described above is that the second fixed magnetic layer 66 is composed of a single ferromagnetic layer.

Since the following constituents shown in FIGS. 26 and 27 are equivalent to those described in the third embodiment in arrangement and in material, the descriptions thereof are omitted. That is, the first and the second antiferromagnetic layers 71 and 72, the first and the second nonmagnetic conductive layers 31 and 32, the free magnetic layer 41, i.e., the first and the second ferromagnetic free layers 42 and 43, and the nonmagnetic interlayer 44, the first fixed magnetic layer 21, i.e., the first and the second pinned ferromagnetic layers 22 and 23 and the first nonmagnetic layer 24, conductive layers 16 and 16, interlayers 17 and 17, bias layers 18 and 18, and bias underlying layers 19 and 19 in this embodiment are equivalent to the upper and the lower antiferromagnetic layers 71 and 72, the upper and the lower nonmagnetic conductive layers 31 and 32, the free magnetic layer 41, i.e., the first and the second ferromagnetic free layers 42 and 43, and the nonmagnetic interlayer 44, the first fixed magnetic layer 21, i.e., the first and the second pinned ferromagnetic layers 22 and 23 and the first nonmagnetic layer 24, the conductive layers 16 and 16, the interlayers 17 and 17, the bias layers 18 and 18, and the bias underlying layers 19 and 19, respectively, described in the third embodiment.

As shown in FIGS. 26 and 27, the second fixed magnetic layer 66 is composed of a single ferromagnetic layer and is provided between the second antiferromagnetic layer 72 and the second nonmagnetic conductive layer 32.

The second fixed magnetic layer 66 is composed of a Ni—Fe alloy, Co, a Co—Ni—Fe alloy, a Co—Fe alloy, a Co—Ni alloy, or the like, and in particular, is preferably composed of Co.

In addition, the thickness of the second fixed magnetic layer 66 is preferably 1 to 3 nm.

The magnetization direction of the second fixed magnetic layer 66 is fixed in the Y direction in the figure by an exchange coupling magnetic field with the second antiferromagnetic layer 72.

In the spin valve thin-film magnetic device 10, as shown in FIGS. 26 and 27, the individual magnetization directions of the first and the second fixed magnetic layers 21 and 66 cross the magnetization direction of the free magnetic layer 41, and the magnetization directions of the entire first fixed magnetic layer 21 and the second fixed magnetic layer 66 are antiparallel to each other.

In addition, the magnetization direction, i.e., the direction opposite to the Y direction in the figure, of the second pinned ferromagnetic layer 23, which is closest to the free magnetic layer 41 among the ferromagnetic layers forming the first fixed magnetic layer 21, and the magnetization direction, i.e., the Y direction in the figure, of the second pinned ferromagnetic layer 66 are antiparallel to each other.

The relationships of these magnetization directions are equivalent to those in the spin valve thin-film magnetic device 13 of the third embodiment.

Accordingly, in the spin valve thin-film magnetic device 10, as is the case with the thin-film magnetic device 13 of the third embodiment shown in FIG. 17, the direction of the magnetic field moment Hb1 of the ferromagnetic exchange coupling magnetic field, which is imparted to the free magnetic layer 41 by ferromagnetic interlayer coupling of the second pinned ferromagnetic layer 22 and the free magnetic layer 41, and the direction of the magnetic field moment Hb2 of the ferromagnetic exchange coupling magnetic field, which is imparted to the free magnetic layer 41 by ferromagnetic interlayer coupling of the second fixed magnetic layer 66 and the free magnetic layer 41, are antiparallel to each other.

As a result, since the magnetic field moments Hb1 and Hb2 counteract each other in the free magnetic layer 41, the magnetization direction of the entire free magnetic layer 41 is not inclined by the ferromagnetic interlayer coupling magnetic fields with the first and the second fixed magnetic layers 21 and 66 and is aligned in the track width direction by the bias layers 18 and 18.

In the spin valve thin-film magnetic device 10 described above, since the magnetization directions of the entire first fixed magnetic layer 21 and the second fixed magnetic layer 66 are antiparallel to each other, as is the case shown in FIG. 18, the direction of the dipole moment of the dipole magnetic field of the first fixed magnetic layer 21, which is applied to the free magnetic layer 41, and the direction of the dipole moment of the dipole magnetic field of the second fixed magnetic layer 66, which is applied to the free magnetic layer 41, are antiparallel to each other.

Hence, since the two dipole magnetic fields applied to the free magnetic layer 41 counteract each other, the direction of the magnetic moment of the entire free magnetic layer 41 is not inclined by the dipole magnetic fields of the first and the second fixed magnetic layers 21 and 66 and is aligned in the track width direction by the bias layers 18 and 18.

In addition, in the spin valve thin-film magnetic device 10 described above, as is the case shown in FIG. 19, when a sensing current flows in the first nonmagnetic conductive layer 31, the direction of the sensing current magnetic field applied to the first fixed magnetic layer 21 and the magnetization direction of the entire first fixed magnetic layer 21 are in the same direction.

In addition, when a sensing current flows in the second nonmagnetic conductive layer 32, the direction of the sensing current magnetic field applied to the second fixed magnetic layer 66 and the magnetization direction of the second fixed magnetic layer 66 are in the same direction.

Accordingly, in the spin valve thin-film magnetic device 10 described above, since the directions of the sensing current magnetic fields and the magnetization directions of the first and the second fixed magnetic layers 21 and 66 are in the same direction, the magnetizations of the first and the second fixed magnetic layers 21 and 66 are not counteracted by the sensing current magnetic fields, the magnetizations of the first and the second fixed magnetic layers 21 and 51 can be reliably fixed, and hence, the asymmetry of the spin valve thin-film magnetic device 10 can be reduced.

Furthermore, in the spin valve thin-film magnetic device 10 described above, as is the case with the spin valve thin-film magnetic device 13 of the third embodiment, since the sum of the magnetic moments of the ferromagnetic interlayer coupling magnetic fields, the magnetic moments of the dipole magnetic fields and the magnetic moment of the sensing current magnetic field can be zero, i.e., $Hb_1 + Hb_2 + Hd_1 + Hd_2 + Hs \cong 0$, the magnetization direction of the free magnetic layer 41 is not inclined by these magnetic moments.

The spin valve thin-film magnetic device 10 can be manufactured in a manner equivalent to that for the spin valve thin-film magnetic device 13 of the third embodiment except that the second fixed magnetic layer 66 is formed of a single layer structure.

According to the spin valve thin-film magnetic device 10 described above, in addition to the advantages equivalent to those of the spin valve thin-film magnetic device 13 of the third embodiment, the following advantaged can be obtained.

That is, in the spin valve thin-film magnetic device 10, since the second fixed magnetic layer 66 is formed of a single layer, the thickness of the second fixed magnetic layer 66 is decreased, and as a result, the thickness of the laminate 12A is decreased, whereby shunting of the sensing current can be suppressed, and the rate of change in magnetoresistance can be increased.

As described above in detail, in the spin valve thin-film magnetic device of the present invention, one of the fixed magnetic layers is composed of 2L ferromagnetic layers, i.e., an even number of ferromagnetic layers, and the other fixed magnetic layer is composed of a single ferromagnetic layer or 2N+1 ferromagnetic layers, i.e., an odd number of ferromagnetic layers, in which the magnetization direction of the fixed magnetic layer is antiparallel to that of the other fixed magnetic layer, and simultaneously, the magnetization direction of the ferromagnetic layer, which is adjacent to the nonmagnetic conductive layer among the ferromagnetic layers forming the fixed magnetic layer, is antiparallel to that of the ferromagnetic layer, which is adjacent to the other nonmagnetic conductive layer among the ferromagnetic layers forming the other fixed magnetic layer, whereby the magnetization direction of the free magnetic layer can be aligned in the direction perpendicular to the magnetization directions of the fixed magnetic layers.

Accordingly, in the spin valve thin-film magnetic device of the present invention, the magnetization direction of the free magnetic layer is unlikely to be influenced by the magnetizations of the fixed magnetic layers, and hence, the asymmetry can be reduced.

According to the spin valve thin-film magnetic device of the present invention, since the magnetic field moments Hb1 and Hb2 of the individual ferromagnetic exchange coupling magnetic fields are antiparallel to each other, which are generated by the ferromagnetic interlayer coupling between the free magnetic layer and the fixed magnetic layer and the other fixed magnetic layer, respectively, the ferromagnetic interlayer coupling magnetic fields of the fixed magnetic layers counteract each other, and the magnetization direction of the free magnetic layer is not inclined by these ferromagnetic interlayer coupling magnetic fields, whereby the magnetization direction of the free magnetic layer is aligned in the direction perpendicular to those of the fixed magnetic layers, and the asymmetry of the spin valve thin-film magnetic device can be reduced.

In addition, according to the spin valve thin-film magnetic device of the present invention, since the magnetic moments Hd1 and Hd2 of the individual dipole magnetic fields of the fixed magnetic layer and the other fixed magnetic layer are antiparallel to each other in the free magnetic layer, the dipole magnetic fields thereof counteract each other, and the magnetization direction of the free magnetic layer is not inclined by these dipole magnetic fields, whereby the magnetization direction of the free magnetic layer is aligned in the direction perpendicular to those of the fixed magnetic layers, and the asymmetry of the spin valve thin-film magnetic device can be reduced.

Furthermore, according to the spin valve thin-film magnetic device of the present invention, when magnetic moment of the sensing current magnetic field applied to the free magnetic layer is Hs, since the following equation holds, i.e., $Hb_1+Hb_2+Hd_1+Hd_2+Hs \cong 0$, the magnetization direction of the free magnetic layer is not inclined by these magnetic moments, whereby the asymmetry of the spin valve thin-film magnetic device can be reduced.

According to the spin valve thin-film magnetic device of the present invention, since the direction of the sensing current magnetic fields generated by the sensing current are in the same directions in the individual fixed magnetic layers as the magnetization directions thereof, the magnetization directions of the fixed magnetic layers are not counteracted by the sensing current magnetic fields, whereby the magnetizations of the fixed magnetic layers can be reliably fixed, and the asymmetry of the spin valve thin-film magnetic device can be reduced.

The thin-film magnetic head of the present invention is a magnetic head for reading magnetically written information provided with one of the spin valve thin-film magnetic devices described above, and the floating type magnetic head of the present invention comprises the slider and the thin-film magnetic head described above provided on the slider.

Accordingly, since the thin-film magnetic head and the floating type magnetic head described above, are provided with spin valve thin-film magnetic devices in which the asymmetry thereof is small, the symmetry of wave shapes for reading is superior, and the rate of occurrence of errors in reading can be reduced.

The method for manufacturing the spin valve thin-film magnetic device, according to the present invention, comprises a step of forming the fixed magnetic layer composed of at least 2M ferromagnetic layers with a nonmagnetic layer provided therebetween, in which the M is an integer of 1 or more, a step of forming the free magnetic layer composed of at least 2L ferromagnetic layers with a nonmagnetic interlayer provided therebetween, in which the L is an integer of 1 or more, a step of forming the other fixed magnetic layer composed of a single ferromagnetic layer or composed of at least 2N+1 with a nonmagnetic layer provided therebetween, in which the N is an integer of 1 or more, and a step of performing a heat treatment while an external magnetic field is applied so that the magnetization directions of these ferromagnetic layers are in the same direction, whereby the exchange coupling magnetic fields appear between the antiferromagnetic layer and the fixed magnetic layer and between the other antiferromagnetic layer and the other fixed magnetic layer. Accordingly, the spin valve thin-film magnetic device described above can be easily manufactured.

What is claimed is:

1. A spin valve thin-film magnetic device comprising:

a free magnetic layer;

a pair of nonmagnetic conductive layers formed on both sides of the free magnetic layer in the thickness direction thereof;

a pair of fixed magnetic layers formed on the pair nonconductive layers;

a pair of antiferromagnetic layers formed on the pair of fixed magnetic layers;

a pair of conductive layers imparting a sensing current to the free magnetic layer, the pair of nonmagnetic conductive layers, and the pair of fixed magnetic layers; and a pair of bias layers for aligning a magnetization direction of the free magnetic layer;

wherein the free magnetic layer is a laminate composed of at least 2L ferromagnetic layers with a nonmagnetic interlayer provided therebetween, the L being an integer of 1 or more, in which magnetization directions of the ferromagnetic layers adjacent to each other are antiparallel, one of the pair of fixed magnetic layers is a laminate composed of at least 2M ferromagnetic layers with a nonmagnetic layer provided therebetween, the M being an integer of 1 or more, in which magnetization directions of the ferromagnetic layers adjacent to each other are antiparallel, and a second direction of a second magnetic moment of the entire fixed magnetic layer by an exchange coupling magnetic field formed by the one of the pair of fixed magnetic layers and the one of the pair of antiferromagnetic layers adjacent thereto, is fixed in a direction crossing a first direction of a first magnetic moment of the entire free magnetic layer, the other fixed magnetic layer is a laminate composed of at least 2N ferromagnetic layers with a nonmagnetic layer provided therebetween, the N being an integer of 1 or more, in which magnetization directions of the ferromagnetic layers adjacent to each other are antiparallel, and a third direction of a third magnetic moment of the entire other fixed magnetic layer by an exchange coupling magnetic field formed by the other fixed magnetic layer and the other antiferromagnetic layer adjacent thereto, is fixed in a direction parallel to the second direction of the entire fixed magnetic layer, and a magnetization direction of a ferromagnetic layer, which is closest to the free magnetic layer among the ferromagnetic layers forming the fixed magnetic layer, and a magnetization direction of a ferromagnetic layer, which is closest to the free magnetic layer among the ferromagnetic layers forming the other fixed magnetic layer, are antiparallel to each other.

2. A spin valve thin-film magnetic device according to claim 1, wherein the direction of a magnetic field moment $Hb_1$ of a ferromagnetic exchange coupling magnetic field formed by ferromagnetic interlayer coupling between the free magnetic layer and the ferromagnetic layer, which is closest to the free magnetic layer among the ferromagnetic layers forming the fixed magnetic layer, and the direction of a magnetic field moment $Hb_2$ of a ferromagnetic exchange coupling magnetic field formed by ferromagnetic interlayer coupling between the free magnetic layer and the ferromagnetic layer, which is closest to the free magnetic layer among the ferromagnetic layers forming the other fixed magnetic layer, are antiparallel to each other in the free magnetic layer.

3. A spin valve thin-film magnetic device according to claim 1, wherein the L is 1, the M is 1, and the N is 1.

4. A spin valve thin-film magnetic device according to claim 1, wherein the fixed magnetic layer is a laminate composed of a first ferromagnetic layer and a second ferromagnetic layer with a first nonmagnetic layer provided therebetween, the thickness of the second ferromagnetic layer formed at a location closer to the free magnetic layer being larger than that of the first ferromagnetic layer, and the other fixed magnetic layer is a laminate composed of a third ferromagnetic layer and a fourth ferromagnetic layer with a second nonmagnetic layer provided therebetween, the thickness of the third ferromagnetic layer formed at a location closer to the free magnetic layer being smaller than that of the fourth ferromagnetic layer.

5. A spin valve thin-film magnetic device according to claim 1, wherein the fixed magnetic layer is a laminate composed of a first ferromagnetic layer and a second ferromagnetic layer with a first nonmagnetic layer provided therebetween, the thickness of the second ferromagnetic layer formed at a location closer to the free magnetic layer being smaller than that of the first ferromagnetic layer, and the other fixed magnetic layer is a laminate composed of a third ferromagnetic layer and a fourth ferromagnetic layer with a second nonmagnetic layer provided therebetween, the thickness of the third ferromagnetic layer formed at a location closer to the free magnetic layer being larger than that of the fourth ferromagnetic layer.

6. A thin-film magnetic head for reading magnetically written information, comprising a spin valve thin-film magnetic device according to claim 1.

7. A floating type magnetic head comprising:

a slider; and a thin-film magnetic head according to claim 6 provided in the slider.

8. A spin valve thin-film magnetic device comprising:

a free magnetic layer;

a pair of nonmagnetic conductive layers formed on both sides of the free magnetic layer in the thickness direction thereof;

a pair of fixed magnetic layers formed on the pair of nonconductive layers;

a pair of antiferromagnetic layers formed on the pair of fixed magnetic layers;

a pair of conductive layers imparting a sensing current to the free magnetic layer, the pair of nonmagnetic conductive layers, and the pair of fixed magnetic layers; and a pair of bias layers for aligning a magnetization direction of the free magnetic layer;

wherein the free magnetic layer is a laminate composed of at least 2L ferromagnetic layers with a nonmagnetic interlayer provided therebetween, the L being an integer of 1 or more, in which magnetization directions of the ferromagnetic layers adjacent to each other are antiparallel, one of the pair of fixed magnetic layers is a laminate composed of at least 2M ferromagnetic layers with a nonmagnetic layer provided therebetween, the M being an integer of 1 or more, in which magnetization directions of the ferromagnetic layers adjacent to each other are antiparallel, and a second direction of a second magnetic moment of the entire fixed magnetic layer by an exchange coupling magnetic field formed by the one of the pair of fixed magnetic layers and the one of the pair of antiferromagnetic layers adjacent thereto, is fixed in a direction crossing a first direction of a first magnetic moment of the entire free magnetic layer, the other fixed magnetic layer is one of a single ferromagnetic layer and a laminate composed of at least 2N+1 ferromagnetic layers with a nonmagnetic layer provided therebetween, the N being an integer of 1 or more, magnetization directions of the ferromagnetic layers adjacent to each other being antiparallel, and a third direction of a third magnetic moment of the entire other fixed magnetic layer by an exchange coupling magnetic field formed by the other fixed magnetic layer and the other antiferromagnetic layer adjacent thereto, is fixed in a direction antiparallel to the second direction of the entire fixed magnetic layer, and a magnetization direction of a ferromagnetic layer, which is closest to the free magnetic layer among the ferromagnetic layers forming the fixed magnetic layer, and a magnetization direction of a ferromagnetic layer, which is closest to the free magnetic layer among the ferromagnetic layers forming the other fixed magnetic layer, are antiparallel to each other.

9. A spin valve thin-film magnetic device according to claim 8, wherein the direction of a magnetic field moment $Hb_1$ of a ferromagnetic exchange coupling magnetic field formed by ferromagnetic interlayer coupling between the free magnetic layer and the ferromagnetic layer, which is closest to the free magnetic layer among the ferromagnetic layers forming the fixed magnetic layer, and the direction of a magnetic field moment $Hb_2$ of a ferromagnetic exchange coupling magnetic field formed by ferromagnetic interlayer coupling between the free magnetic layer and the ferromagnetic layer, which is closest to the free magnetic layer among the ferromagnetic layers forming the other fixed magnetic layer, are antiparallel to each other in the free magnetic layer.

10. A spin valve thin-film magnetic device according to claim 8, wherein the direction of a magnetic moment $Hd_1$ of a dipole magnetic field of the fixed magnetic layer and the direction of a magnetic moment $Hd_2$ of a dipole magnetic field of the other fixed magnetic layer are antiparallel to each other in the free magnetic layer.

11. A spin valve thin-film magnetic device according to claim 8, wherein, when the sensing current flows in the pair of nonmagnetic conductive layers, a magnetic moment Hs of a sensing current magnetic field applied to the free magnetic layer is represented by the formula below, $Hb_1+Hb_2+Hd_1+Hd_2+Hs \cong 0$.

12. A spin valve thin-film magnetic device according to claim 8, wherein the L is 1, the M is 1, and the other fixed magnetic layer is a single ferromagnetic layer.

13. A spin valve thin-film magnetic device according to claim 8, wherein the L is 1, the M is 1, and the N is 1.

14. A spin valve thin-film magnetic device according to claim 8, wherein, when the sensing current flows, the direction of a sensing current magnetic field applied to the fixed magnetic layer and the magnetization direction of the entire fixed magnetic layer are in the same direction, and the direction of a sensing current magnetic field applied to the other fixed magnetic layer and the magnetization direction of the entire other fixed magnetic layer are in the same direction.

15. A thin-film magnetic head for reading magnetically written information, comprising a spin valve thin-film magnetic device according to claim 8.

16. A floating type magnetic head comprising:
   a slider; and
   a thin-film magnetic head according to claim 15 provided in the slider.

\* \* \* \* \*